United States Patent
Lilak et al.

(10) Patent No.: US 11,404,319 B2
(45) Date of Patent: Aug. 2, 2022

(54) VERTICALLY STACKED FINFETS AND SHARED GATE PATTERNING

(71) Applicant: Intel Corporation, Santa Clara, CA (US)

(72) Inventors: Aaron Lilak, Beaverton, OR (US); Sean Ma, Portland, OR (US); Justin R. Weber, Hillsboro, OR (US); Rishabh Mehandru, Portland, OR (US); Stephen M. Cea, Hillsboro, OR (US); Patrick Morrow, Portland, OR (US); Patrick H. Keys, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 155 days.

(21) Appl. No.: 16/635,108

(22) PCT Filed: Aug. 24, 2017

(86) PCT No.: PCT/US2017/048475
§ 371 (c)(1),
(2) Date: Jan. 29, 2020

(87) PCT Pub. No.: WO2019/040071
PCT Pub. Date: Feb. 28, 2019

(65) Prior Publication Data
US 2020/0235013 A1 Jul. 23, 2020

(51) Int. Cl.
*H01L 21/822* (2006.01)
*H01L 21/306* (2006.01)
(Continued)

(52) U.S. Cl.
CPC .... *H01L 21/8221* (2013.01); *H01L 21/30604* (2013.01); *H01L 21/31111* (2013.01);
(Continued)

(58) Field of Classification Search
CPC ......... H01L 21/8221; H01L 21/823814; H01L 21/823821; H01L 21/823828;
(Continued)

(56) References Cited

U.S. PATENT DOCUMENTS 9,583,490 B2 * 2/2017 Peng ..................... H01L 21/845
9,627,270 B2 * 4/2017 Cheng ............... H01L 29/42392
(Continued)

FOREIGN PATENT DOCUMENTS

KR 20150126310 11/2015
WO 2017095409 6/2017
(Continued)

OTHER PUBLICATIONS

Partial European Search Report from European Patent Application No. 17922624.6 dated Feb. 9, 2021, 16 pgs.
(Continued)

*Primary Examiner* — Bac H Au
(74) *Attorney, Agent, or Firm* — Essential Patents Group, LLP

(57) ABSTRACT

Stacked finFET structures including a fin having at least a first layer of semiconductor material stacked over or under a second layer of semiconductor material. The first and second layers may include a Group IV semiconductor material layer and a Group III-V semiconductor material layer, for example. A stacked finFET may include an N-type finFET stacked over or under a P-type finFET, the two finFETs may have channel portions within the different semiconductor material layers. Channel portions of the first and second layers of semiconductor material may be coupled to separate gate electrodes that are vertically aligned. Channel portions of the first and second layers of semiconductor material may be vertically separated by sub-fin portions of the first and second layers. Different layers of
(Continued)

dielectric material adjacent to the subfin portions may improve electrical isolation between the channel portions, for example as a source of fixed charge or impurity dopants.

20 Claims, 36 Drawing Sheets

(51) Int. Cl.
    *H01L 21/311*     (2006.01)
    *H01L 21/8238*     (2006.01)
    *H01L 21/8258*     (2006.01)
    *H01L 27/092*     (2006.01)
    *H01L 29/417*     (2006.01)
    *H01L 29/66*     (2006.01)

(52) U.S. Cl.
    CPC .. *H01L 21/8258* (2013.01); *H01L 21/823814* (2013.01); *H01L 21/823821* (2013.01); *H01L 21/823828* (2013.01); *H01L 21/823878* (2013.01); *H01L 27/0924* (2013.01); *H01L 29/41791* (2013.01); *H01L 29/66545* (2013.01)

(58) Field of Classification Search
    CPC ......... H01L 21/823878; H01L 27/0924; H01L 29/41791; H01L 27/0688; H01L 29/785
    See application file for complete search history.

(56) References Cited

U.S. PATENT DOCUMENTS

| | | | | |
|---|---|---|---|---|
| 9,659,963 | B2* | 5/2017 | Cheng | H01L 29/401 |
| 9,893,207 | B1* | 2/2018 | Balakrishnan | H01L 27/092 |
| 9,905,477 | B2* | 2/2018 | Peng | H01L 21/761 |
| 9,997,413 | B1* | 6/2018 | Leobandung | H01L 21/823871 |
| 10,381,346 | B1* | 8/2019 | Zhang | H01L 21/84 |
| 10,833,069 | B2* | 11/2020 | Zhang | H01L 27/0688 |
| 2007/0111448 | A1 | 5/2007 | Li et al. | |
| 2010/0148225 | A1 | 6/2010 | Mouli | |
| 2013/0037823 | A1* | 2/2013 | Kanemura | H01L 29/165 257/77 |
| 2014/0264438 | A1 | 9/2014 | Holland et al. | |
| 2015/0228654 | A1 | 8/2015 | Khakifirooz et al. | |
| 2015/0255461 | A1 | 9/2015 | Reddy et al. | |
| 2016/0211264 | A1* | 7/2016 | Peng | H01L 21/8221 |
| 2016/0336235 | A1 | 11/2016 | Cheng et al. | |
| 2016/0336421 | A1* | 11/2016 | Cheng | H01L 21/8221 |
| 2016/0343623 | A1 | 11/2016 | Fogel et al. | |
| 2016/0380002 | A1* | 12/2016 | Cheng | H01L 29/41791 257/347 |
| 2017/0133279 | A1* | 5/2017 | Peng | H01L 21/823878 |
| 2017/0133507 | A1* | 5/2017 | Cheng | H01L 29/16 |
| 2017/0278842 | A1* | 9/2017 | Song | H01L 21/823431 |
| 2019/0355756 | A1 | 11/2019 | Nelson et al. | |

FOREIGN PATENT DOCUMENTS

| | | |
|---|---|---|
| WO | 2017105515 | 6/2017 |
| WO | 2017111866 | 6/2017 |

OTHER PUBLICATIONS

International Preliminary Report on Patentability from PCT/US2017/048475 dated Mar. 5, 2020, 8 pgs.
International Search Report and Written Opinion from PCT/US2017/048475 dated Feb. 27, 2018, 11 pgs.
Extended European Search Report from European Patent Application No. 17922624.6 dated May 11, 2021, 14 pgs.

\* cited by examiner

VERTICALLY STACKED FINFETS AND SHARED GATE PATTERNING

CLAIM OF PRIORITY

This Application is a National Stage Entry of, and claims priority to, PCT Application No. PCT/US2017/048475, filed on Aug. 24, 2017 and titled "VERTICALLY STACKED FINFETS & SHARED GATE PATTERNING", which is incorporated by reference in its entirety for all purposes.

BACKGROUND

The device density of integrated circuits (ICs) has increased for decades in conformance with Moore's law. However, as the lateral dimensions of a device structure shrink with each technology generation, it becomes increasingly difficult to further reduce structural dimensions.

Three-dimensional (3D) scaling is now of considerable interest as reductions in z-height (device thickness) offer another avenue of increasing overall device density and IC performance. 3D scaling may be in the form of chip stacking or packaged IC stacking, for example. Known 3D integration techniques are expensive and may offer only incremental improvements in z-height and device density. For example, the majority of the thickness of a chip may be inactive substrate material. A stack of such chips may employ through-substrate via (TSV) technology as a means of vertically interconnecting the chip stack. A TSV typically extends through 20-50 µm, or more, of substrate material and therefore is generally limited to via diameters on the micron-scale. As such, TSV density is limited to far below the density of most device (e.g., transistor, memory) cells.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements. In the figures.

DETAILED DESCRIPTION

Figure 1A:
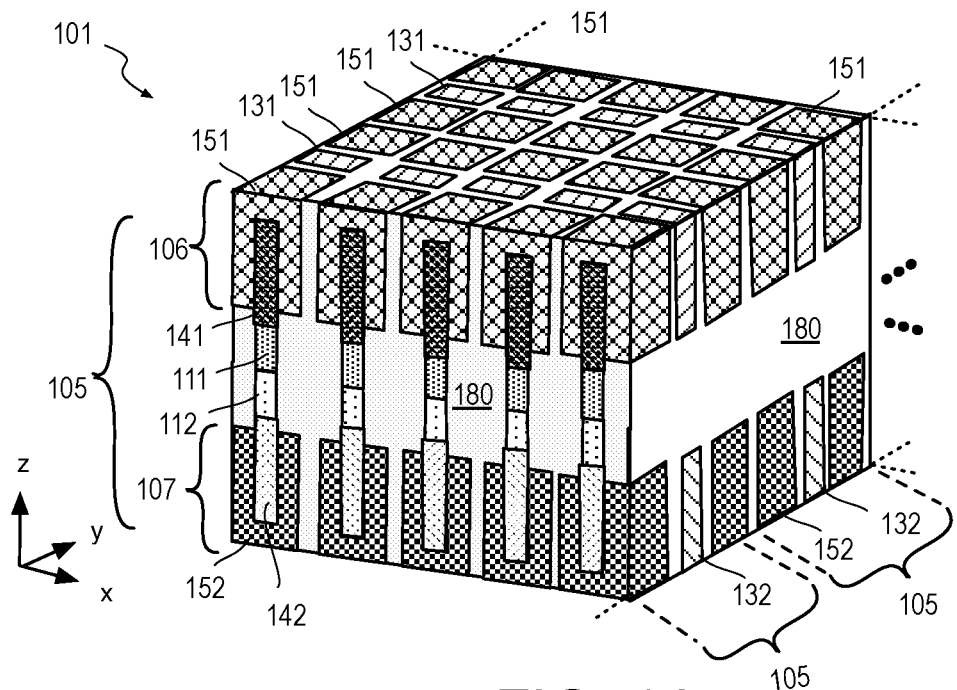
FIG. 1A is an isometric illustration of vertically stacked CMOS finFETs, in accordance with some embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" or "some embodiments" means that a particular feature, structure, function, or characteristic described in connection with the embodiment is included in at least one embodiment of the invention. Thus, the appearances of the phrase "in an embodiment" or "in one embodiment" or "some embodiments" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Stacked finFET structures and techniques for the fabrication of such structures are described herein. As employed herein, a "stacked finFET" structure includes two field effect transistors (FETs) on opposite (e.g., top and bottom) ends of a same "stacked fin." As used herein, a "stacked fin" includes at least two layers of semiconductor material stacked vertically within lateral confines of the fin. The layers of semiconductor material are employed for at least the channel of the stacked finFETs and may be of the same or different semiconductor compositions. In some embodiments, at least two independent gates of stacked finFETs are adjacent to a sidewall of the fin. Although the gates are vertically separated, they may be in vertical alignment with each other in a manner indicative of a shared gate patterning process. As described further herein, a shared gate patterning process may reduce fabrication cost as well as simplify fabrication of multiple FETs on a stacked fin. In some embodiments, the stacked finFET is a stacked CMOS finFET that includes a first FET of a first conductivity type (e.g., N-type or an NMOSFET), and a second FET of a second, complementary, conductivity type (e.g., P-type or a PMOSFET). In some embodiments, the stacked finFET is a stacked heterostructure that includes a first FET having at least a channel in a first semiconductor layer of a fin, and a second FET having at least a channel in a second semiconductor layer of the fin with the first and second layers forming a heterojunction or forming two or more heterojunctions with one or more intervening semiconductor layer.

In some embodiments, a subfin portion of a stacked fin provides electrical separation and/or isolation between vertically separated channel portions of the fin that are each gated by the separate gate electrodes. The subfin electrical separation may reduce electrical coupling between stacked finFETs sufficiently for the stacked FETs to be independently operative. As described further below, one or more of junction isolation or carrier depletion through the field effect may be employed to electrically separate and/or isolate the stacked semiconductor channel portions.

FIG. 1A is an isometric illustration of vertically stacked CMOS finFET structure 101, in accordance with some embodiments. FIG. 1A represents an arbitrary volume within an integrated circuit (IC). The volume shown in FIG. 1A may extend over an arbitrarily large footprint in the x-y plane of the IC, as embodiments herein are not limited in this context. The volume shown in FIG. 1A may be surrounded by an arbitrary number of interconnect metallization levels (not depicted) above (+z direction) and/or below (−z direction), as embodiments herein are not limited in this context. The volume shown in FIG. 1A may be mechanically supported by any substrate or carrier (not depicted), as embodiments herein are not limited in this context.

Stacked CMOS finFET structure 101 includes five rows of stacked finFETs 110. Within each of the five rows, there are two columns of stacked finFETs 110. Hence, within the illustrated volume, there are ten stacked CMOS finFETs 110. Each stacked CMOS finFET 110 includes a finFET 106 of a first conductivity type (e.g., N-type or an NMOSFET) stacked over a finFET 107 of a second conductivity type (e.g., P-type or a PMOSFET). Within the illustrated volume, there are therefore ten PMOS finFETs and ten NMOS finFET for a total of twenty FETs. A dielectric material 180 separates rows of stacked CMOS finFETs 110. Dielectric material 180 is in contact with any semiconductor sidewall of a stacked fin that is not covered by another material. Dielectric material 180 may one or more layers of any material known to be suitable as a shallow trench isolation (STI). Dielectric material 180 may be a low-k (e.g., less than 3.5) or moderate-k dielectric (e.g., between 3.5 and 8) dielectric material. Exemplary dielectric materials, include, but are not limited to, silicon nitride (SiN), silicon oxide (SiO), silicon dioxide (SiO2), carbon-doped silicon (SiOC (H), silicon oxynitride (SiON), HSQ, MSQ, or porous dielectrics.

As further shown, finFET 106 includes source and drain contact metallization 151 coupled to opposite ends of a semiconductor channel through source and drain semiconductor 141. Source and drain semiconductor 141 has a concentration of impurity atoms (e.g., donors) resulting in a density of states for charge carriers (e.g., electrons) corresponding to the conductivity type of the finFET (e.g., N-type). Source and drain semiconductor 141 is advantageously substantially monocrystalline, but may also be polycrystalline. Source and drain semiconductor 141 may be any semiconductor material having any suitable majority lattice atoms and any impurity dopant atoms suitable for the majority lattice atoms. Source and drain contact metallization 151 may be any elemental metal, metal alloy or metallic compound that provides an ohmic or non-ohmic (e.g., tunneling) contact to source and drain semiconductor 141. Although each finFET 106 has separate source and drain contact metallization 151, source and drain contact metallization 151 may be continuous so that two or more finFETs 106 may share the same contact metallization 151.

As further shown, finFET 107 likewise includes source and drain contact metallization 152 coupled to opposite ends of a semiconductor channel through source and drain semiconductor 142. Source and drain semiconductor 142 has a concentration of impurity atoms (e.g., acceptors) resulting in a density of states for charge carriers (e.g., holes) corresponding to the complementary conductivity type of the finFET (e.g., P-type). Source and drain contact metallization 152 may be any elemental metal, metal alloy, or metallic compound that provides an ohmic or non-ohmic contact to source and drain semiconductor 142. Because of the different conductivity types of source and drain semiconductors 141, 142, source and drain contact metallization 152 may be of a different composition than source and drain contact metallization 151. Although each finFET 107 has separate source and drain contact metallization 152, source and drain contact metallization 152 may be continuous within the x or y dimension so that two or more finFETs 107 share the same contact metallization 152. One or more of source and drain contact metallization 151 and 152 may also be merged within the z dimension so that a source or drain of one or more of finFETs 106 may have electrical continuity with a source or drain of one or more of finFETs 107.

Source and drain semiconductor 141 is over a subfin portion 111. In some embodiments, subfin portion 111 includes a first semiconductor. Subfin portion 111 is advantageously substantially monocrystalline although defect density may be significant. Another subfin portion 112 is between subfin portion 111 and source and drain semiconductor 142. Subfin portion 112 is advantageously also substantially monocrystalline although defect density may again be significant, at least near an interface with subfin portion 111. In some embodiments, majority lattice atoms of subfin portions 111 and 112 are different such that there is a heterojunction between subfin portions 111 and 112. In alternative embodiments, majority lattice atoms of subfin portions 111 and 112 are the same such that there is a homojunction between subfin portions 111 and 112. For either heterojunction or homojunction embodiments, impurity dopants within subfin portion 111 may be different than impurity dopants within subfin portion 112.

Each of subfin portions 111 and 112 may include one or more layer of a Group IV semiconductor (e.g., silicon, germanium, or alloy there of), and/or one or more layer of a Group III-V binary, ternary or quaternary semiconductor (e.g., a first sub-lattice of at least one element from Group III of the periodic table, such as Al, Ga, or In, and a second sub-lattice of at least one element from Group V of the periodic table, such as P, As or Sb). Each of subfin portions 111 and 112 may alternatively include one or more layer of a Group III-N binary, ternary or quaternary semiconductor (e.g., GaN, AlGaN, InAlGaN). Group II-VI semiconductor layers are also possible. In some exemplary embodiments where subfin portions 111 and 112 are of different majority lattice atoms, a first of subfin portions 111, 112 includes a Group IV semiconductor while the second of subfin portions 111, 112 includes a Group III-V semiconductor. In some embodiments where finFET 106 (FIG. 1A) is N-type and finFET 107 is P-type, subfin portion 111 includes a Group III-V semiconductor while subfin portion 112 includes a Group IV semiconductor. In some other embodiments where finFET 106 is N-type and finFET 107 is P-type, subfin portion 111 includes is a first Group IV semiconductor (e.g. silicon) while subfin portion 112 includes a second Group IV semiconductor (e.g., germanium). In still other embodiments where finFET 106 is N-type and finFET 107 is P-type, subfin portion 111 includes is a first Group IV alloy semiconductor (e.g. $Si_{1-x}Ge_x$) while subfin portion 112 includes a second Group IV alloy semiconductor (e.g., $Si_{1-y}Ge_y$) where x and y are different.

FinFET 106 includes a gate electrode 131 between source and drain contact metallization 151. FinFET 107 includes a gate electrode 132 between source and drain contact metallization 152. Gate electrodes 131 and 132 extend along at least a sidewall of channel portions located at opposite ends or sides (e.g., top and bottom) of each stacked finFET 105. Gate electrodes 131 and 132 may include any metal, metal alloy, or metallic compound of suitable work function. Gate electrode 131 may, for example, include at least a first work function metal (e.g., N-type work function metal where finFET 106 is an NMOS device), while gate electrode 131 includes a second work function metal (e.g., P-type work function metal where finFET 107 is a PMOS device). Exemplary P-type work function metals include, but are not limited to, ruthenium, palladium, platinum, cobalt, nickel, and conductive metal oxides (e.g., ruthenium oxide). Exemplary N-type work function metals include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, gate electrodes 131, 132 include a stack of two or more metal layers, where one or more metal layers are work function metal layers and at least one metal layer is a fill metal layer. Additional gate electrode layers may be included, for example, a diffusion barrier layer or/and an adhesion layer.

Figure 1B:
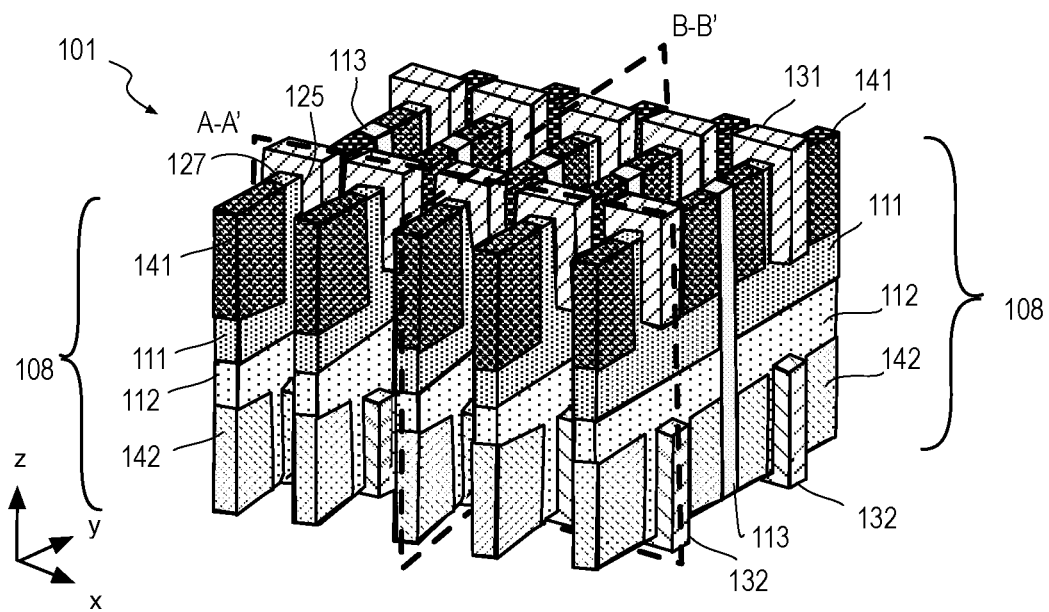
FIG. 1B is an isometric illustration of vertically stacked CMOS finFETs, in accordance with some embodiments.

FIG. 1B is an isometric illustration of vertically stacked CMOS finFETs 101. Source and drain metallization 151, 152 and dielectric isolation 180 is not drawn to further illustrate a stacked semiconductor fin 108, in accordance with some embodiments. Although the stacked CMOS finFETs 101 are shown as having a rectangular cross section in a z-x plane of the reference coordinate system, stacked fins may instead have a cross section that is rounded or sloped at one or more ends of the fins which may result in a cross-sectional profile within the z-x plane that is rectangular, hourglass-shaped, trapezoidal, etc. For example, a "top" of a stacked semiconductor fin 108 may be narrower than a "bottom" of the fin, and gate stack 131 may conform to this rounded or sloped fin shape. Although comprising two or more semiconductor layers, stacked semiconductor fin 108 is advantageously substantially monocrystalline, at least within the channel portions separated by subfin portions 111, 112. As shown, gate electrodes 131, 132 extend over at least a sidewall of the channel portions of stacked semiconductor fin 108 with subfin portions 111, 112 located between gate electrode 131 and gate electrode 132. For each finFET, the transistor channel resides within channel portions of the stacked semiconductor fin. These channel portions are at least under gate electrode 131 or gate electrode 132. A gate dielectric 125 is between the channel portions and the gate electrodes 131, 132.

Gate dielectric 125 may be any material suitable for a MOSFET, including dielectrics having a moderate bulk relative permittivity (e.g., k between 3.5 and 9) or having a high bulk permittivity (e.g., k greater than 9). For example, gate dielectric 125 may include one or more of the dielectric materials discussed herein with reference to isolation 180. In other examples, gate dielectric 125 may include one or more of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. For clarity, gate dielectric 125 is illustrated only as a line in FIG. 1B as it may be very thin (e.g., between 0.5 nanometers and 3 nanometers, including all values and ranges therein) relative to gate electrodes 131, 132, etc. In the illustrated embodiment, gate electrodes 131, 132 are separated from source and drain semiconductor 141, 142 by a dielectric gate spacer, which although not shown in FIG. 1B, is located over semiconductor region 127. The gate spacer, may, for example, be any of those dielectric materials discussed herein with reference to dielectric material 180. In some embodiments, semiconductor region 127 has the same composition as channel semiconductor under gate electrode 131. In other embodiments, semiconductor region 127 includes impurity dopants that are not present to the same extent within channel semiconductor under gate electrode 131.

Figure 1C:
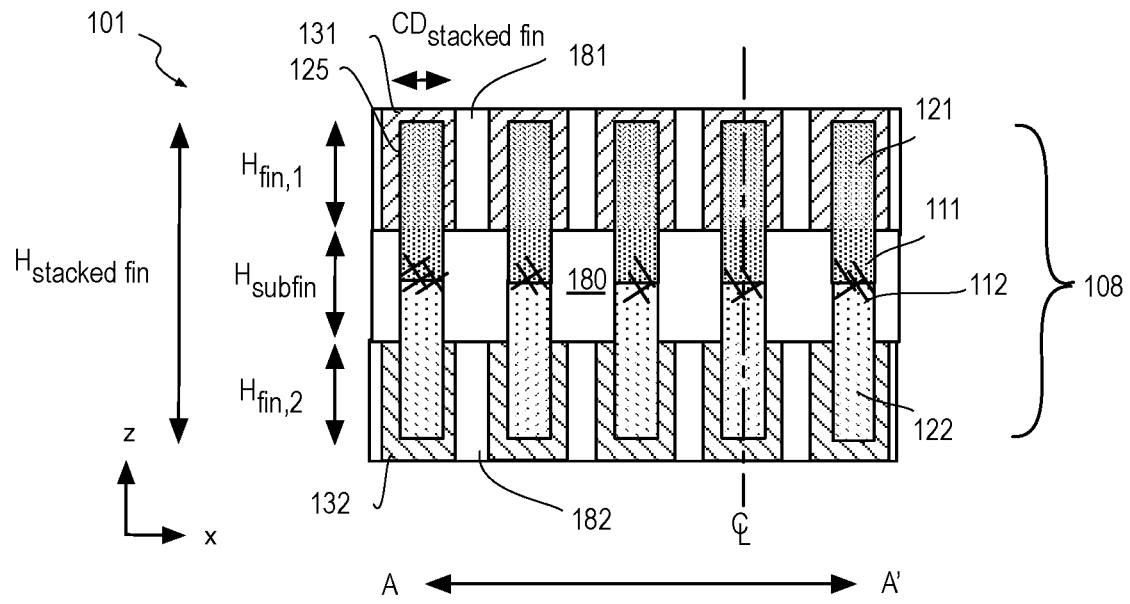
FIG. 1C is a cross-sectional illustration of transverse widths of vertically stacked CMOS finFETs, in accordance with some embodiments.

As further shown in FIG. 1B, stacked finFETs within one stacked finFET row are separated by a plug 113. In the illustrated example, plug 113 is a dielectric material that extends along the entire vertical (e.g., z-dimensional) height of stacked semiconductor fin 108. For such embodiments, plug 113 may be, for example, any of those dielectric materials discussed herein with reference to dielectric material 180. In other embodiments, plug 113 includes a stack of semiconductor material layers, for example having at least the same majority lattice atoms as subfin portions 111, 112. For such embodiments, plug 113 may be another substantially monocrystalline portion of stacked semiconductor fin 108. FIG. 1C is a cross-sectional illustration showing transverse widths of vertically stacked CMOS finFETs 101 through the A-A' plane illustrated in FIG. 1B, in accordance with some embodiments. As shown, stacked semiconductor fin 108 includes a first channel portion 121 and a second channel portion 122, which are separated by subfin portions 111, 112. Channel portions 121 and 122 are advantageously monocrystalline. Channel portions 121, 122 may each be any of the semiconductor materials described above in the context of subfin portions 111, 112, for example. In some embodiments, channel portion 121 has the same composition as subfin portion 111. In some embodiments, channel portion 122 has the same composition as subfin portion 112. Where both channel portions 121, 122 have the same composition as subfin portions 111, 112, respectively, stacked semiconductor fin 108 has only one metallurgical junction (homojunction or heterojunction) at the interface of subfin portions 111 and 112. Where one or more of channel portions 121 and 122 have a different composition than subfin portions 111 and 112, respectively, stack semiconductor fin 108 may have two or three junctions (homojunctions and/or heterojunctions). A stacked semiconductor fin may be a homojunction structure where the two channel portions 121, 122 differ only with respect to impurity dopants (e.g., N-type and P-type). Alternatively, a stacked semiconductor fin 108 may be a triple heterojunction structure where there is a heterojunction between subfin portions 111 and 112, and each of the channel portions 121, 122 have the different majority lattice atoms than subfin portions 111, 112. A stacked semiconductor fin may also be a double heterojunction where only one of channel portions 121, 122 has different majority lattice atoms than a subfin portion 111 or 112.

In the illustrated example stacked semiconductor fin 108 includes at least two semiconductor layers having different majority lattice atoms. In some embodiments, channel portion 121 has at least the same majority lattice atoms as subfin portion 111. Channel portion 122 may also have at least the same majority lattice atoms as subfin portion 112. Stacked semiconductor fin 108 has a single heterojunction located between subfin portions 111 and 112 for embodiments where both the channel portions 121 and 122 have the same majority lattice atoms as the subfin portions 111 and 112, respectively.

In some exemplary embodiments where finFET 106 (FIG. 1A) is N-type, channel portion 121 is a Group III-V semiconductor having good electron transport characteristics. For some exemplary N-type transistor embodiments, channel portion 121 is advantageously a III-V material having a high electron mobility, such as, but not limited to InGaAs, InP, InSb, or InAs. For some such embodiments, channel portion 121 is a ternary III-V alloy, such as, but not limited to, InGaAs. For some $In_xGa_{1-x}As$ embodiments, In content (x) is between 0.6 and 0.9, and advantageously is at least 0.7 (e.g., $In_{0.7}Ga_{0.3}As$). Subfin portion 111 may also be this same Group III-V semiconductor, or another Group III-V semiconductor having a conduction band offset from that of channel portion 121. For example, subfin portion 111 may be a III-V material having a significant band offset (e.g., conduction band offset for N-type devices) from the channel portion 121. Exemplary materials, include, but are not limited to, GaAs, GaSb, GaAsSb, GaP, InAlAs, AlAs, AlP, AlSb, InSb, and AlGaAs. In some N-type transistor embodiments where the channel portion 121 is InGaAs, the subfin portion 111 is GaAs.

In some embodiments where finFET 107 is P-type, channel portion 122 is a Group IV semiconductor (e.g., silicon, germanium, or an alloy thereof) having good hole transport characteristics, for example. Subfin portion 112 may also be this same Group IV semiconductor, or another Group IV semiconductor having a valance band offset from that of channel portion 122. In an exemplary P-type transistor embodiment, channel portion 122 is advantageously Ge or a Ge-rich SiGe alloy. For some exemplary embodiments, channel portion 122 has a Ge content between 0.6 and 0.9, and advantageously is at least 0.7. In alternative P-type transistor embodiments, channel portion 122 is a compound semiconductor, such as, but not limited to Group III-V semiconductors (e.g., InGaSb) or Group II-VI semiconductors (e.g., PbTe).

In some embodiments where finFET 106 is N-type and finFET 107 is P-type, channel portion 121 is a Group III-V semiconductor while channel portion 122 is a Group IV semiconductor. In some other embodiments where finFET 106 is N-type and finFET 107 is P-type, channel portion 121 is a first Group III-V semiconductor while channel portion 122 is a second Group III-V alloy semiconductor. In still other embodiments where finFET 106 is N-type and finFET 107 is P-type, channel portion 121 is a first Group IV semiconductor (e.g., silicon) while channel portion 122 is a second Group IV semiconductor (e.g., germanium). Subfin portion 111 may also be this first Group IV semiconductor (e.g., silicon) while subfin portion 112 is also this second Group IV semiconductor (e.g., germanium). In other embodiments where finFET 106 is N-type and finFET 107 is P-type, channel portion 121 is a first Group IV alloy semiconductor (e.g. $Si_{1-x}Ge_x$) while channel portion 122 is a second Group IV alloy semiconductor (e.g., $Si_{1-y}Ge_y$), where x and y are different. Subfin portion 111 may also be this first Group IV alloy semiconductor (e.g., $Si_{1-x}Ge_x$) while subfin portion 112 is also this second Group IV alloy semiconductor (e.g., $Si_{1-y}Ge_y$).

In some embodiments, at least the impurity dopant species and/or impurity dopant levels are different between the channel portions 121, 122 and subfin portions 111, 112. For example, impurity concentration levels within channel portions 121, 122 may be advantageously lower than in subfin portions 111, 112. Higher majority carrier mobility may be achieved within channel portions 121, 122 with the lowest practical impurity level (e.g., intrinsic or non-intentional impurity dopant levels). In some embodiments with highest mobility, channel portions 121, 122 are intrinsic material and not intentionally doped with any electrically active impurity. In alternate embodiments, a nominal impurity dopant level may be present within channel portions 121, 122, for example to set a threshold voltage ($V_t$), or to provide pocket implants, etc. Even for impurity-doped embodiments however, impurity dopant level within the channel portions 121, 122 is advantageously low, for example below $1 \times 10^{17}$ cm$^{-3}$. To provide electrical separation between stacked finFETs, impurity dopants may be deliberately introduced within subfin portions 111 and 112 such that the impurity concentrations, regardless of the conductivity type, are higher (e.g., having an impurity concentration of between $5 \times 10^{17}$ cm$^{-3}$ and $1 \times 10^{19}$ cm$^{-3}$) than within channel portions 121 and 122.

In FIG. 1C, hatch marks at the heterojunction between subfin portions 111 and 112 represent a high defect density zone associated with semiconductor lattice mismatch. In advantageous embodiments, such a high defect density zone is largely contained within subfin portion 111 and/or subfin portion 112. Stacked semiconductor fin 108 has a vertical height (e.g., in z-dimension) $H_{stacked\ fin}$ that is equal to the sum of a first channel portion height $H_{fin,1}$, a second channel portion height $H_{fin,2}$, and a subfin portion height $H_{subfin}$. In some exemplary embodiments, channel portion heights $H_{fin,1}$ and $H_{fin,2}$ are each less than 200 nm, advantageously less than 150 nm, and more advantageously between 20 nm and 150 nm. Subfin height $H_{subfin}$ may vary as a function of the compositions of subfin portions 111, 112. For example, in some embodiments where subfin portions 111 and 112 are two different crystalline semiconductors with lattice constants that are so different the stacked semiconductor fin 108 is a metamorphic heterostructure, subfin height $H_{subfin}$ may be hundreds of nanometers (e.g. 300 nm, or more) to contain the high defect density zone within subfin portions 111 and 112. In other embodiments where subfin portions 111 and 112 have lattice parameters that are sufficiently matched for stacked semiconductor fin 108 to be a pseudomorphic heterostructure, subfin height $H_{subfin}$ may be a 150 nanometers, or less.

As further shown in FIG. 1C, stacked semiconductor fin 108 has a transverse width of a critical dimension $CD_{stacked\ fin}$ that may vary over stacked fin height H stacked fin as a result of fabrication techniques. In some embodiments, fin 108 has a minimum fin width less than 50 nm, advantageously less than 30 nm, and more advantageously less than 20 nm. Hence, channel portion 121 may have a different width than channel portion 122. Notably however, both channel portions 121 and 122 share a common longitudinal center-line that also passes through the center of subfin portions 111 and 112. As such, stacked semiconductor fin 108 may have any physical characteristics of a homogeneous or monolithic fin of comparable dimensions (e.g., $CD_{stacked\ fin}$ and $H_{stacked\ fin}$). For at least this reason, stacked semiconductor fin 108 is better characterized as a single fin structure in which there are two or more semiconductor layers rather than a stack of two or more fins.

For the embodiment illustrated in FIG. 1C, while dielectric material 180 is adjacent to a sidewall of subfin portions 111 and 112, another dielectric layer 181 is adjacent to a sidewall of electrodes 131, and a third dielectric layer 182 is adjacent to a sidewall of electrodes 131. While each of dielectric layers 181, 182 may be any of those materials described above for dielectric material 180, even where either or both of dielectric materials 181, 182 have the same composition as dielectric material 180, interfaces between these material layers may be identifiable and indicative of one or more of the fabrication processes described further below.

Figure 1D:
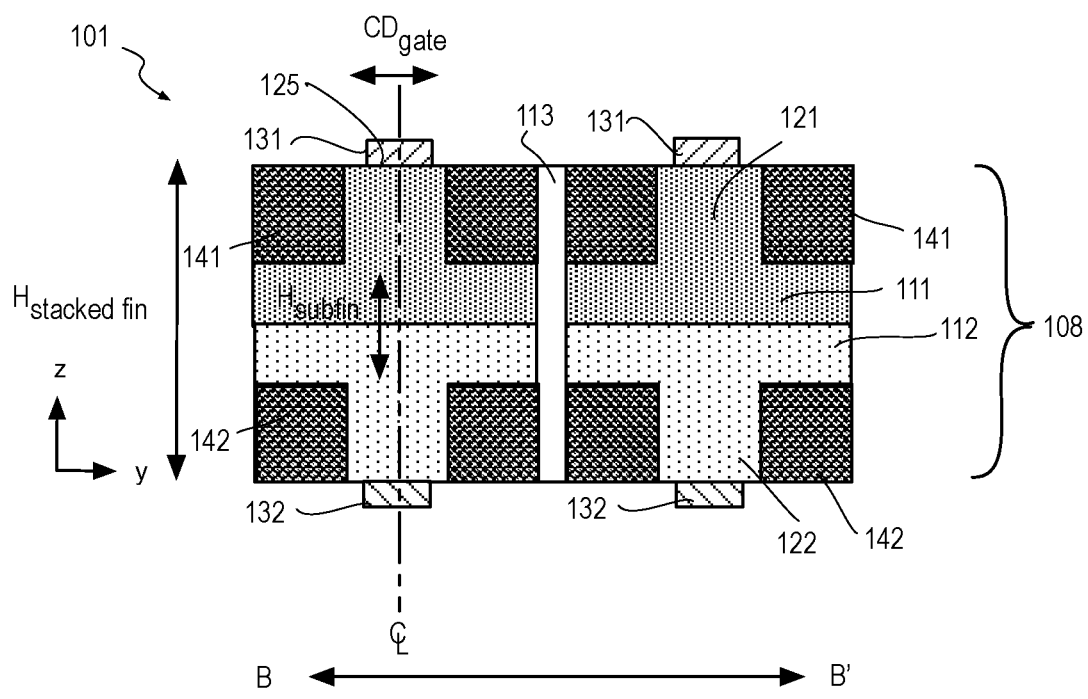
FIG. 1D is a cross-sectional illustration of longitudinal lengths of vertically stacked CMOS finFETs, in accordance with some embodiments.

FIG. 1D is a cross-sectional illustration showing longitudinal lengths of vertically stacked CMOS finFETs 101 through the B plane illustrated in FIG. 1B, in accordance with some embodiments. As shown in FIG. 1D, subfin portions 111, 112 extend the full longitudinal length of a single finFET. Channel portions 121 and 122 extend between source and drain semiconductor 141 and 142, respectively. Channel portions 121, 122 may become obscured by source and drain semiconductor 141, 142 if ends of channel portions 121, 122 are replaced with source and drain semiconductor 141, 142, for example through a recess etch and epitaxial regrowth. Gate electrodes 131 and 132 have a critical dimension $CD_{gate}$ associated with a channel length of the stack finFETs. In some exemplary embodiments gate electrode 131 has a critical dimension $CD_{gate}$ that is equal to that of gate electrode 132. Even where gate electrodes 131 and 132 do not have precisely the same critical dimension $CD_{gate}$, the center-line of gate electrode 131 is vertically aligned with the center-line of gate electrode 132, as shown in FIG. 1D. This vertical alignment of gate electrodes 131 and 132 is a characteristic indicative of a shared gate patterning process, for example as described further below. For such embodiments, gate electrodes 131 and 132, although separated by a vertical height $H_{subfin}$ may otherwise have any of physical characteristics of a homogeneous or monolithic gate electrode that extends over a sidewall of a fin of comparable dimensions (e.g., $CD_{stacked\ fin}$ and $H_{stacked\ fin}$).

Figure 2:
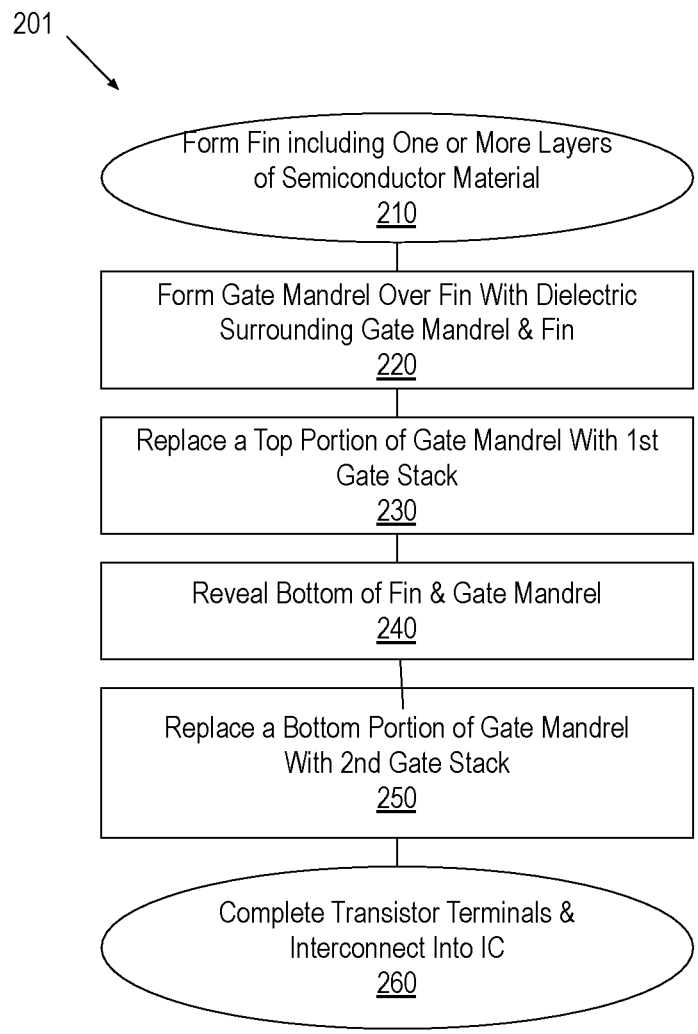
FIG. 2 is a flow diagram illustrating methods of sharing gate terminal patterning between top and bottom stacked finFETs, in accordance with some embodiments.

The transistor structures described above may be fabricated using a variety of techniques and unit processes. Some exemplary methods of fabrication are described below to further explain attributes of the structural features introduced above. FIG. 2 is a flow diagram illustrating methods 201 for fabricating stacked finFETs that share gate terminal patterning between top and bottom stacked finFETs, in accordance with some embodiments. FIG. 3A-3H are cross-sectional views of stacked finFETs evolving as selected operations in the methods 201 are performed, in accordance with some embodiments.

Referring first to FIG. 2, methods 201 begin at operation 210 where a fin that includes one or more layers of semiconductor material is fabricated. Any of the methods described further below may be practiced at operation 210, for example. The fin generated at operation 210 may have one or more of the properties of stacked semiconductor fin 108 described above. Notably however, methods 201 do not require multiple semiconductor layers, and the fin generated at operation 210 may simply include a single semiconductor layer (i.e., a homogenous semiconductor fin). The fin fabricated at operation 210 has sufficient height to ultimately accommodate two stacked transistors, one employing a top portion of the fin, and a second employing a bottom portion of the fin. At operation 220, a dielectric gate mandrel is formed over the fin and the resulting structure is planarized or gap-filled with a dielectric material. Advantageously, the gate mandrel may be of a sufficiently resistive material to avoid electrical shorts between stacked gate electrodes subsequently fabricated for embodiments where some of the gate mandrel may is retained in a final device structure (i.e., the gate mandrel is not completely sacrificial), as further described below.

Figure 3A:
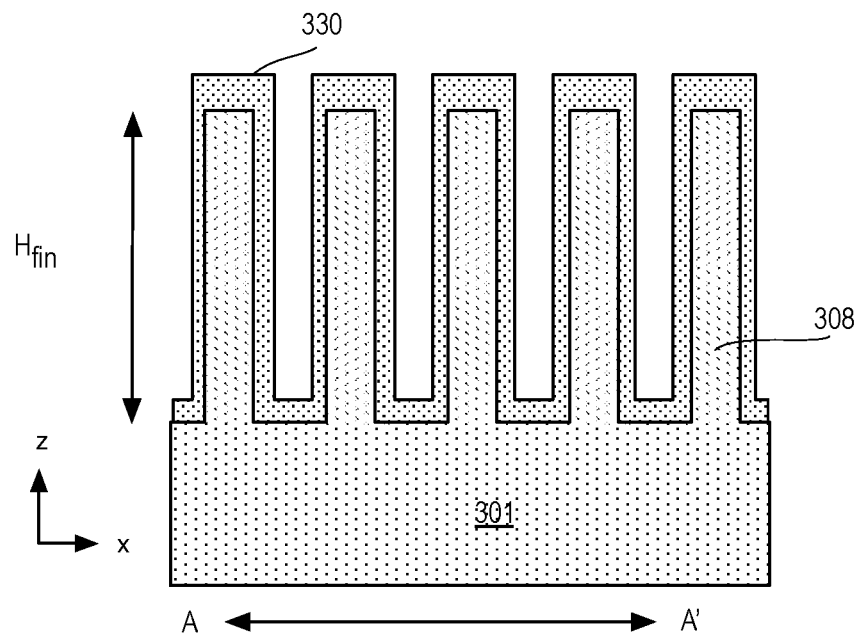
FIGS. 3A, 3B, 3C, 3D, 3E, 3F, 3G and 3H are cross-sectional views of stacked finFETs evolving as selected operations in the methods illustrated in FIG. 2 are performed, in accordance with some embodiments.

FIG. 3A illustrates one example where a homogenous, bulk semiconductor substrate 301 is patterned into fins 308. Substrate 301 may be any semiconductor known to be suitable for the fabrication of FETs. Substrate 301 can be any of the Group IV, Group III-V, Group III-N semiconductors described above, for example. Any conventional patterning processes known to be suitable for fin fabrication may be employed to pattern fins 308. For example, photolithographic mask patterning and anisotropic semiconductor etch process may be employed. In FIG. 3A, gate mandrel 330 is a continuous stripe extending over a plurality of fins. Gate mandrel 330 may be any material with sufficient resistivity. Gate mandrel 330 may be a low-k, moderate-k, or high-k, dielectric material, such as, but not limited to SiN, $SiO_x$, SiON, HSQ, MSQ, carbon alloys (e.g., SiOC(H)). Gate mandrel 330 may also be a resistive metal oxide (e.g., $AlO_x$, $HfO_x$, $TaO_x$, $TiO_x$, $WO_x$), or resistive metal silicate.

As shown in FIG. 3A, a gate mandrel layer is deposited over fin sidewalls to a thickness that ensures a gap or space remains between adjacent fins. A gate mandrel layer may be deposited with a substantially conformal process, such as atomic layer deposition (ALD) or plasma enhanced chemical vapor deposition (PECVD), for example. The gate mandrel layer may then be patterned using any known lithographic masking techniques and any anisotropic etch process known to be suitable for the chosen gate mandrel materials. The gate mandrel patterning will ultimately set the CD of the gate electrodes, and any multi-patterning techniques known to be suitable for gate lithography may be employed in patterning the gate mandrel. In the illustrated example, gate mandrel 330 has been patterned into a stripe that has a longitudinal length extending in a direction substantially orthogonal to fins 308. The transverse width of gate mandrel 330 may be approximately equal to the desired gate electrode critical dimension.

Figure 3B:
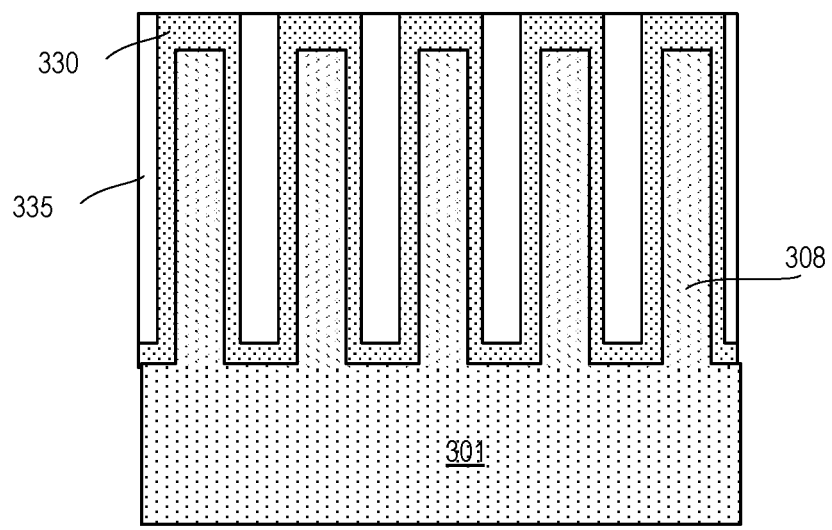
Figure 3C:
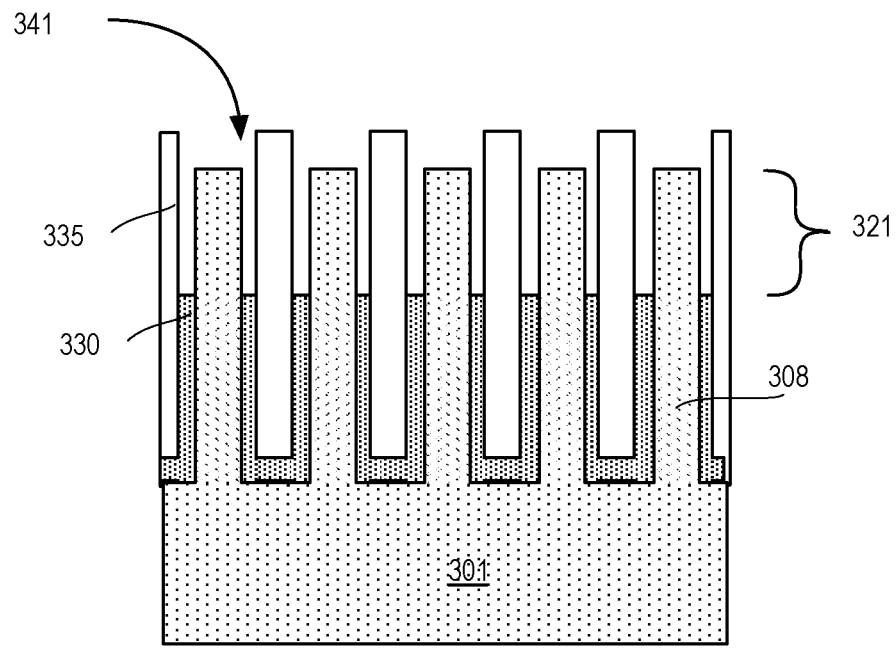
Figure 3D:
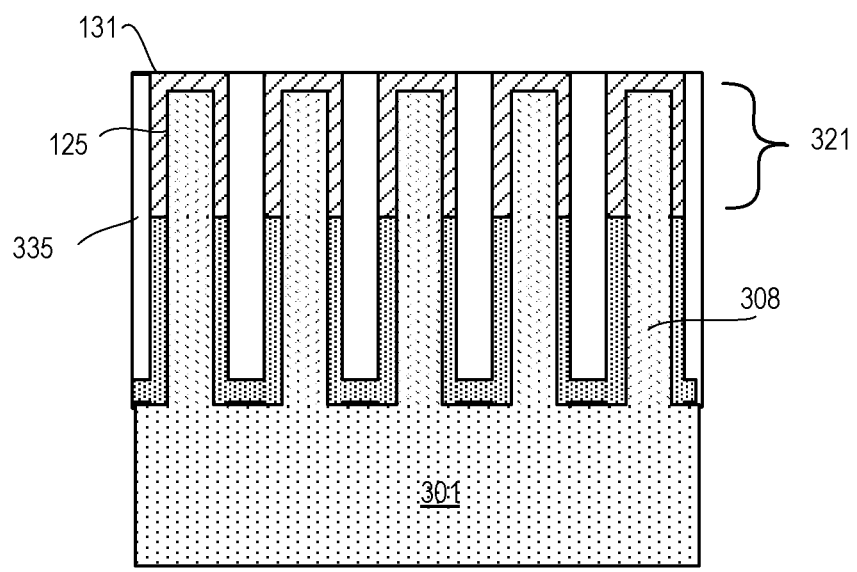
Figure 3E:
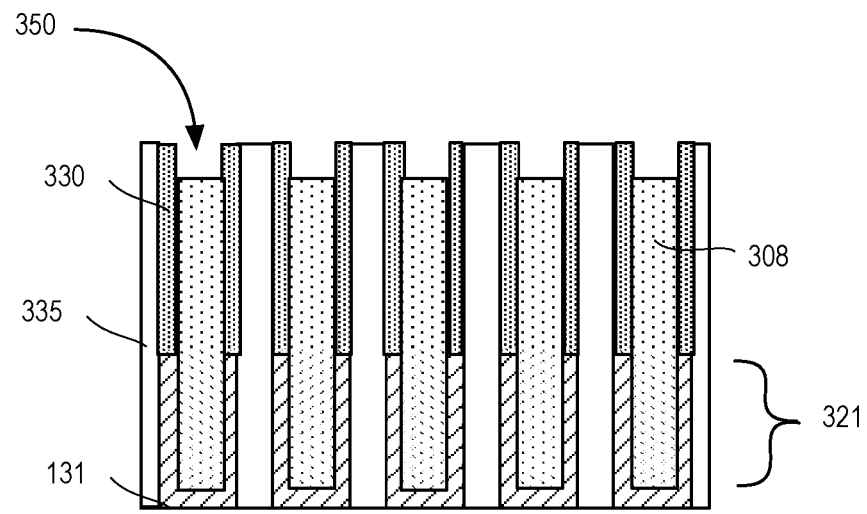
Figure 3F:
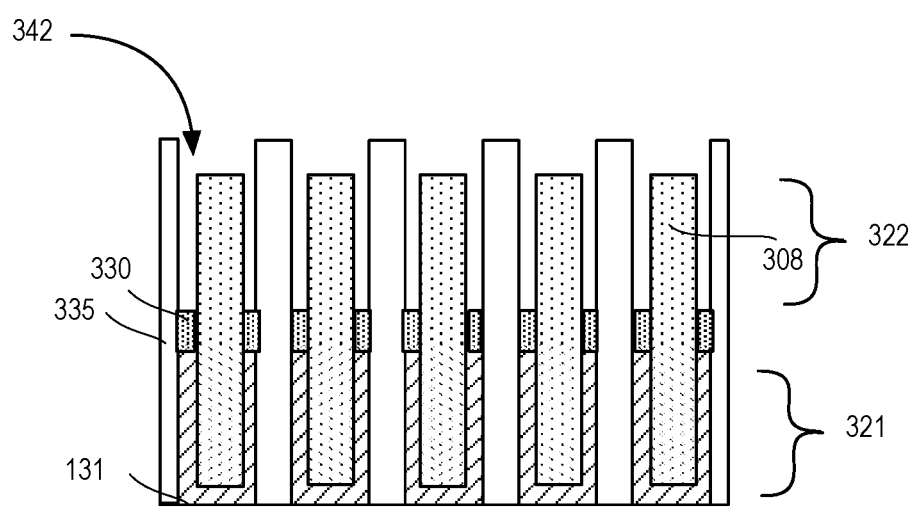

As further illustrated in FIG. 3B, a dielectric material 335 is deposited over fins 308 and gate mandrel 330. Dielectric material 335 may be a dielectric material, such as any of the materials described above for gate mandrel 330. However, dielectric material 335 is advantageously a different material than gate mandrel 330 to facilitate subsequent selective etching of gate mandrel 330. Dielectric material 335 may be deposited with any deposition process that provides suitable gap-fill and/or planarization. In some exemplary embodiments, dielectric material 335 is deposited with a flowable CVD (fCVD) process. In other embodiments, dielectric material 335 is applied with a spin-on technique. In some embodiments, dielectric material 335 is planarized using any suitable chemical-mechanical planarization (CMP) process to expose a top surface of gate mandrel 330, for example as shown in FIG. 3B.

Returning to FIG. 2, methods 200 continue at operation 230 where the gate mandrel is recessed by a predetermined amount. The gate mandrel recess etch is advantageously selective to the surrounding dielectric material and fin semiconductor. The mandrel recess defines a finFET channel width by exposing an amount of fin semiconductor sidewall. The portion of the gate mandrel material removed is then replaced with a gate stack. The evacuated portion of the gate mandrel may either be directly replaced with a permanent gate stack that includes a gate dielectric and a work function metal, or it may be replaced with an intermediate sacrificial gate, for example including polysilicon, or the like. In the example shown in FIG. 3C, gate mandrel 330 is recessed selectively relative to dielectric material 335, creating top-side recesses 341 that expose a sidewall of channel portion 311. Any suitable isotropic or anisotropic etch process with suitable selectively may be employed. The recess etch may be an unmasked (blanket) etch back. As further shown in FIG. 3D, a gate stack, including a layer of gate dielectric 125 and gate electrode 131, is then deposited within recess 341 over the exposed sidewall of channel portion 321. Any suitable technique may be employed to deposit gate dielectric 125 (e.g., ALD) and gate electrode 131 (e.g., PECVD, ALD). A planarization process (e.g., CMP) may then planarize a top surface of gate electrode 131 to expose a top surface of dielectric material 335.

With one gate electrode now fabricated, methods 201 (FIG. 2) continue at operation 240 where a bottom of the semiconductor fins and gate mandrel is revealed. In some exemplary embodiments, the reveal of the back side of a device structure entails wafer-level back-side processing. During such processing, a front side of the workpiece may be bonded to a carrier while a thickness of the back side substrate is polished off (e.g., CMP) and/or etched through with a wet or dry (e.g., plasma) etch process. Any grind, polish, and/or wet/dry masked or un-masked etch process known to be suitable for the composition of the substrate may be employed at operation 240. For example, where the backside substrate is a group IV semiconductor (e.g., silicon), a CMP slurry known to be suitable for thinning the semiconductor may be employed at operation 240. Likewise, any wet etchant or plasma etch process known to be suitable for etching the group IV semiconductor may also be employed at operation 240. Examples include any known through substrate via etch process. Depending on the substrate removal technique, the substrate removal may be global, across an entire surface of the substrate, or localized, as controlled by an etch mask applied over the substrate surface. In the example shown in FIG. 3E, the backside removal process breaks through to the bottom of gate mandrel 330, exposing a bottom of dielectric material 335. A bottom portion of fins 308 are then recessed selectively relative to dielectric material 335 with any suitable semiconductor etch process, thereby forming fin recess 350.

Figure 3G:
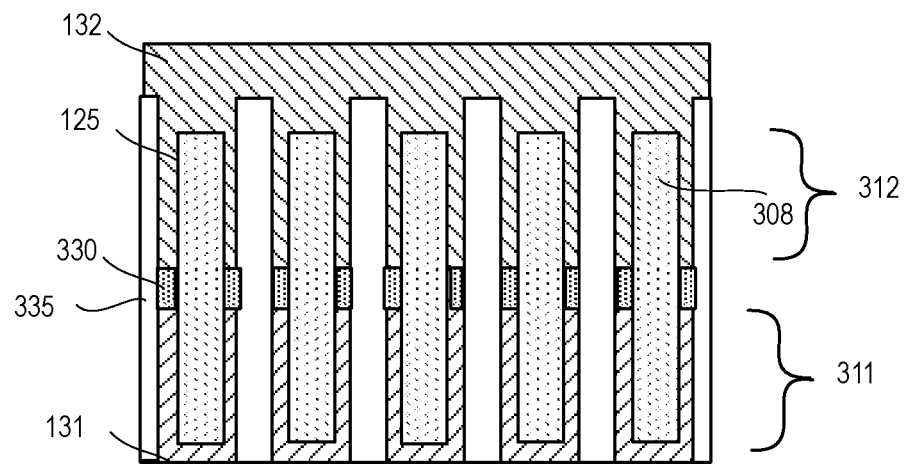
Figure 3H:
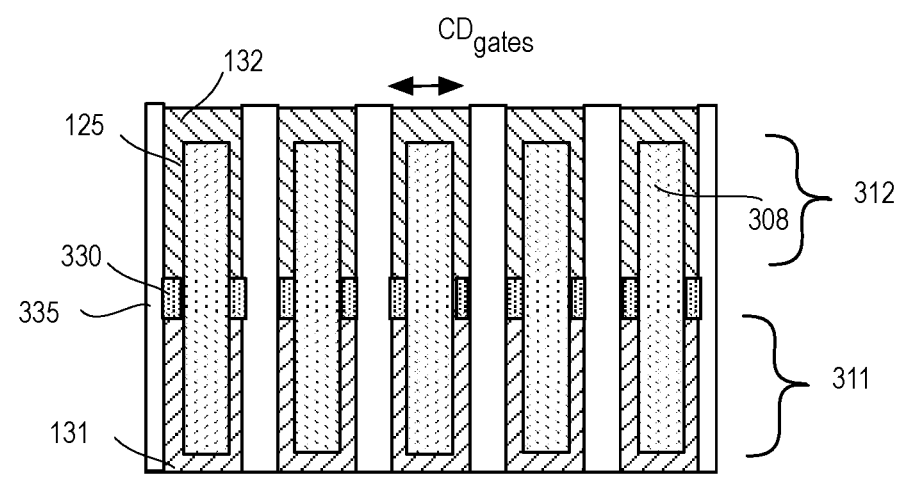

Returning to FIG. 2, following exposure of the semiconductor fins and gate mandrel, the partial gate mandrel replacement technique that was employed to form the first gate electrode is substantially repeated to form the second gate electrode at operation 250. In the example further illustrated in FIG. 3F, gate mandrel 330 is recess etched with an etch process that is selective to the gate mandrel material relative to dielectric material 335. A gate mandrel recess 342 exposes a semiconductor sidewall of channel portion 322. As shown, not all of gate mandrel 330 is removed to avoid exposing gate electrode 131. The portion of gate mandrel 330 retained is to electrically isolate gate electrode 131 from a second gate electrode subsequently formed within gate mandrel recess 342. As shown in FIG. 3G, gate dielectric 125 and gate electrode 132 is deposited within gate mandrel recess 342. Overburden is then planarized with a top surface of dielectric material 335 to electrically separate individual finFET gates, as further shown in FIG. 3H. At this point in the fabrication process, stacked finFET channels and gate electrodes are fabricated.

Referring back to FIG. 2, methods 201 end at operation 260 where the remaining transistor terminals are fabricated. Source and drain terminals for the first and second finFETs may be fabricated according to any suitable techniques. For example, to form source and drain regions dopants such as boron, aluminum, antimony, phosphorous, arsenic, or the like, may be ion-implanted into end regions of channel portions. An annealing process that activates the dopants may follow an ion implantation process. These same dopants may also be in-situ deposited with majority constituents during an epitaxial regrowth from subfin portions and end regions of the channel portions. For example, channel portions may be first etched to form recesses where the source and drain regions are to be formed. An epitaxial growth or material deposition process may then be carried out to fill the recesses with material that is employed as the source and drain regions. In some embodiments, the source and drain regions may be fabricated at operation 260 using a silicon alloy such as silicon germanium, or silicon carbide. The deposited alloy may be doped in-situ with any impurities. In further embodiments, the source and drain regions may be formed using one or more semiconductor materials other than that of the channel portions, such that a heterojunction is formed between the channel portion and source/drain regions.

One or more layers of metal and/or metal alloys used to form source and drain contacts may also be formed at operation 260 according to any suitable techniques. One or more levels of interlayer dielectric (ILD) and interconnect metallization may also be fabricated at operation 260 according to any suitable techniques. Notably, operation 260 may be performed on both the front side and back side of the stacked finFETs. Such font side processing may be performed prior to the backside reveal operation 240, or it may be performed subsequent to forming both of the stacked gate electrodes. Such back side processing may be performed subsequent to the backside reveal operation 240, and it may be performed subsequent to forming both of the stacked gate electrodes, for example.

Notably, a back side of a semiconductor fin may be revealed at any point during fabrication of a stacked CMOS finFET structure. In methods 201, the back side of a semiconductor fin may be revealed relatively late in a fabrication process, for example after the formation of the stacked semiconductor fin, front-side transistor terminals, and one or more levels of front side interconnect metallization. Alternatively, the back side of a semiconductor fin may be revealed early in a fabrication process, for example to facilitate formation of the stacked semiconductor fin. For such embodiments, a stacked semiconductor fin may be fabricated subsequent to front side fabrication of a first finFET, subsequent to front side fabrication of source and drain terminals, or even subsequent to front side fabrication of front side interconnect metallization.

Figure 4:
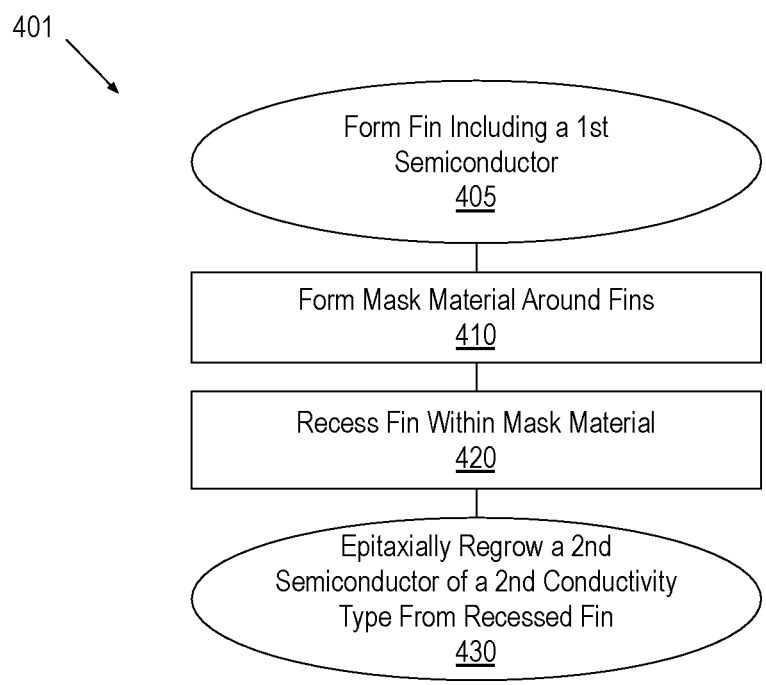
FIG. 4 is a flow diagram illustrating methods of fabricating stacked CMOS finFETs, in accordance with some embodiments.

As noted above, methods 201 may also be practiced with a stacked semiconductor fin to arrive at the stacked CMOS finFET structures illustrated in FIG. 1A-1D. Such stacked semiconductor fins may be fabricated with exclusively front side processing, or with a hybrid process that includes back side processing. FIG. 4 is a flow diagram illustrating methods 401 for fabricating stacked semiconductor fins suitable for incorporation into a stacked CMOS finFET structure, in accordance with some further embodiments. Methods 401 employ only front side processing. FIGS. 5A, 5B, 5C, 5D and 5E are cross-sectional views of stacked fin structures evolving as selected operations in the methods 401 are performed, in accordance with some exemplary embodiments.

Referring first to FIG. 4, methods 401 begin at operation 405 with formation of a fin including a first semiconductor. At operation 405, fins may be fabricated into a surface of a bulk monocrystalline semiconductor substrate, or into one monocrystalline semiconductor layer of a stack of semiconductor material layers. Following fin formation, a mask material is deposited around the fin and planarized at operation 410. In the example shown in FIG. 5A, fins 308 are etched into substrate 301. Substrate 301 may be a monocrystallie or SOI substrate, for example including any of the Group IV, Group III-V, Group III-N semiconductor materials described above. Any conventional patterning processes known to be suitable for fin fabrication may be employed to pattern fins 308. For example, one or more photolithographic masking operations and anisotropic semiconductor etch processes may be employed to delineate fins with a fin height of $H_{fin}$. Fin height $H_{fin}$ may be a predetermined height sufficient to host two stacked finFETs. As further shown in FIG. 5B, dielectric material 180 is deposited over sidewalls of fins 308, at least partially backfilling spaces between adjacent fins, masking all but a top surface of fins 308. Dielectric material 180 may be any of those materials described above. Following planarization (e.g., CMP), top surfaces of fins 308 are exposed and substantially planar with a top surface of isolation dielectric 180.

Returning to FIG. 4, methods 401 continue at operation 420 where a top portion of the semiconductor fin is etched selectively relative to the surrounding mask material, recessing the surface of the semiconductor fin below the top surface of the isolation dielectric. As such, a portion of the first semiconductor that was formed into a fin at operation 405 is sacrificial. Any etch process(es) known to be suitable for recessing the particular semiconductor composition may be employed at operation 420. For example, where the fins are silicon and the surrounding mask material is silicon dioxide, the etch process(es) may entail isotropic and/or anisotropic chemical etch processes (e.g., HBr, $Cl_2$, HMDS, etc.) that are highly selective relative to the dielectric material. The recess etch may be a blanket (unmasked) isotropic or anisotropic etch, for example. The recess etch process may be a timed process of a duration predetermined to recess the semiconductor fin to a target depth. In the example shown in FIG. 5C, a top portion of fins 308 have been etched to form fin recesses 550 between portions of isolation dielectric 180. The surviving remnant of the recessed semiconductor fin becomes channel portion 122 of a stacked semiconductor fin. As shown, recesses 550 have a recess height $H_{r,1}$. Recess height $H_{r,1}$ may target a depth that is at least equal to the desired fin height $H_{fin,1}$. In the illustrated example, recess height $H_{r,1}$ is greater than a desired fin height $H_{fin,1}$.

Returning to FIG. 4, methods 401 continue at operation 430 where one or more second layer of semiconductor material is formed within the recess created at operation 420, effectively replacing a portion of the first semiconductor with an alternative semiconductor composition that is more suitable for one of the stacked finFETs. In some embodiments, an epitaxial growth process is performed at operation 430 to grow one or more crystalline semiconductor layers over a seeding surface of the surviving portion of the first semiconductor. During such epitaxial (re)growth of fin semiconductor, the surrounding dielectric material may provide sidewalls of sufficient height over the semiconductor growth surface to practice aspect ratio trapping (ART) during the epitaxial growth process. With ART, defects propagating from a growth plane may preferentially terminate at sidewalls of the epitaxial semiconductor layer intersecting the sidewalls of isolation dielectric, thereby lowering defect count within the upper most portion of the regrown semiconductor. The ART technique may achieve acceptable crystal quality within heteroepitaxial material, and is one example of local additive heteroepitaxial stack semiconductor fabrication, which may advantageously reduce the effects of lattice mismatch across various heterojunctions within a stacked fin. In some alternative embodiments, operation 430 includes deposition of non-crystalline or polycrystalline semiconductor material. Such material may then be melted and (re)crystallized to match the crystallinity to the seeding surface during a thermal anneal. Any such solid-phase epitaxial process known to be suitable for a given semiconductor composition may be practiced at operation 430. Any overburden associated with the epitaxial growth or deposition process(es) may be planarized with the surrounding isolation dielectric using any suitable techniques (e.g., CMP).

Figure 5A:
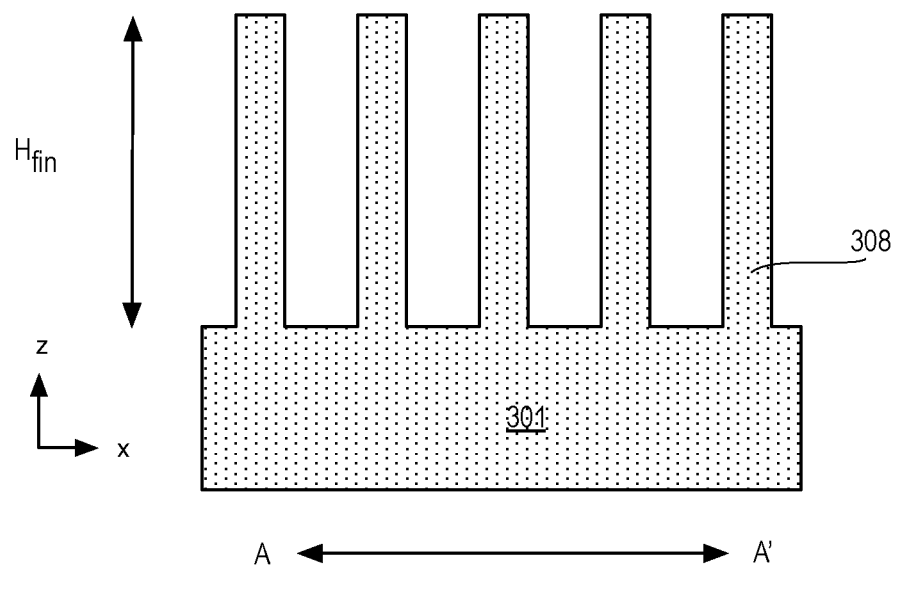
FIGS. 5A, 5B, 5C, 5D and 5E are cross-sectional views of stacked finFETs evolving as selected operations in the methods illustrated in FIG. 4 are performed, in accordance with some embodiments.
Figure 5B:
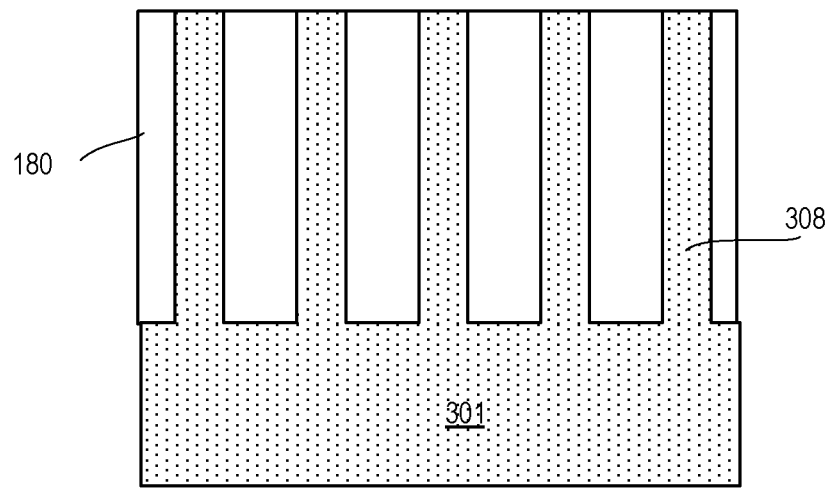
Figure 5C:
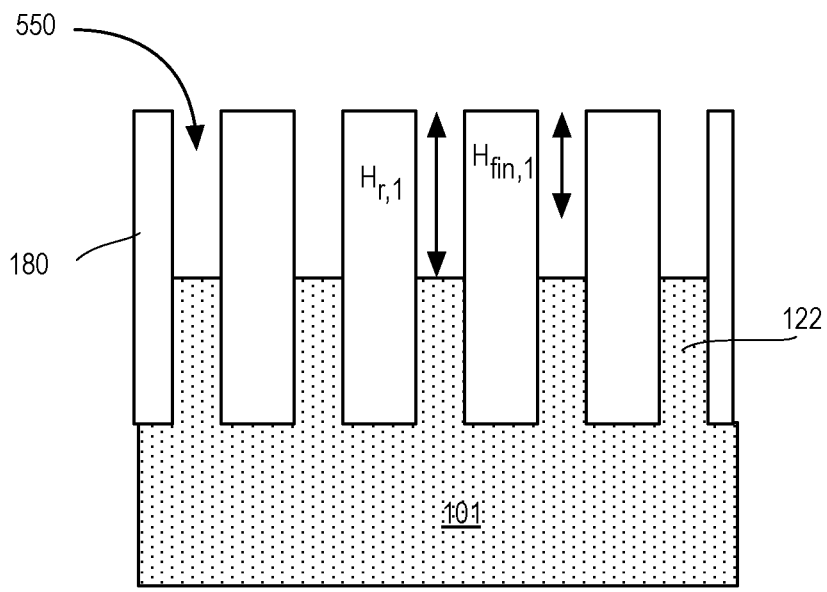
Figure 5D:
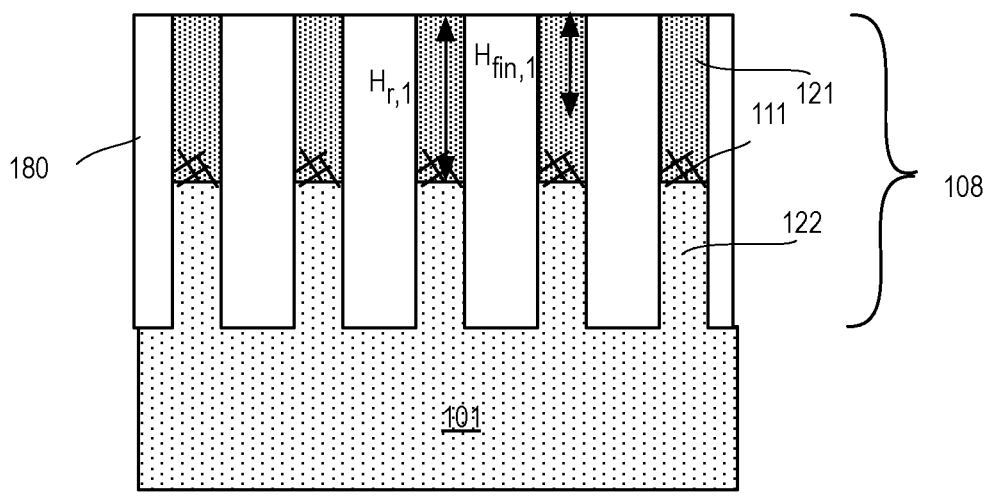
Figure 5E:
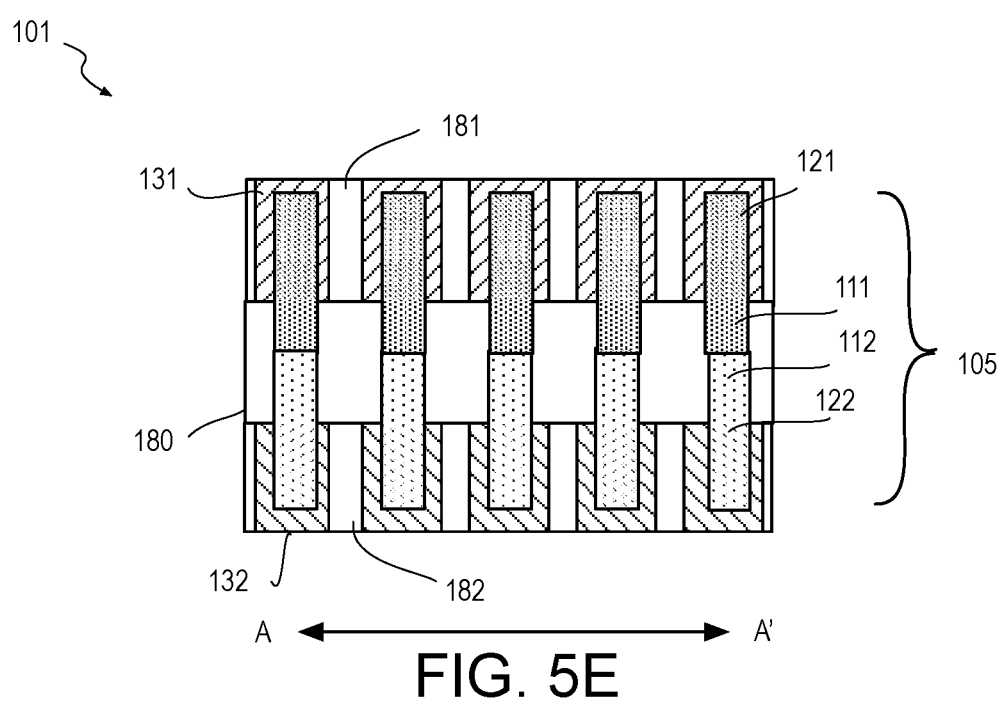

In the example shown in FIG. 5D, stacked semiconductor fin 108 is formed by backfilling fin recesses 550 with channel portion 121 comprising one or more second layer of semiconductor material. Channel portion 121 may comprise any of the semiconductor materials described above in the context of FIG. 1B, for example. As shown, the thickness of the second semiconductor layer grown within the recesses is approximately equal to the fin recess height $H_{r,1}$. The uppermost region of channel portion 121 (e.g., associated with fin height $H_{fin,1}$) has good crystal quality with the highest defect density found within subfin portion 111, proximal to the interface of fin 308. At this point, stacked semiconductor fin 108 is substantially complete. With semiconductor fin processes complete, lower temperature processing (e.g., below that epitaxial growths) may be subsequently performed during the fabrication of a stacked CMOS finFet. For example, a stacked semiconductor fin 108 as fabricated by methods 401 may be employed in methods 201 to arrive at the device structure shown in FIG. 5E. In the example shown in FIG. 5E, within a channel region of stacked CMOS finFET 105, dielectric material 180 has been further patterned (e.g., recess etched) from both the front and back sides of the stacked semiconductor fin to expose channel portions 121 and 122. Gate stacks 131 and 132 have been fabricated over the exposed channel portions 121 and 122. Dielectric material 180 therefore remains adjacent to sidewalls of subfin portions 111 and 112, while additional isolation dielectric 181 and 182 has been subsequently deposited to occupy separations between adjacent gate stacks 131 and 132, respectively. For embodiments where gate stacks 131 and 132 have been fabricated in a self-aligned manner (e.g., according to methods 201), the example shown in FIG. 5E is substantially as described above in FIG. 1C for vertically stacked CMOS finFET structure 101.

Figure 6:
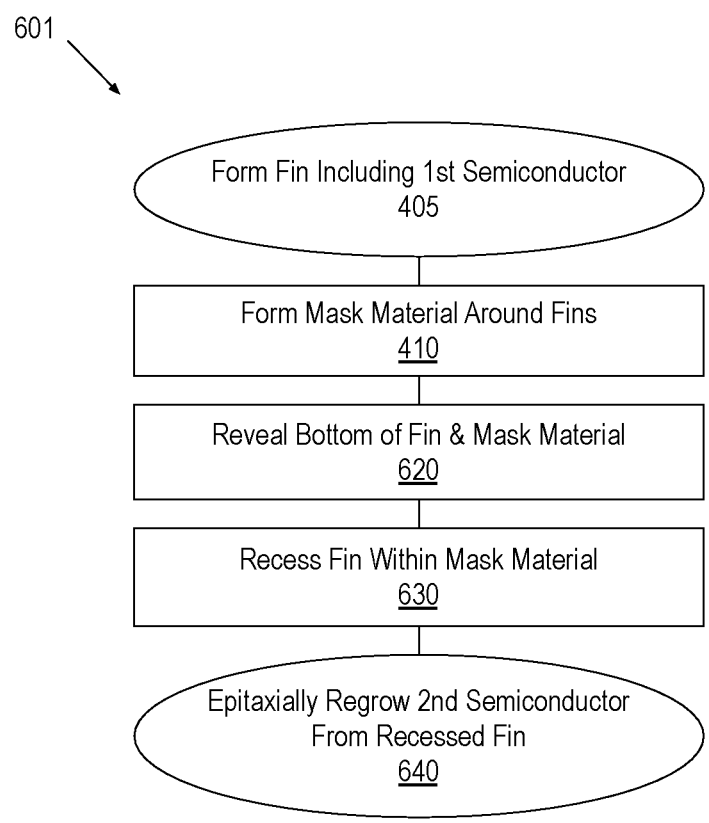
FIG. 6 is a flow diagram illustrating methods of fabricating stacked CMOS finFETs, in accordance with some alternative embodiments.

FIG. 6 is a flow diagram illustrating methods 601 for fabricating stacked semiconductor fins, in accordance with some alternative embodiments where back-side processing is employed to form the stacked semiconductor fin. In this example, a reveal of the back side of a semiconductor fin is followed by both front side and back side transistor terminal fabrication to limit high-temperature epitaxial processing to the front end of the fabrication process. Where epitaxially processing is of sufficiently low temperature (e.g., Ge growths), front side transistor terminal fabrication may instead be completed prior to replacing a portion of a semiconductor fin with an epitaxially grown material layer.

Figure 7A:
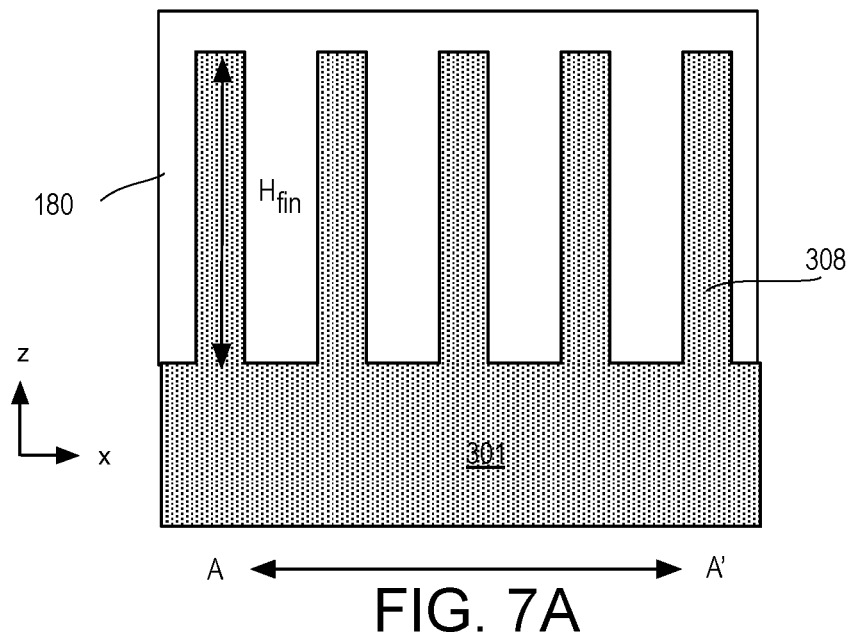
FIGS. 7A, 7B, 7C, 7D, and 7E are cross-sectional views of stacked finFETs evolving as selected operations in the methods illustrated in FIG. 6 are performed, in accordance with some embodiments.

Methods 601 begin at operation 405 where a fin including a first semiconductor is fabricated, for example substantially as described above in the context of methods 401. Methods 601 continue at operation 410 where a mask material is formed around the fins, for example substantially as described above in the context of methods 401. In the example shown in FIG. 7A, semiconductor fins 308 have a fin height $H_{fin}$ and are covered with a planarized dielectric material 180. At this point, dielectric material 180 may be bonded to a suitable front-side carrier (not depicted).

Figure 7B:
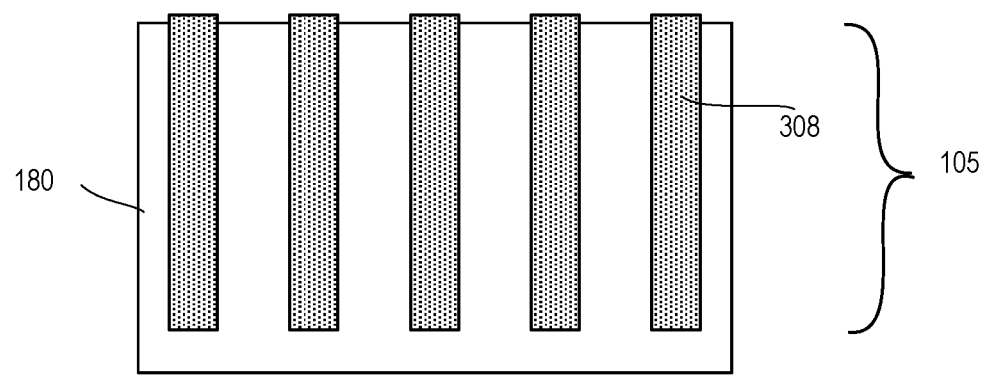

Returning to FIG. 6, methods 601 continue at operation 620 where the bottom of the semiconductor fin is revealed through back-side processing. Any suitable technique, such as, but not limited to, cleaving, grinding, lapping, polishing, masked etching, and unmask etching may be performed at operation 620. In the example illustrated in FIG. 7B, a bulk portion of substrate 301 has been removed through backside processing, exposing a bottom portion of semiconductor fins 308. Methods 601 (FIG. 6) continue at operation 630 where a bottom portion of the semiconductor fin is etched selectively relative to the surrounding mask material, recessing the surface of the semiconductor fin below the top surface of the mask material. As such, a portion of the semiconductor that was formed into a fin at operation 405 is sacrificial. Any etch process(es) known to be suitable for recessing the particular semiconductor composition may be employed at operation 630. For example, where the fins are silicon and the surrounding mask material is silicon dioxide, the etch process(es) may entail isotropic and/or anisotropic chemical etch processes (e.g., HBr, $Cl_2$, HMDS, etc.) that are highly selective relative to the isolation dielectric. The recess etch may be a blanket (unmasked) isotropic or anisotropic etch, for example. The recess etch process may be a timed process of a duration predetermined to recess the semiconductor fin to a target depth.

Figure 7C:
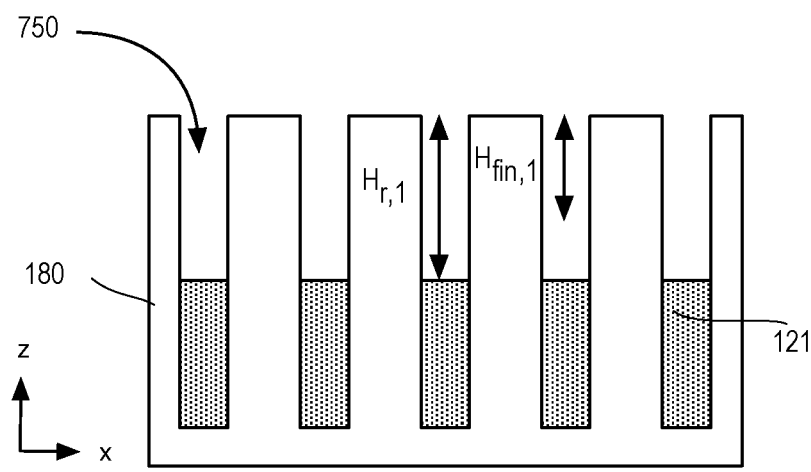

In the example shown in FIG. 7C, a bottom portion of the semiconductor fin has been etched to form fin recesses 750 between portions of dielectric material 180. The surviving remnant of the recessed semiconductor fin becomes channel portion 121 of a stacked semiconductor fin. As shown, recesses 750 have a recess height $H_{r,1}$. Recess height $H_{r,1}$ may target a depth that is at least equal to the desired fin height $H_{fin,1}$. In the illustrated example, recess height $H_{r,1}$ is greater than a desired fin height $H_{fin,1}$.

Returning to FIG. 6, methods 601 continue at operation 640 where one or more second semiconductor layer is formed within the recess created at operation 630, effectively replacing a portion of the first semiconductor with an alternative semiconductor composition that is more suitable for one of the stacked finFETs. In some embodiments, an epitaxial growth process is performed at operation 640 to grow one or more crystalline semiconductor layers over a seeding surface of the surviving portion of the first semiconductor. During such epitaxial (re)growth of fin semiconductor, the surrounding dielectric material may provide sidewalls of sufficient height over the semiconductor growth surface to practice aspect ratio trapping (ART) during the epitaxial process.

Figure 7D:
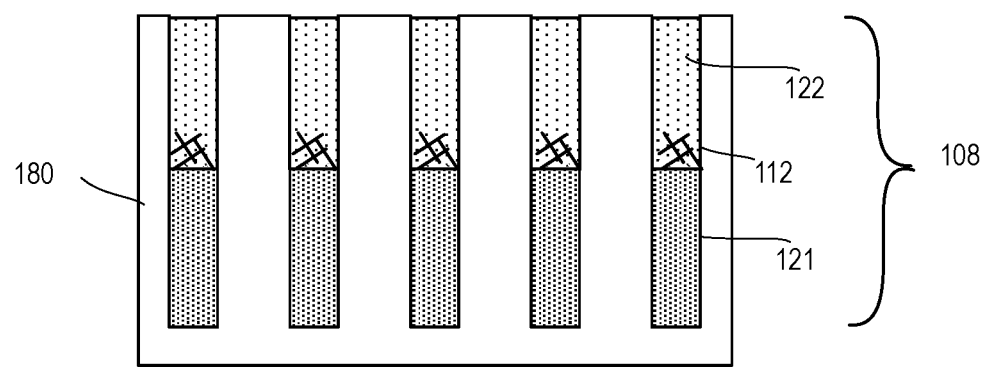
Figure 7E:
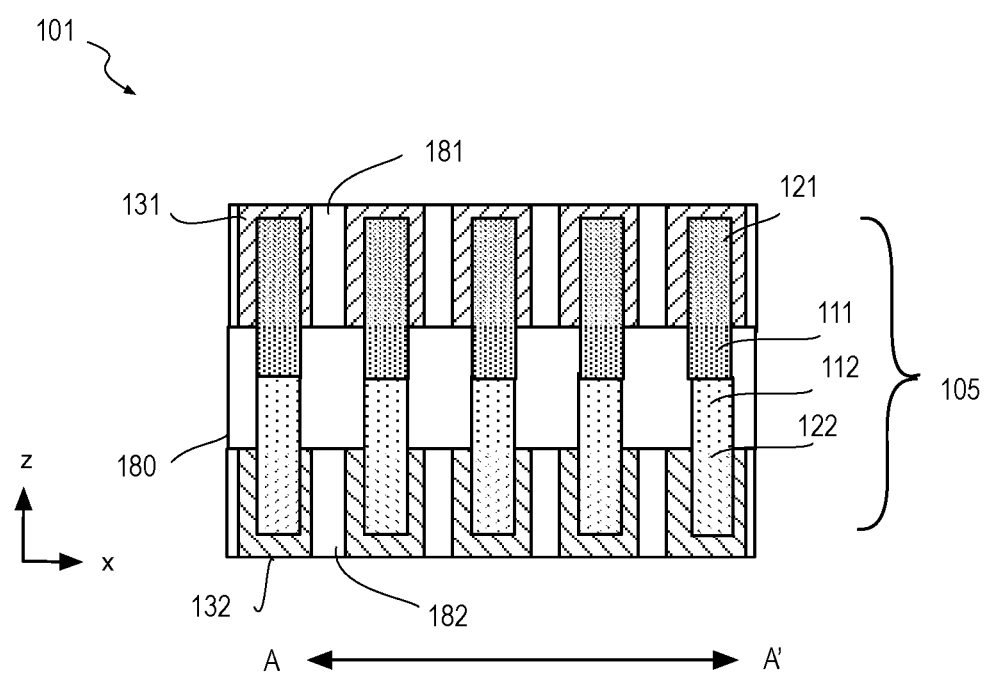

In the example shown in FIG. 7D, stacked semiconductor fin 108 is formed by backfilling fin recesses 750 with channel portion 122 comprising one or more second semiconductor material. Channel portion 122 may comprise any of the semiconductor materials described above in the context of FIG. 1B, for example. As shown, the thickness of the second layers of semiconductor material grown within the recesses is approximately equal to the fin recess height $H_{r,1}$. The uppermost region of channel portion 122 (e.g., associated with fin height $H_{fin,1}$ has good crystal quality with the highest defect density found within subfin portion 112, proximal to the interface of channel portion 121. At this point, stacked semiconductor fin 108 is substantially complete. Lower temperature processing (e.g., below that epitaxial growths) may then be performed during the fabrication of a stacked CMOS finFet. For example, stacked semiconductor fin 108 may be fabricated according to methods 601 at operation 210 (FIG. 2) and subsequently employed in methods 201. A stacked semiconductor fin 108 as fabricated by methods 601 may be employed in methods 201 to arrive at the device structure shown in FIG. 7E. In this example, within a channel region of stacked CMOS finFET 105, dielectric material 180 has been patterned (e.g., recess etched) from both the front side and the back side of the stacked semiconductor fin to expose channel portions 121 and 122. Gate stacks 131 and 132 have been fabricated over the exposed channel portions 121 and 122. Dielectric material 180 therefore remains adjacent to sidewalls of subfin portions 111 and 112, while additional layers of dielectric materials 181 and 182 have been subsequently deposited over dielectric material 180 to occupy separations between adjacent gate stacks 131 and 132, respectively. For embodiments where gate stacks 131 and 132 have been fabricated in a self-aligned manner (e.g., according to methods 201), the example shown in FIG. 7E is substantially as described above in FIG. 1C for vertically stacked CMOS finFET structure 101.

Figure 8:
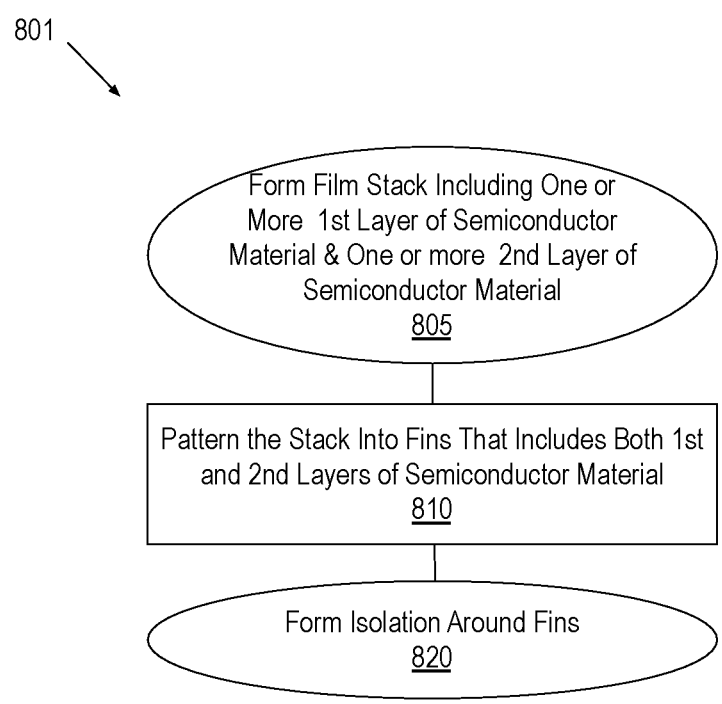
FIG. 8 is a flow diagram illustrating methods of fabricating stacked CMOS finFETs, in accordance with some alternative embodiments.

In some embodiments a stacked semiconductor fin is fabricated by patterning fins from a multilayered semiconductor stack that has been epitaxially grown or laminated (e.g., through a layer transfer process). FIG. 8 is a flow diagram illustrating methods 801 for fabricating stacked semiconductor fins, in accordance with some alternative embodiments. Methods 801 again employ only front side processing to fabricate stacked semiconductor fins suitable for forming a stacked CMOS finFET structure. FIGS. 9A, 9B, 9C and 9D are cross-sectional views of stacked fin structures evolving as selected operations in the methods illustrated in FIG. 8 are performed, in accordance with some embodiments.

Referring first to FIG. 8, methods 801 begin at operation 805 with formation of a semiconductor film stack that includes a plurality of semiconductor layers, with at least two such layers being suitable as FET channel material. Where epitaxial growth is employed at operation 805, a pseudomorphic or metamorphic semiconductor layer having a suitable composition for a first FET may be grown from a crystalline growth substrate having a suitable composition for a second FET. The growth substrate may have any suitable lattice structure, such as, but not limited to, cubic or tetragonal. Any suitable epitaxial growth processes may be employed to grow the second semiconductor layer.

Figure 9A:
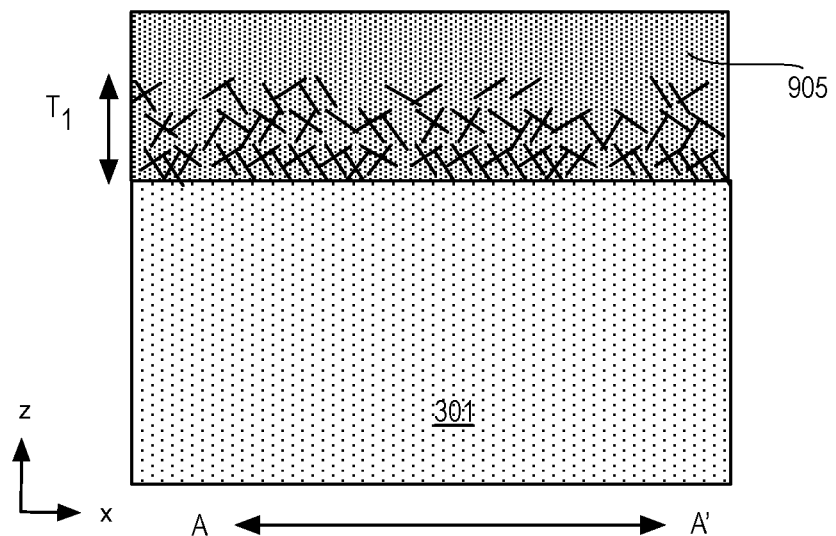
FIGS. 9A, 9B, 9C and 9D are cross-sectional views of stacked finFETs evolving as selected operations in the methods illustrated in FIG. 8 are performed, in accordance with some embodiments.
Figure 9B:
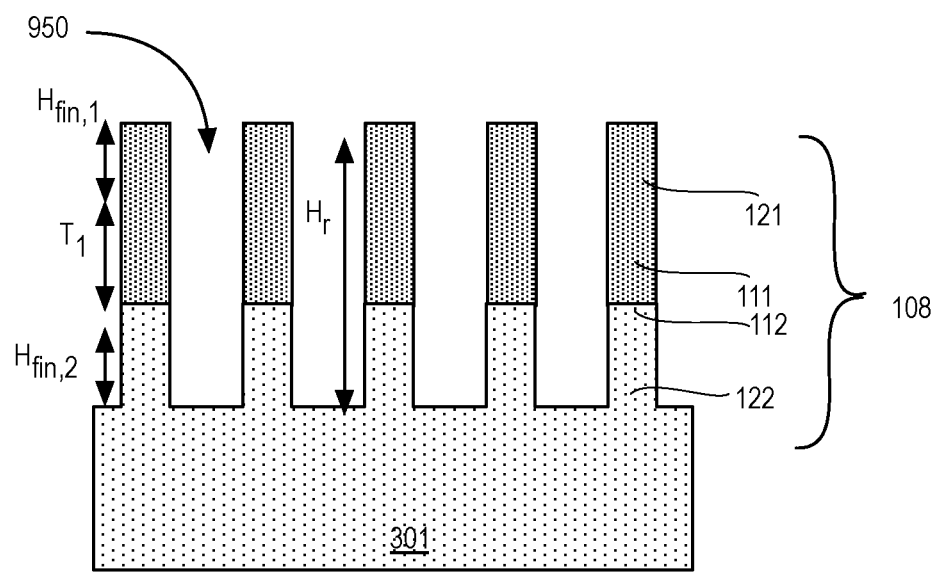
Figure 9C:
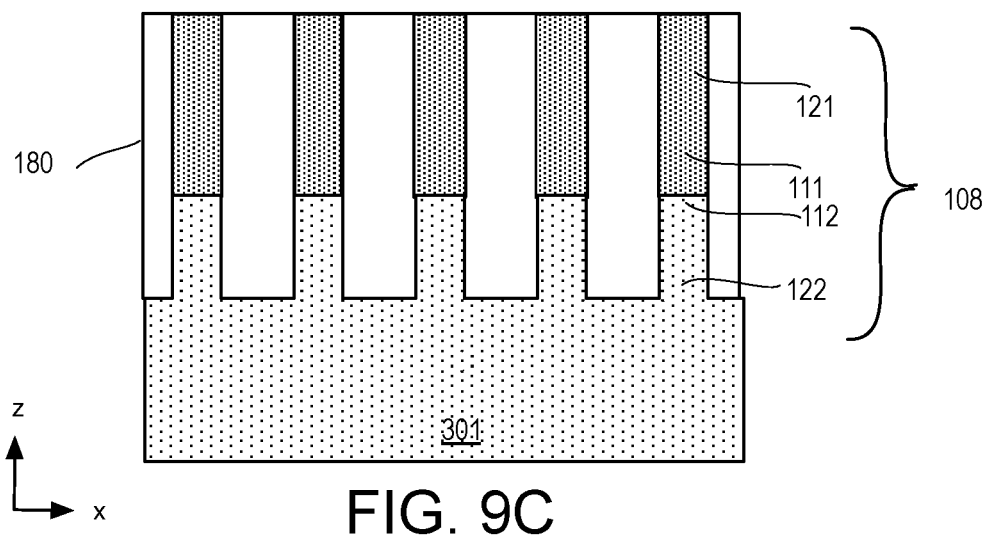

In the example shown in FIG. 9A, a crystalline semiconductor layer 905 is epitaxially grown on substrate 301. Substrate 301 may be any semiconductor known to be suitable for the fabrication of FETs. Substrate 301 can be any of the Group IV, Group III-V, Group III-N or Group II-VI semiconductors described above, for example. Crystalline semiconductor layer 905 may be any semiconductor known to be suitable for the fabrication of FETs. Semiconductor layer 905 can be any of the Group IV, Group III-V, Group III-N, or Group II-VI semiconductors described above, for example. Depending on the extent of material layer mismatch (e.g., lattice mismatch and/or CTE mismatch) between the first and second semiconductor layers, crystal defects may be present within semiconductor layer 905. Without the benefit of ART, a high-defect density zone may extend over a greater thickness $T_1$, of semiconductor layer 905. Such defected regions are generally unsuitable for FETs and should be contained within the subfin portions. With a greater thickness of semiconductor layer 905, a taller fin may be required with a greater volume of such a fin being unsuitable for a FET.

In some alternative embodiments, a crystalline semiconductor layer is bonded to a crystalline semiconductor substrate layer. Relative to heteroepitaxial growth of highly mismatched epitaxial layers, a bonding process may allow for thinner semiconductor layers of high crystal quality and enable fins of reduced height. Any layer transfer process known to be suitable for joining two layers may be employed to from a semiconductor film stack. For stacks formed by such processes, one or more intervening bonding layers (e.g., silicon dioxide or other dielectric) may be present between two crystalline semiconductor layers.

Returning to FIG. 8, methods 801 continue at operation 810 where the semiconductor material layer stack is patterned into fins that include the two or more semiconductor layers. Any masking (e.g., lithographic) process(es) and anisotropic etch process(es) may be employed to define fins from the epitaxial semiconductor layer and extending into a predetermined depth of the substrate. A dielectric material is then formed around the fins at operation 820, for example employing any suitable shallow trench isolation techniques. In the example shown in FIG. 9B, recess 950 has a height Hr that extends through the entire thickness of semiconductor layer 905, defining channel portion 121 having fin height $H_{fin,1}$, and subfin portion 111 having a thickness $T_1$. Recess 950 stops within substrate 301 at a predetermined target depth sufficient to form a FET within channel portion 122. As shown, the resulting stacked fins 108 are asymmetrical about the junction between the two semiconductor layers with the thickness of subfin portion 111 being significantly greater than subfin portion 112 as a result of the greater thickness associated with the high defect density zone within the epitaxial layer. This asymmetry is in contrast to an embodiment employing ART where the high defect density may be so thin that subfin portions 111 and 112 may be substantially the same thickness, for example limited as limited by constraints imposed by the need for electrical isolation between channel portions. In the example shown in FIG. 9C, dielectric material 180 has been deposited over stacked semiconductor fins 108, backfilling recesses 950. Any suitable planarization process may be employed to planarize a top surface of dielectric material 180 with a top surface of stacked semiconductor fins 108.

Figure 9D:
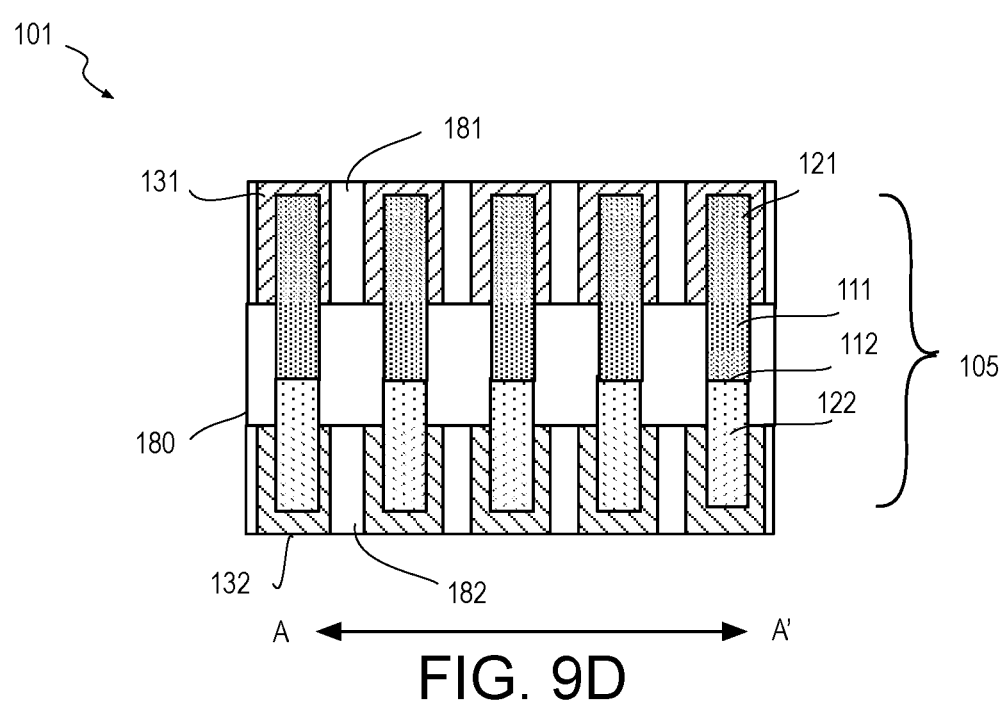

At this point, stacked semiconductor fin 108 is substantially complete. With semiconductor fin processes complete, lower temperature processing (e.g., below that epitaxial growths) may be performed during the fabrication of a stacked CMOS finFet. For example, a stacked semiconductor fin 108 as fabricated by methods 801 may be employed in methods 201 to arrived at the device structure shown in FIG. 9D. In the example shown in FIG. 9D, within a channel region of stacked CMOS finFET 105, dielectric material 180 has been patterned (e.g., recess etched) from both the front and back sides of the stacked semiconductor fin to expose channel portions 121 and 122. Gate stacks 131 and 132 have been fabricated over the exposed channel portions 121 and 122. Dielectric material 180 therefore remains adjacent to sidewalls of subfin portions 111 and 112, while additional layers of dielectric materials 181 and 182 have been subsequently deposited over dielectric material 180 to occupy separations between adjacent gate stacks 131 and 132, respectively. For embodiments where gate stacks 131 and 132 have been fabricated in a self-aligned manner (e.g., according to methods 201), the example shown in FIG. 9D is substantially as described above in FIG. 1C for vertically stacked CMOS finFET structure 101.

As noted above, a subfin portion of a stacked semiconductor fin physically separates two gated channel portions of the stacked finFET. One or more subfin portions of a stacked semiconductor fin may provide intra-fin electrical isolation between the two gated channel portions. In some embodiments, for example, bandgap engineering may be employed to impart a conduction and/or valence band offset between channel semiconductor and a subfin portion of stacked semiconductor fin. Impurity doping may also be utilized to provide junction isolation between two adjacent subfin portions, or between one subfin portion and a channel semiconductor. Such compositional differentiation may be achieved, for example, during epitaxial growth of stacked semiconductor fin. Alternatively, ex-situ techniques may be employed to enhance electrical isolation between two stacked finFETs. Exemplary ex-situ techniques include solid phase dopant diffusion and ion implantation/activation. Intra-fin isolation between a two stacked CMOS FETs may also be provided through the introduction of fixed charge adjacent to portions of the stacked semiconductor fin. Examples of these techniques are described further below.

Figure 10:
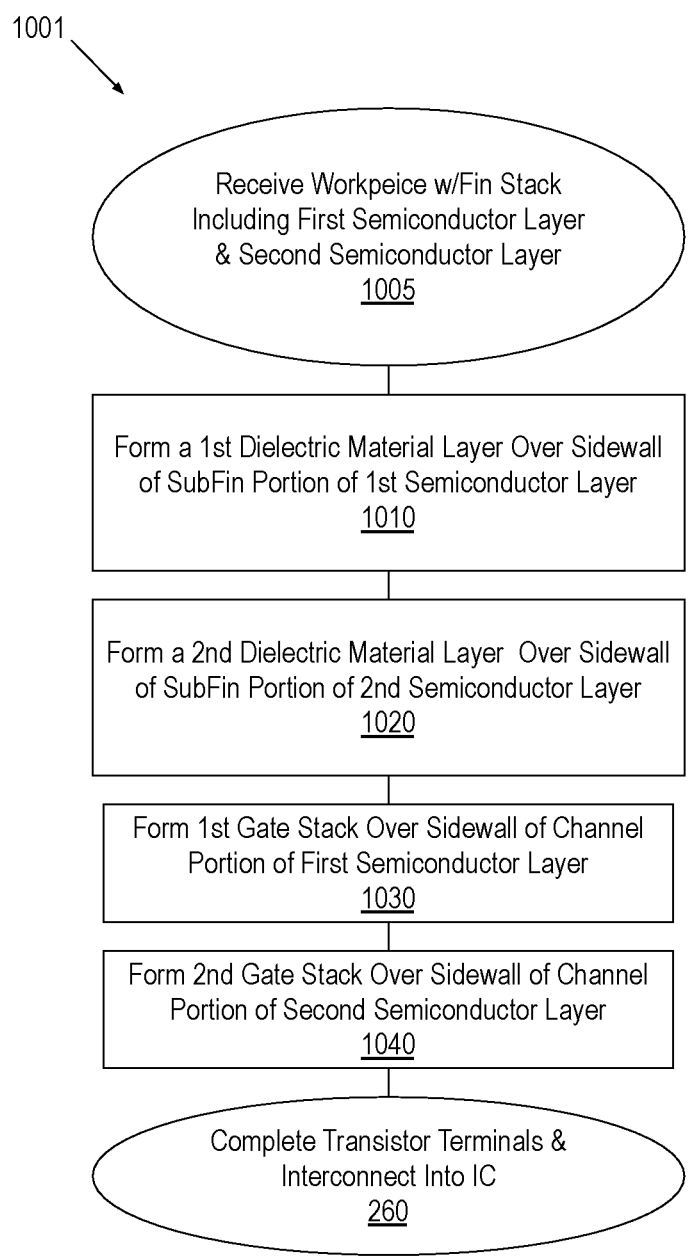
FIG. 10 is a flow diagram illustrating methods of electrically isolating stacked finFETs, in accordance with some embodiments.

FIG. 10 is a flow diagram illustrating methods 1001 for electrically isolating stacked finFETs, in accordance with some embodiments. Methods 1001 begin at operation 1005 with receiving a workpiece having a stacked semiconductor fin that includes a first semiconductor layer and a second semiconductor layer. Any of the stacked semiconductor fin structures described above may be received at operation 1005, for example. In some embodiments, the workpiece received includes a stacked semiconductor fin, which further includes a first semiconductor layer suitable for an NMOS FET and a second semiconductor layer suitable for a PMOS FET. At operation 1010, a first dielectric material layer is formed over a sidewall of a subfin portion of the first semiconductor layer. At operation 1020, a second dielectric material layer is formed over a sidewall of a subfin portion of the second semiconductor layer. In some embodiments, the first dielectric material layer is associated with an amount of fixed charge of a first polarity. Similarly, the second dielectric material layer is associated with an amount of fixed charge of a second, opposite, polarity. This stack of fixed-charge layers adjacent to vertically stacked subfin portions of the semiconductor fins may induce a depletion region within the subfin portions. In some other embodiments, the first dielectric material layer includes one or more species that can become an electrically active impurity within the first semiconductor layer. Similarly, the second dielectric material layer includes one or more species that can become an electrically active impurity within the second semiconductor layer. For such embodiments, the stack of first and second dielectric material layers function as solid-state diffusion sources of impurities that may diffuse into the subfin portions of the stacked semiconductor fin through the fin sidewalls. Examples of such solid-state diffusion sources include, but are not limited to, boron-silicate glass (BSG), phosphorus silicate glass (PSG), and arsenic silicate glass.

Methods 1001 then continue at operation 1030 with the formation of a first gate stack over a sidewall of a channel portion of the first semiconductor layer. A second gate stack over a sidewall of a channel portion of the second semiconductor layer is similarly formed at operation 1040. In some examples, one or more of the techniques described elsewhere herein are employed to form the first and second gate stacks. Methods 1001 then complete at operation 260 with the formation of remaining transistor terminals (e.g., source and drain). The transistor terminals may then be interconnected into a circuit with one or more levels of interconnect metallization.

Figure 11:
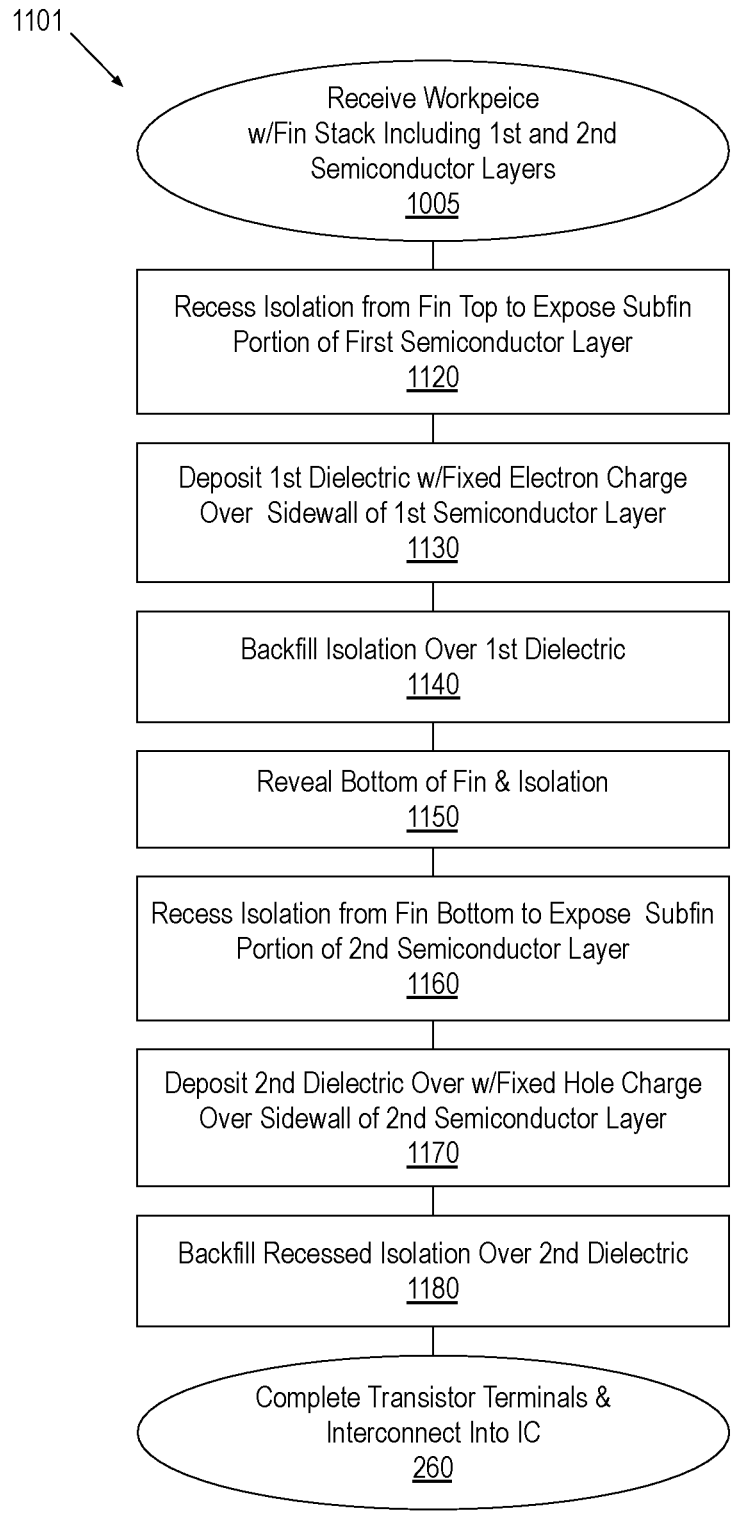
FIG. 11 is a flow diagram illustrating methods of electrically isolating stacked finFETs, in accordance with some embodiments.

FIG. 11 is a flow diagram illustrating methods 1101 for electrically isolating stacked finFETs, in accordance with some embodiments. Methods 1101 may be considered a specific implementation of methods 1001. Methods 1101 illustrate how front side and back side processing may be employed to introduce structural features that may improve isolation between stacked CMOS finFETs. FIG. 12A-12I are cross-sectional views of stacked finFETs evolving as selected operations in the methods illustrated in FIG. 11 are performed in accordance with some embodiments to arrive at stacked finFET structures having one or more of the features described for stacked finFET structure 101 (e.g., FIGS. 1A-1C), and further illustrating exemplary isolation structures.

Referring first to FIG. 11, methods 1101 begin at operation 1005 with receiving a workpiece with a stacked semiconductor fin that includes a first semiconductor layer and a second semiconductor layer. Any of the stacked semiconductor fin structures described above may be received at operation 1005. In some embodiments, the workpiece received includes a stacked semiconductor fin, which further includes a first semiconductor layer suitable for an NMOS FET, and a second semiconductor layer suitable for a PMOS FET. In some exemplary embodiments, the stacked semiconductor fin is surrounded by, or embedded within, a dielectric material (e.g., STI material). In the example shown in FIG. 12A, stacked semiconductor fins 108 including subfin portions 111 and 112 extend from substrate 301. Dielectric material 180 is located within the spaces between adjacent stacked semiconductor fins 108. Substrate 301, subfin portions 111 and 112, and dielectric material 180, may have any of the compositions previously described.

Figure 12A:
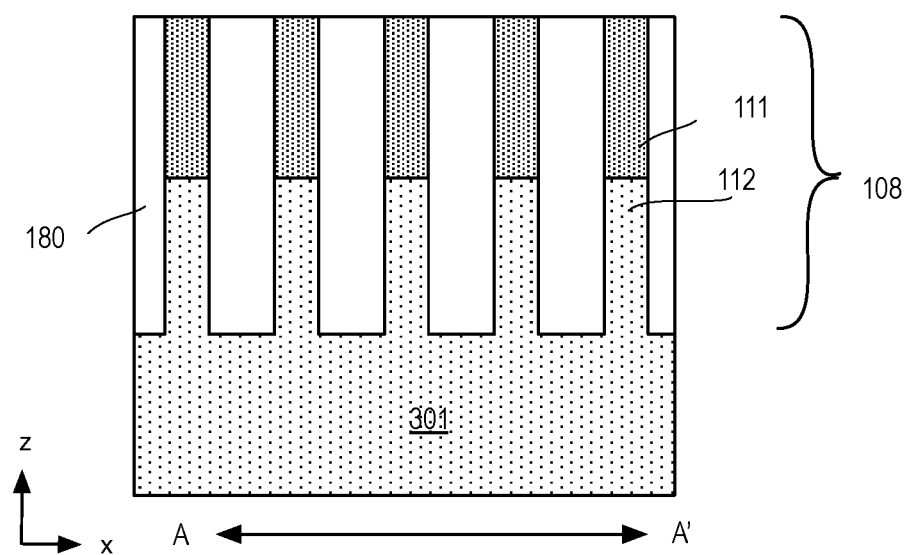
FIGS. 12A, 12B, 12C, 12D, 12E, 12F, 12G, and 12H are cross-sectional views of stacked finFETs evolving as selected operations in the methods illustrated in FIG. 11 are performed, in accordance with some embodiments.
Figure 12B:
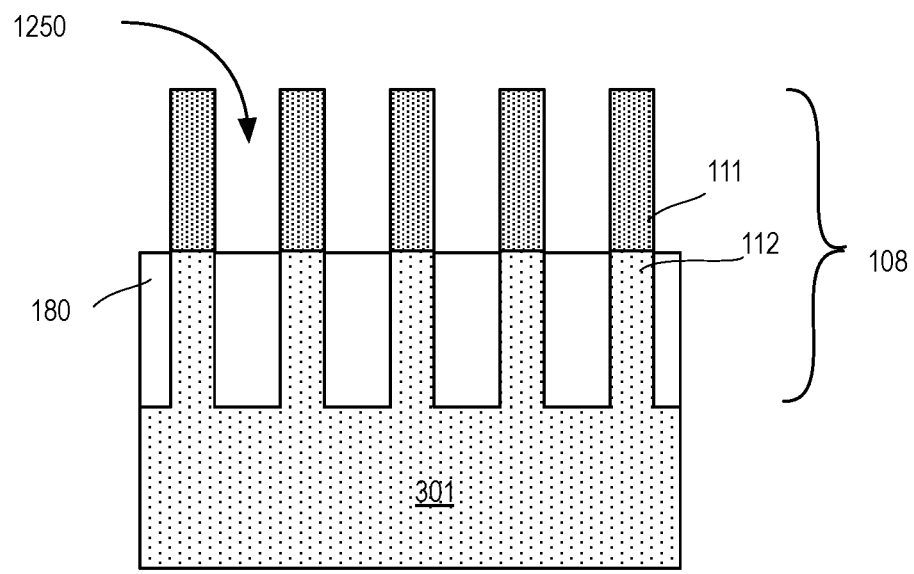

Returning to FIG. 11, methods 1101 continue at operation 1120 where a portion of the dielectric material is recessed selectively relative to the stacked semiconductor fins. Recessing of the dielectric material may be with a masked or unmask etch performed for a predetermined duration sufficient to expose at least one of the subfin regions. In some embodiments, the subfin region exposed has a composition suitable for an N-type FET. Any known isotropic or anisotropic etch process of the isolation dielectric that has favorable selectively may be employed at operation 1120. In the example shown in FIG. 12B, isolation recesses 1250 expose substantially all of one semiconductor layer within stacked semiconductor fins 108. Isolation recesses 1250 expose substantially all of subfin portion 111, but isolation recesses 1250 do not however expose subfin portion 112.

Returning to FIG. 11, methods 1101 continue at operation 1130 where a first dielectric suitable for introducing fixed charge of a first polarity is deposited over the sidewall of the stacked semiconductor fin exposed by recessing the isolation dielectric. In general, the first dielectric material contains fixed charges (i.e. charges which are not mobile), which could be either positive or negative charges depending on a bandgap of a dielectric material and on how the dielectric material was formed/processed. The concentration of the fixed charges in the first dielectric material is higher than that associated with unintentional fixed charges that may otherwise be present in such a material. For example, the concentration of the fixed charges in the first dielectric material may be $10^{12}$ per square centimeter, or higher. Positive fixed charges may arise when there are unoccupied electron states of donor type in the first dielectric layer, which are higher in energy than a conduction band of the adjacent subfin semiconductor. Likewise, negative fixed charges may arise when there are occupied electron states of acceptor type in the first dielectric layer, which are lower in energy than a valence band of the subfin semiconductor.

In an exemplary embodiment where the first semiconductor layer is suitable for an N-type FET, the first dielectric material is comprised of fixed negative (electron) charge. With the first dielectric material having negative fixed charges adjacent to a sidewall of a subfin portion of a first semiconductor layer suitable for a FET channel in which electrons are the majority charge carriers (i.e., N-type FET), mobile electrons which may be present in the subfin portion of the first semiconductor layer will be repelled by the negative fixed charges (e.g., through Coulomb forces), resulting in depletion of mobile electrons with the subfin portion of the first semiconductor layer (or an attraction of positively-charged hole-type carriers in the adjacent semiconductor region). In an alternative embodiment where the first semiconductor layer is suitable for a P-type FET, the first dielectric material is comprised of fixed positive (hole) charge. With the first dielectric material having positive fixed charges adjacent to a sidewall of a subfin portion of a first semiconductor layer suitable for a FET channel in which holes are the majority charge carriers (i.e. P-type FET), any mobile charge carriers present in the subfin portion of the first semiconductor layer, will be attracted or repelled by the positive fixed charges (e.g., through Coulomb forces), resulting in depletion of mobile holes/accumulation of mobile electrons within the subfin portion of the first semiconductor layer. There are therefore fewer, if any, mobile carriers present within the subfin portion that can transit into the second semiconductor layer where they may contribute to leakage current. As such the first dielectric layer may significantly reduce current leakage from a first FET fabricated within the first semiconductor layer of a stacked semiconductor fin to a second FET fabricated within a second semiconductor layer of a stacked semiconductor fin.

Figure 12C:
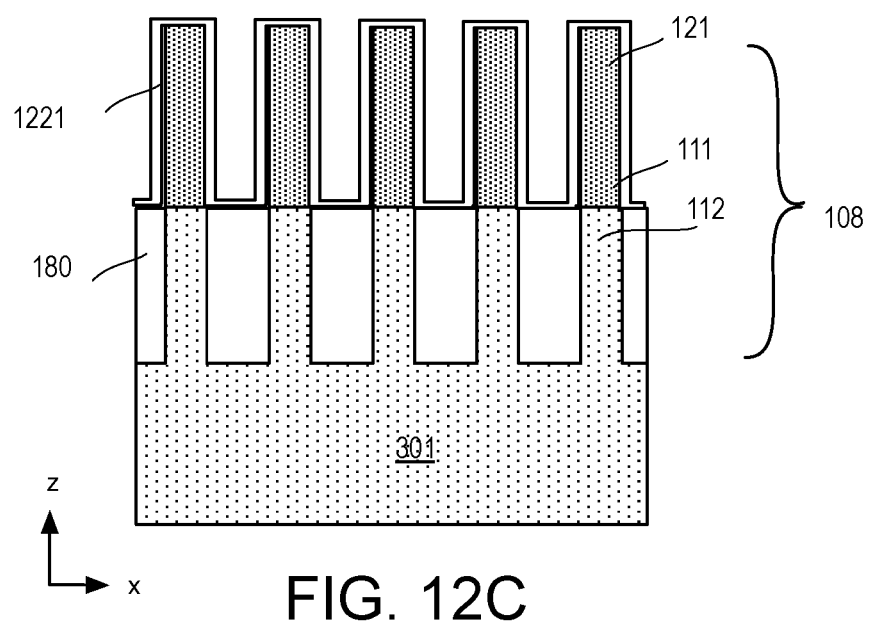
Figure 12D:
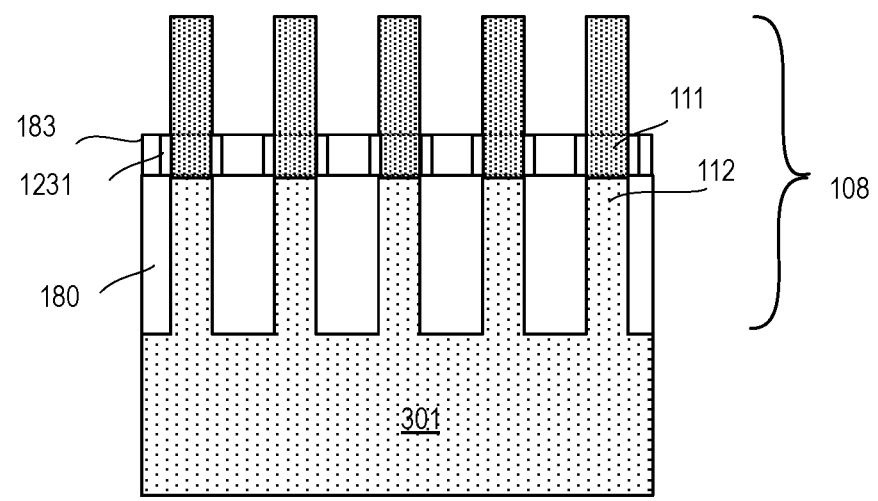
Figure 12E:
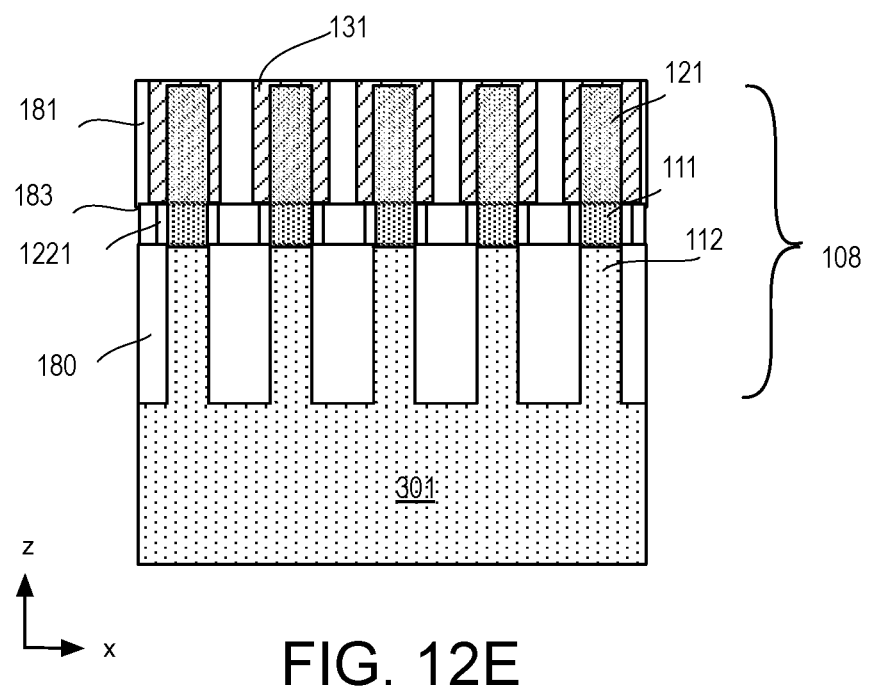
Figure 12F:
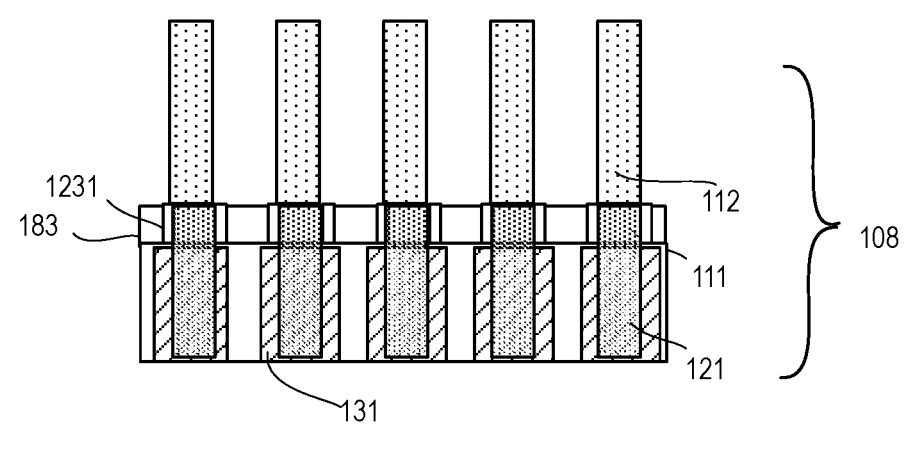

In the example shown in FIG. 12C, a fixed charge layer 1221 is deposited over exposed sidewalls of stacked semiconductor fin 108, and more specifically over at least subfin portion 111. Fixed charge layer 1221 may comprise one or more dielectric material layer, such as, but not limited to, $SiO_x$, $SiN_x$, $AlO_x$, $LaO_x$, $ZrO_x$, $TaO_x$, $GaO_x$, $GdO_x$, or $HfO_x$. All of $SiO_2$, $Si_3N_4$, $Al_2O_3$, $La_2O_3$, $ZrO_2$, $Ta_2O_5$, $Ga_2O_3$, and $Gd_2O_3$. These materials may have sufficiently large valence band offsets from various semiconductor materials (e.g., Si, SiGe, InGaAs) to be suitable for providing negative fixed charge. The stoichiometry of the fixed charge layer may very, and/or the suitability of various ones of the exemplary materials listed above may vary as a function of the polarity of the FET that is to be fabricated within the exposed portion of semiconductor fin. Fixed charge layer 1221 may be deposited to any thickness sufficient to achieve suitable electrical isolation. In some embodiments, fixed charge layer 1221 is at least 5 nm, and may be between 7 and 10 nm, for example, with greater thicknesses increasing the quantity of fixed charge and providing higher levels of carrier depletion within the semiconductor fin.

Fixed charge layer 1221 may then be confined to be adjacent to a sidewall of subfin portion 111. In some embodiments, an isolation dielectric may be deposited over fixed charge layer 1221. If desired, fixed charge layer 1221 may be anisotropically etched to form a fixed charge spacer 1231 prior to depositing dielectric material 183, which may fill in the space between adjacent fins. Dielectric material 183 may also be planarized with a top surface of stacked semiconductor fins 108. Once planarized, any recess etch process (e.g., isotropic or anisotropic, wet or dry) may be employed to recess dielectric material 183 to a predetermined level targeting the interface between channel portion 121 and subfin portion 111. Any exposed portion of the fixed charge layer that survives the recess etch of the dielectric material 183 may then be removed from the semiconductor fin. In the example shown in FIG. 12D, an dielectric material 183 has been recessed to remain only adjacent to subfin portion 111. Dielectric material 183 then serves as a mask protecting a portion of fixed charge spacer 1231 adjacent to only subfin portion 111. Portions of fixed charge spacer 1231 unprotected by dielectric material 183 are removed (etched).

Returning to FIG. 11, methods 1101 continue at operation 1140 where another dielectric material is deposited over the exposed portions of the stacked semiconductor fins, for example in preparation for the fabrication of a first gate stack. In the example shown in FIG. 12E, dielectric material 181 has been deposited over fin portion 121, filling in the space between adjacent fins. Dielectric material 181 is further planarized with a top surface of stacked semiconductor fins 108. At this point in the fabrication process, gate electrodes 131 may be fabricated to couple with channel portion 121, for example according to any suitable techniques. Other terminals of a first finFET may also be fabricated according to any suitable techniques, and one or more levels of interconnect metallization may couple multiple first finFETs together into an integrated circuit.

Returning to FIG. 11, methods 1101 continue at operation 1150 where a bottom of the stacked semiconductor fin is revealed, for example according to any of the techniques described elsewhere herein. At operation 1160, dielectric material surrounding the semiconductor fin is recessed, for example with any etch process suitable for the dielectric composition that has sufficient selectivity to the particular semiconductor composition. In the example shown in FIG. 12F, dielectric material 180 has been completely removed, exposing dielectric material 183 and the portion of stacked semiconductor fins 108 that extends beyond dielectric material 183.

Returning to FIG. 11, methods 1101 continue at operation 1170 where a second layer of dielectric material having suitable fixed charge is deposited over a sidewall of the subfin portion. The fixed charge is advantageously hole charge (+) for some exemplary CMOS embodiments where the portion of the stacked semiconductor fin exposed at operation 1160 is suitable for a FET of polarity complementary polarity (e.g., PMOS). As noted above, the positive fixed charge may prevent majority carriers of a PMOS FET from transiting through subfin portion. As such, the (e.g., positive) fixed charge introduced at operation 1170 may complement the (e.g., negative) fixed charge introduced at operation 1130 to reduce components of leakage current between the top and bottom ends of a CMOS stacked finFET structure.

Figure 12G:
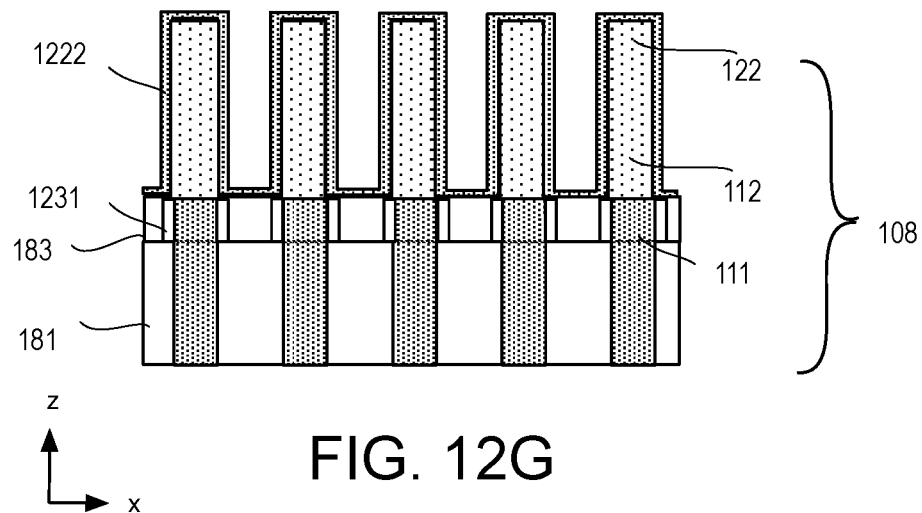

In the example shown in FIG. 12G, a fixed charge layer 1222 is deposited over exposed sidewalls of stacked semiconductor fin 108, and more specifically over at least subfin portion 112. Fixed charge layer 1222 may comprise one or more dielectric material layer, such as, but not limited to, $SiO_x$, $SiN_x$, $AlO_x$, $LaO_x$, $ZrO_x$, $TaO_x$, $GaO_x$, $GdO_x$, or $HfO_x$. All of $SiO_2$, $Si_3N_4$, $Al_2O_3$, $La_2O_3$, $ZrO_2$, $Ta_2O_5$, $Ga_2O_3$, and $Gd_2O_3$. Many of these materials have a sufficiently large conduction band offset from various semiconductor materials (e.g., Si, SiGe, InGaAs) that they are suitable for providing positive fixed charge. The stoichiometry of the fixed charge layer may very, and/or the suitability of various ones of the exemplary materials listed above may however vary as a function of the polarity of the FET that is to be fabricated within the exposed portion of semiconductor fin. For example, tantalum pentoxide may be more suitable than gallium oxide for embodiments where hole majority carriers are to transit channel portion 122 during operation of a P-type FET. Fixed charge layer 1222 may be deposited to any thickness sufficient to achieve suitable electrical isolation. In some embodiments, fixed charge layer 1222 is at least 5 nm, and may be between 7 and 10 nm, for example, with greater thicknesses increasing the quantity of fixed charge and providing higher levels of carrier depletion within the semiconductor fin.

Fixed charge layer 1222 may then be confined to be adjacent to a sidewall of subfin portion 112 in a manner similar to fixed charge layer 1221. In some embodiments, another dielectric material may be deposited over fixed charge layer 1222, filling in the space between adjacent fins. If desired, fixed charge layer 1222 may be anisotropically etched to form a fixed charge spacer 1232 prior to depositing dielectric material 183. Dielectric material 183 may also be planarized with a top surface of stacked semiconductor fins 108. Once planarized, any recess etch process (e.g., isotropic or anisotropic, wet or dry) may be employed to recess dielectric material 183 to a predetermined level targeting the interface between channel portion 122 and subfin portion 112. Any exposed portion of the fixed charge layer that survives the recess etch may then be removed from the semiconductor fin. Methods 1101 continue at operation 1180 where another dielectric material is deposited over the exposed portions of the stacked semiconductor fins, for example in preparation for the fabrication of a second gate stack. Methods 1101 (FIG. 11) then complete at operation 260 where transistor terminals may be fabricated and interconnected into an IC.

Figure 12H:
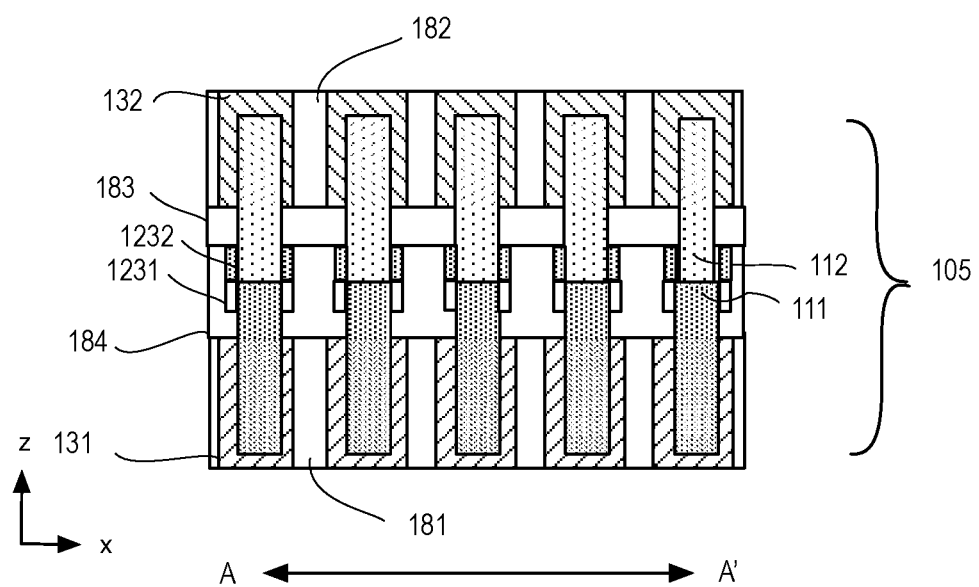

FIG. 12H illustrates one example of a stacked CMOS finFET structure having features described above in the context of stacked CMOS finFET structure 101 and further including fixed charge spacers suitable for electrical isolation. In FIG. 12H, an dielectric material 184 has been recessed to remain only adjacent to subfin portion 111. Dielectric material 184 then serves as a mask protecting a fixed charge spacer 1232 adjacent to only subfin portion 112. Portions of fixed charge spacer 1232 unprotected by isolation dielectric 184 have been removed (etched). Dielectric material 182 has been deposited over channel portion 122, filling in the space between adjacent fins. Dielectric material 182 may be planarized with a top surface of stacked semiconductor fins 108, for example. Fixed charge spacers 1231 and 1232 may be located adjacent to portions of stacked semiconductor fin 108 that suffer from high defect density. For example, fixed charge spacers 1231 and 1232 may be incorporated into vertically stacked CMOS finFET structure 101 (e.g., FIG. 1C) as one exemplary means of reducing leakage current across the vertical height of the stacked semiconductor fins.

Figure 13:
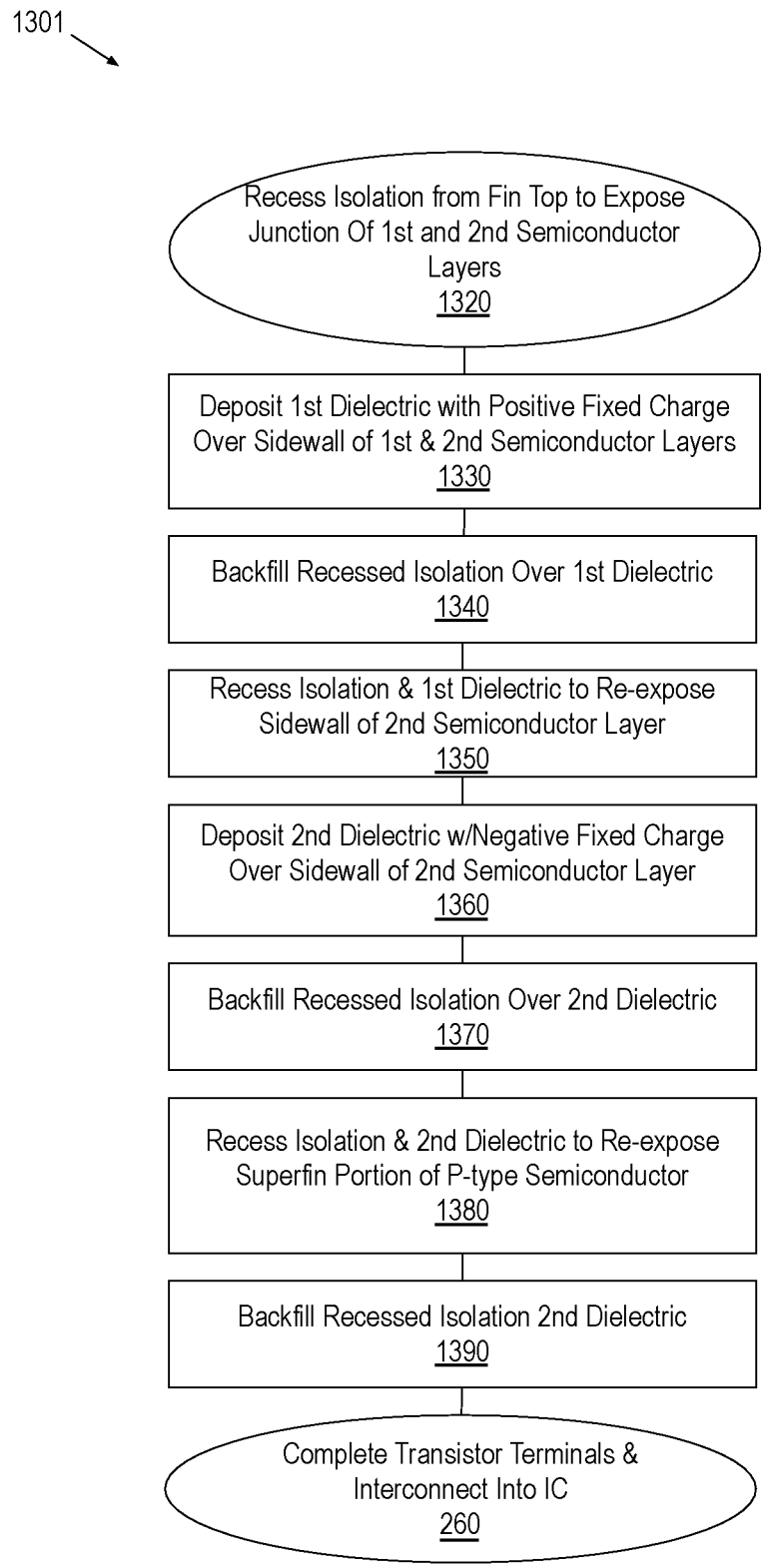
FIG. 13 is a flow diagram illustrating methods of electrically isolating stacked finFETs, in accordance with some embodiments.

FIG. 13 is a flow diagram illustrating methods 1301 for electrically isolating stacked finFETs, in accordance with some alternative embodiments. Methods 1301 may be considered a specific implementation of methods 1001. Methods 1301 illustrate structural features that may improve isolation between stacked CMOS finFETs and can be introduced with exclusively front side processing. Notably, the isolation structures fabricated by methods 1301 can be substantially the same as those fabricated by methods 1201. FIG. 14A-14J are cross-sectional views of stacked finFETs evolving as selected operations in the methods illustrated in FIG. 13 are performed in accordance with some embodiments to arrive at stacked finFET structures having one or more of the features described above in the context of stacked finFET structure 10 and further including exemplary isolation structures.

Referring first to FIG. 13, methods 1301 begin at operation 1005 where a workpiece including stacked fins having at least first and second semiconductor layers is received. In some embodiments, the workpiece received includes a stacked semiconductor fin, which further includes a first semiconductor layer suitable for an NMOS FET and a second semiconductor layer suitable for a PMOS FET. In some exemplary embodiments, the stacked semiconductor fin is surrounded by, or embedded within, a dielectric material (e.g., STI material). In the example shown in FIG. 14A, stacked semiconductor fins 108 including subfin portions 111 and 112 extend from substrate 301. Dielectric material 180 is located within the spaces between adjacent stacked semiconductor fins 108. Substrate 301, subfin portions 111 and 112, and dielectric material 180 may have any of the compositions previously described.

Returning to FIG. 13, methods 1301 continue at operation 1320 where a portion of the dielectric material is recessed selectively relative to the stacked semiconductor fins. The recessing may be with a masked or unmask etch performed for a predetermined duration sufficient to expose two subfin portions. In some embodiments, one of the subfin portions exposed is a semiconductor material suitable for an N-type FET while another of the subfin portions exposed is a semiconductor material suitable for an P-type FET. Any known isotropic or anisotropic etch process that has favorable selectively may be employed at operation 1320. In the example shown in FIG. 14B, recesses 1450 expose substantially all of one semiconductor layer and only a subfin portion of a second semiconductor layer within stacked semiconductor fins 109. While recesses 1450 expose substantially all of subfin portion 112, recesses 1450 do not however expose channel portion 122.

Returning to FIG. 13, methods 1301 continue at operation 1330 where a first layer of dielectric material suitable for introducing fixed charge of a first polarity is deposited over the sidewall of the stacked semiconductor fin exposed by recessing the isolation dielectric. In general, the first layer of dielectric material contains fixed charges (i.e. charges which are not mobile), which could be either positive or negative charges depending on a bandgap of a dielectric material and on how the dielectric material was formed/processed. The concentration of the fixed charges in the first layer of dielectric material is higher than that associated with unintentional fixed charges that may otherwise be present in such a material. For example, the concentration of the fixed charges in the first layer of dielectric material may be $1 \times 10^{12}$ per square centimeter, or higher.

In an exemplary embodiment, the first layer of dielectric material deposited at operation 1330 introduces fixed positive (hole) charge. In the example shown in FIG. 14C, fixed charge layer 1222 is deposited over exposed sidewalls of stacked semiconductor fin 108, and more specifically over at least subfin portion 112. Fixed charge layer 1222 may comprise one or more dielectric material layer, such as, but not limited to, any of those described above as being suitable for providing positive fixed charge. The stoichiometry of fixed charge layer 1222 may very, and/or the suitability of various ones of the exemplary materials listed above may vary as a function of the polarity of the FET that is to be fabricated within the exposed portion of semiconductor fin. Fixed charge layer 1222 may again be deposited to any thickness sufficient to achieve suitable electrical isolation. In some embodiments, fixed charge layer 1222 is at least 5 nm, and may be between 7 and 10 nm, for example, with greater thicknesses increasing the quantity of fixed charge and providing higher levels of carrier depletion within the semiconductor fin.

Fixed charge layer 1222 may then be confined to be adjacent to a sidewall of subfin portion 112. For example, methods 1301 (FIG. 13) continue with operations 1340 and 1350, where a surround mask material is first recessed and any of the fixed charge layer unprotected by the mask material is removed. In the example further shown in FIG. 14D, dielectric material 183 may be deposited over fixed charge layer 1222. If desired, fixed charge layer 1222 may be anisotropically etched to form a fixed charge spacer 1231 prior to depositing dielectric material 183, which may fill in the space between adjacent fins. Dielectric material 183 is planarized with a top surface of stacked semiconductor fins 108. Once planarized, any recess etch process (e.g., isotropic or anisotropic, wet or dry) may be employed to recess dielectric material 183 to a predetermined level targeting the interface between subfin portion 111 and subfin portion 112. Any exposed portion of the fixed charge layer that survives the recess etch may then be removed from the semiconductor fin. In the example shown in FIG. 14E, dielectric material 183 has been recessed to remain only adjacent to subfin portion 112. Dielectric material 183 then serves as a mask protecting a portion of fixed charge spacer 1232 adjacent to only subfin portion 112. Portions of fixed charge spacer 1232 unprotected by dielectric material 183 are removed (etched).

Returning to FIG. 13, methods 1301 continue at operation 1360 where a second dielectric layer having suitable fixed charge is deposited over a sidewall of the subfin portion. Any conformal or non-conformal deposition process known to be suitable for the particular dielectric material may be employed at operation 1360. The fixed charge is advantageously electron charge (−) for some exemplary CMOS embodiments where the portion of the stacked semiconductor fin exposed at operation 1360 is suitable for a FET of polarity complementary polarity (e.g., NMOS). As noted above, the negative fixed charge may prevent majority carriers of an NMOS FET from transiting through the subfin portion. As such, the (e.g., negative) fixed charge introduced at operation 1360 may complement the (e.g., positive) fixed charge introduced at operation 1330 to reduce components of leakage current between the top and bottom ends of a stacked CMOS finFET structure. In the exemplary embodiment shown in FIG. 14F, fixed charge layer 1221 has been deposited over exposed semiconductor portions of stacked semiconductor fins.

Fixed charge layer 1221 may then be confined to be adjacent to a sidewall of subfin portion 111 in a manner similar to fixed charge layer 1222. For example, methods 1301 continue at operation 1370 where a dielectric material is deposited over the fixed charge layer. This dielectric material may fill in the space between adjacent fins. This dielectric material may also be planarized with a top surface of stacked semiconductor fins. Once planarized, any recess etch process (e.g., isotropic or anisotropic, wet or dry) may be performed at operation 1380 to recess the dielectric material to a predetermined level. In the example shown in FIG. 14G, dielectric material 184 is recessed to a target that defines an interface of channel portion 121 to subfin portion 111. If desired, fixed charge layer 1221 may be anisotropically etched to form a fixed charge spacer 1231 prior to depositing dielectric material 184. Any exposed portion of the fixed charge layer that survives the recess etch may then be removed from the semiconductor fin. In the example shown in FIG. 14H, dielectric material 184 has been recessed to remain only adjacent to subfin portion 111. Dielectric material 184 then serves as a mask protecting a fixed charge spacer 1231 adjacent to only subfin portion 111. Portions of fixed charge spacer 1231 unprotected by dielectric material 184 are removed (etched).

Figure 14A:
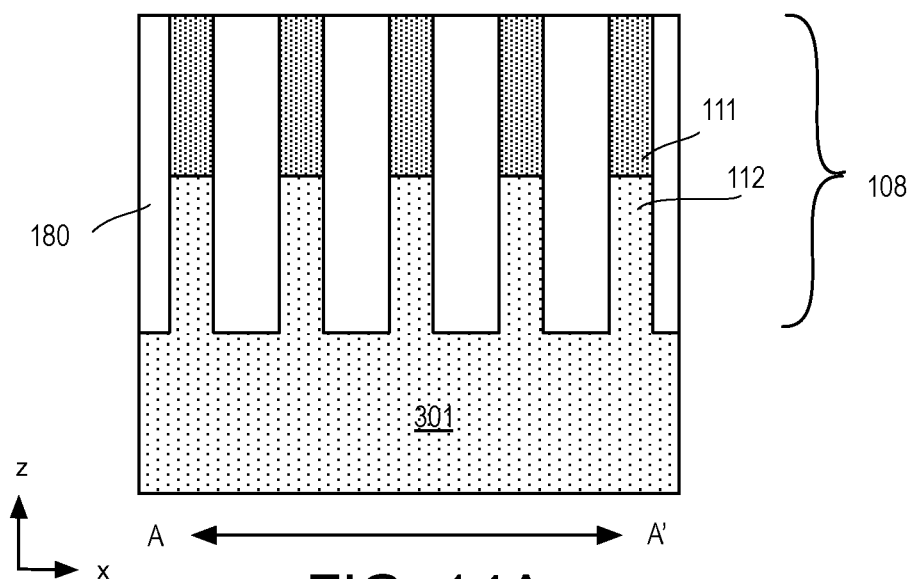
FIGS. 14A, 14B, 14C, 14D, 14E, 14F, 14G, 14H, and 14I are cross-sectional views of stacked finFETs evolving as selected operations in the methods illustrated in FIG. 13 are performed, in accordance with some embodiments.
Figure 14B:
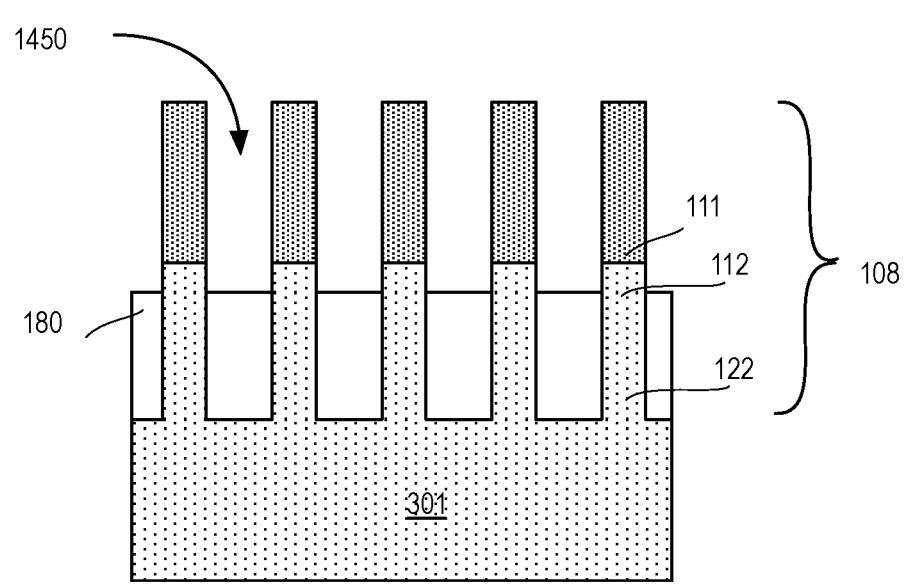
Figure 14C:
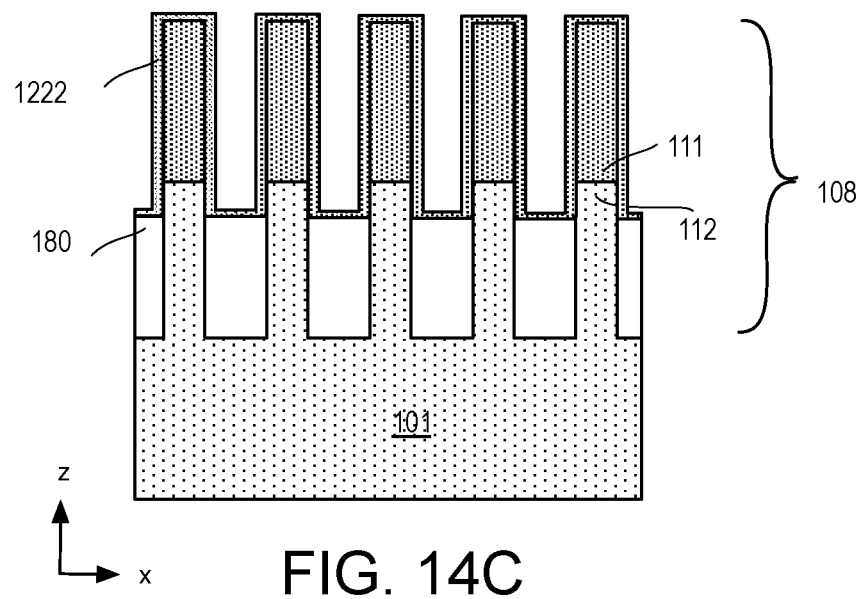
Figure 14D:
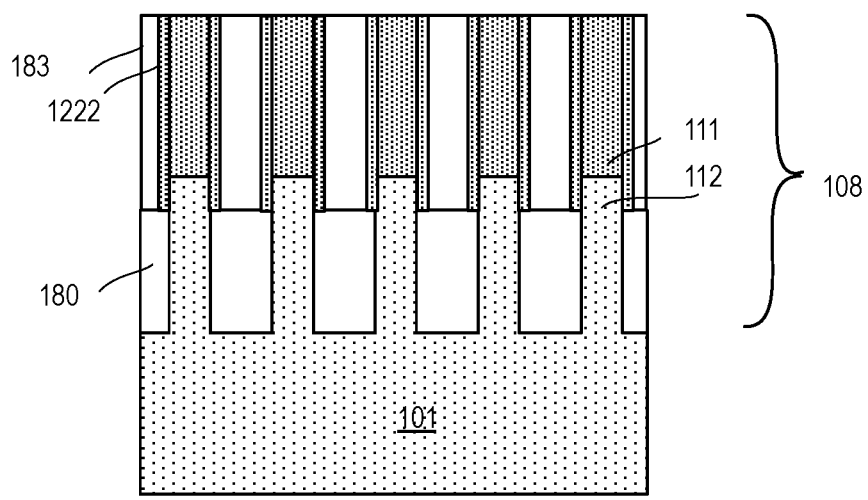
Figure 14E:
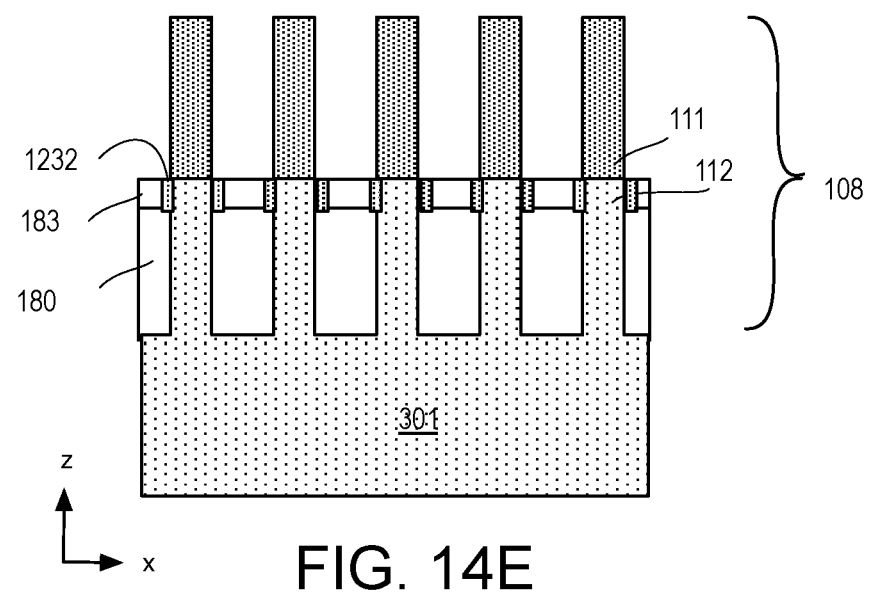
Figure 14F:
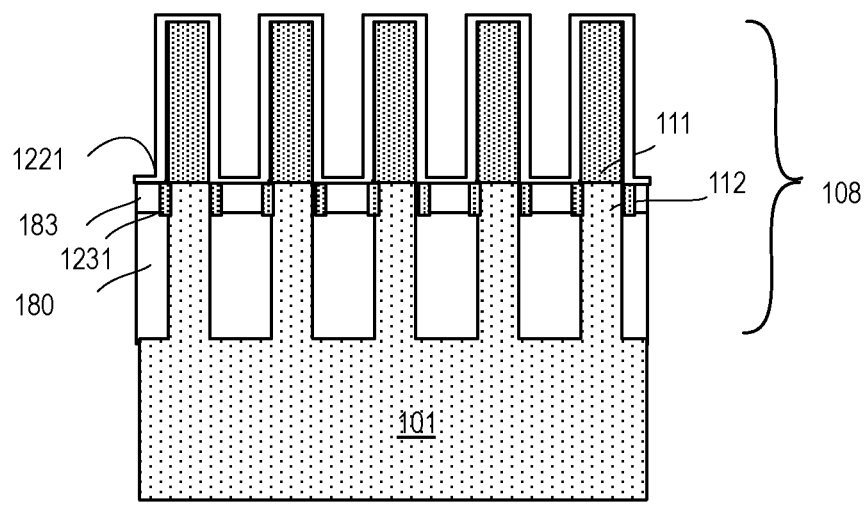
Figure 14G:
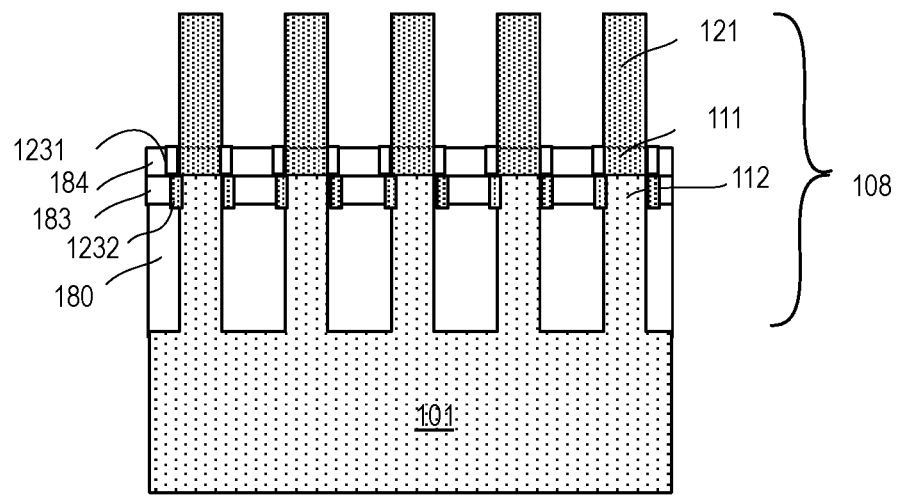
Figure 14H:
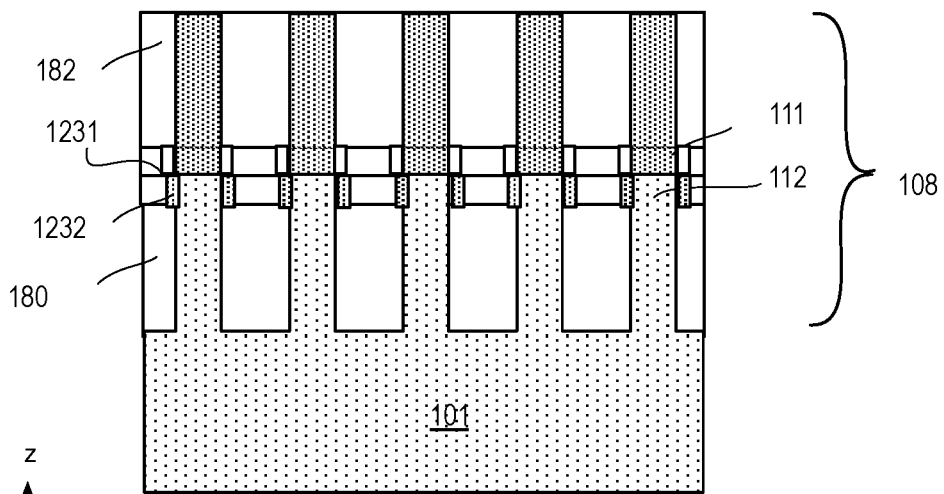
Figure 14I:
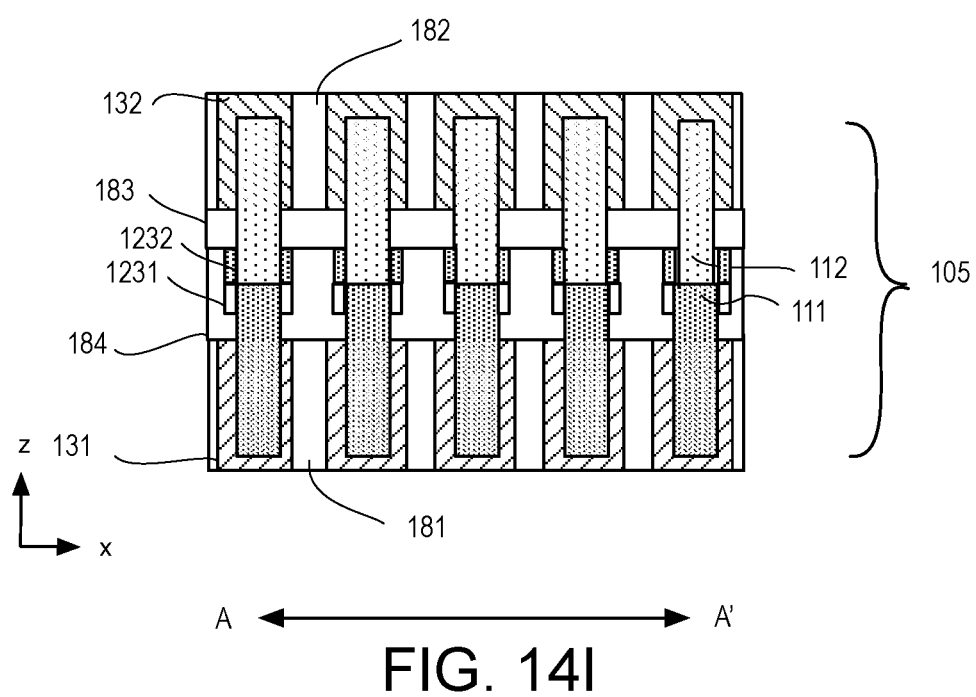
Figure 15:
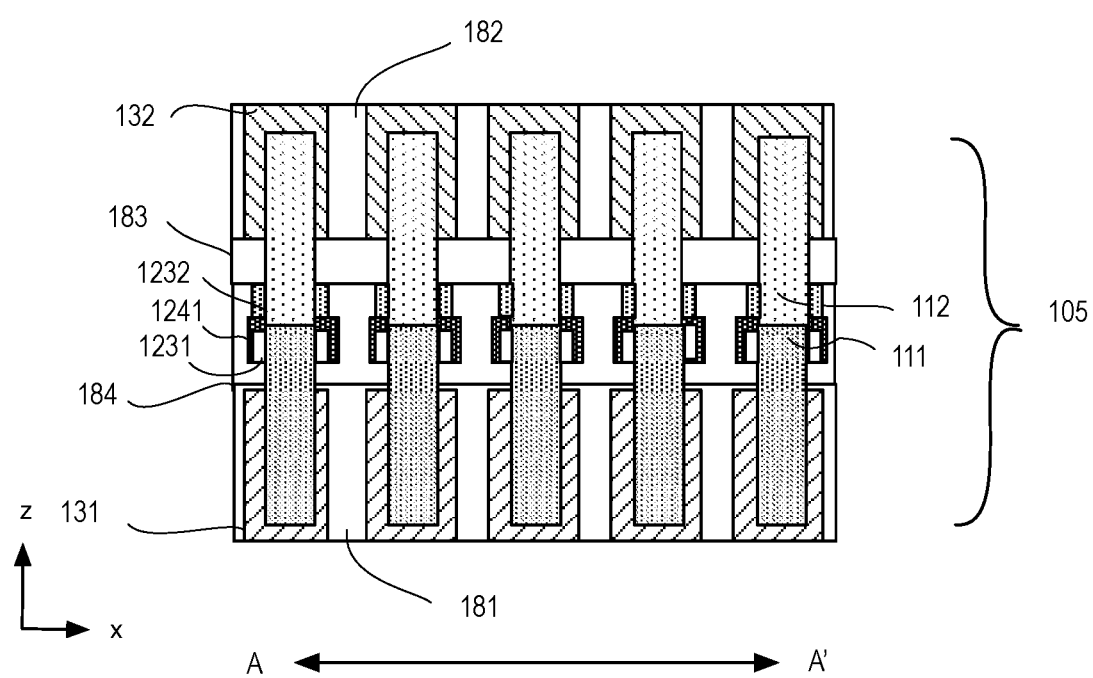
FIG. 15 is a cross-sectional illustration of transverse widths of vertically stacked CMOS finFETs showing sub-fin electrical isolation structures, in accordance with some embodiments.

Returning to FIG. 13, methods 1301 continue at operation 1390 where another dielectric material is deposited over the exposed portions of the stacked semiconductor fins, for example in preparation for the fabrication of a second gate stack. Methods 1301 then complete at operation 260 where transistor terminals may be fabricated and interconnected into an IC. In the example shown in FIG. 14H, dielectric material 182 has been deposited over channel portion 122, filling in the space between adjacent fins. Dielectric material 182 may be planarized with a top surface of stacked semiconductor fins 108, for example. FIG. 14I illustrates one example of a stacked CMOS finFET structure having features described above in the context of stacked CMOS finFET structure 101 (FIGS. 1A-1B), and further including fixed charge spacers suitable for electrical isolation In some further embodiments, two stacked fixed charge materials are separated by an intervening barrier layer. The barrier layer may serve to decouple the two fixed charge materials, potentially mitigating undesirable interactions. Such a barrier layer may, for example, help to maintain chemical integrity of the compounds employed as the fixed charge layers. Such a barrier may, for example, limit interdiffusion of the fixed charge layers and facilitate a more abrupt transition between the subfin portions. FIG. 15 further illustrates one example of a stacked CMOS finFET structure having features described above in the context of stacked CMOS finFET structure 101 and further including fixed charge spacers separated by an intervening barrier layer 1241. The structure shown in FIG. 15 is the same as that of FIGS. 12H and 14I except for the addition of barrier layer 1241. Barrier layer 1241 may be any material known to be a suitable diffusion barrier, such as, but not limited to, a dielectric comprising carbon (e.g., SiC), a metal comprising carbon (e.g., TaC), a dielectric comprising oxygen (e.g., SiO, SiON), a metal layer (e.g., including at least Ti, Ta, W), or a metal nitride (including at least TiN, TaN, etc.). Barrier layer 1241 may be formed along with the fixed-charge spacers 1231, 1232 in the practice of either methods 1101 or methods 1301, for example.

Fabrication of barrier layer 1241, as well as fixed-charge spacers 1231 and 1232, may also be integrated into the formation of a stacked semiconductor fin. For example, fixed-charge spacers 1231, 1232 and/or barrier layer 1241 may be introduced prior to epitaxial growth of one or more semiconductor fin portions. In the structure illustrated in FIG. 7C for example, recesses 750 may be lined with both barrier layer 1241 and a fixed-charge material layer. The fixed-charge material may then be anisotropically etched into a first spacer and the barrier layer 1241 then etched to expose the crystalline seeding surface in preparation for epitaxial growth of fin semiconductor.

The fabrication techniques described above for the fixed-charge isolation structures may also be applied for alternative isolation embodiments employing solid-state isolation well doping. For such embodiments, the resulting isolation structures may be the same as described above except the sidewall spacers adjacent to the subfin portions are not sources of fixed charge, but instead sources of impurities that are to diffuse into the adjacent subfin portions of the stacked semiconductor fins. Once doped and activated, the subfin portions of a stacked semiconductor may function as deep counter-doped "wells" providing isolation between channel portions of the fins. For dielectric materials serving as first and second impurity source films, the dielectric materials surrounding the subfin portions are doped with an electrically active impurity that is desired within the lower sub-fin region, such as, but not limited to, phosphorus, arsenic, antimony (n-type dopants of silicon) and boron, indium, or gallium (p-type dopants of silicon). As with the complementary types of fixed charge, complementary impurity doping may be implemented with two dielectric layers, each of which is confined to be adjacent to only one subfin portion, for example substantially as described above. Hence, a first impurity source material may be adjacent to a sidewall of first subfin portion while a second impurity source material is adjacent to a sidewall of a second subfin portion. The first impurity source material is doped with a first impurity that imparts a first conductivity type to the first subfin portion, and the second impurity source material is doped with a second impurity that imparts a second conductivity type to the second subfin portion. In some embodiments, a boron-doped silicate glass (BSG) is deposited adjacent to a first subfin portion while phosphorus-doped silicate glass (PSG) is deposited adjacent to a second subfin portion. Other options include doped nitrides and doped metal oxides.

In one exemplary embodiment, a first subfin portion separating an P-type FET from second subfin portion is impurity doped N-type with an impurity, such as phosphorus having an impurity concentration of between $5\times10^{17}$ cm$^{-3}$ and $1\times10^{19}$ cm$^{-3}$, for example. The adjacent impurity source material should have a sufficiently high as-deposited impurity concentration and film thickness to provide the desired impurity concentration within the first subfin portion. As one example, the impurity source material is a 1-5 nm thick PSG film doped with phosphorus to $1\times10^{20}$-$10^{21}$ cm$^{-3}$. The second subfin portion separating the first subfin portion from an N-type FET is impurity doped P-type with an impurity, such as boron, to an impurity concentration of between $5\times10^{17}$ cm$^{-3}$ and $1\times10^{19}$ cm$^{-3}$, for example. The adjacent impurity source material should have a sufficiently high as-deposited impurity concentration and film thickness to provide the desired impurity concentration within the adjacent subfin portion. As one example, the impurity source film material may be a 1-5 nm thick BSG film doped with boron to $1\times10^{20}$-$10^{21}$ cm$^3$.

In some further embodiments, two stacked dielectric materials doped with acceptor and donor impurities are separated by an intervening barrier layer. The barrier layer may be substantially as described above in the context of fixed-charge layers to decouple two impurity-dopant source materials, potentially mitigating undesirable interactions. Such a barrier layer may, for example, help to maintain chemical integrity of the compounds employed as the impurity-dopant source materials. Such a barrier may, for example, limit interdiffusion of the impurity dopants and facilitate a more abrupt transition between the subfin portions.

Figure 16:
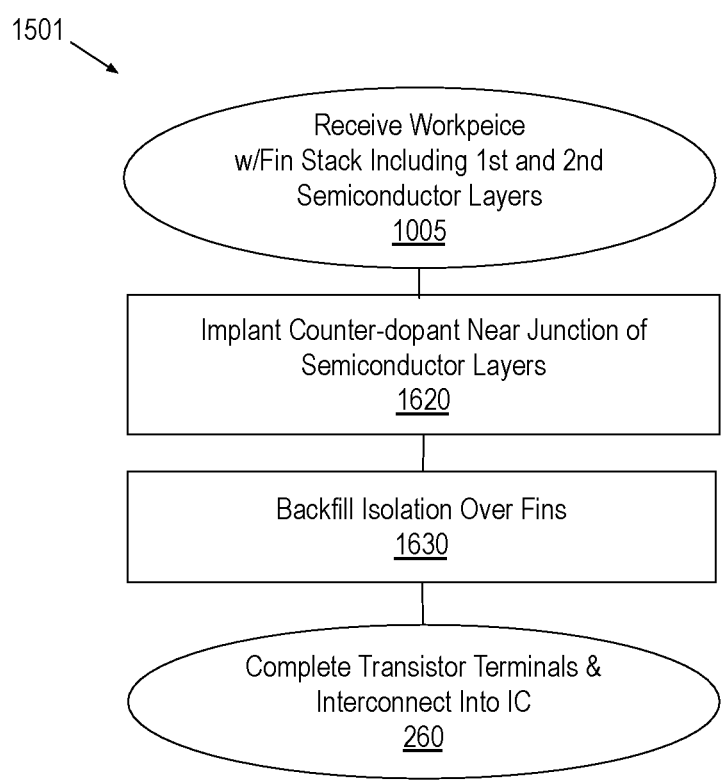
FIG. 16 is a flow diagram illustrating methods of electrically isolating stacked finFETs, in accordance with some embodiments.
Figure 17A:
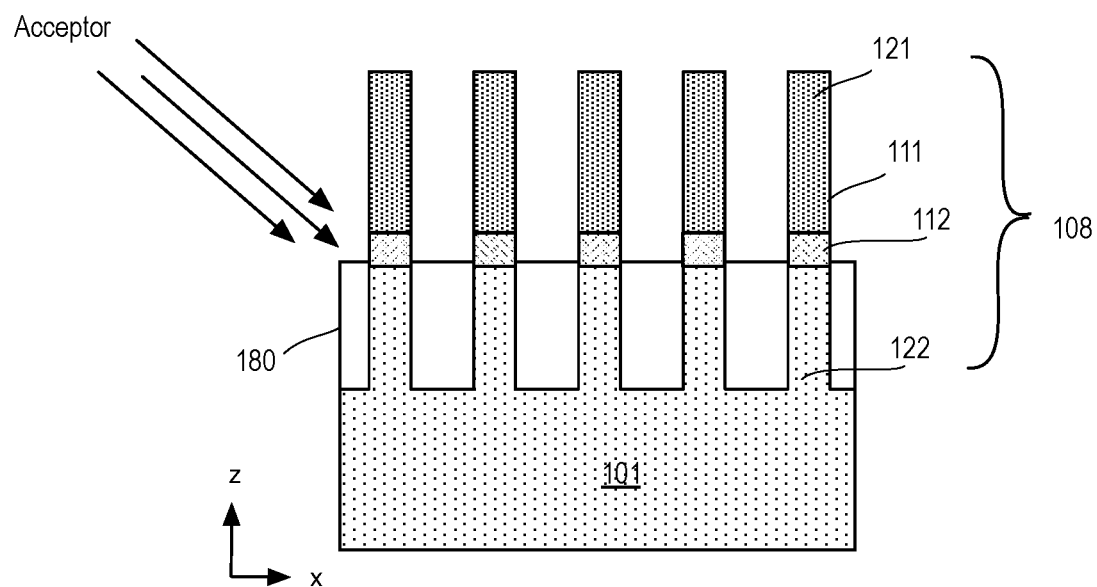
FIGS. 17A, 17B, and 17C are cross-sectional views of stacked finFETs evolving as selected operations in the methods illustrated in FIG. 16 are performed, in accordance with some embodiments.
Figure 17B:
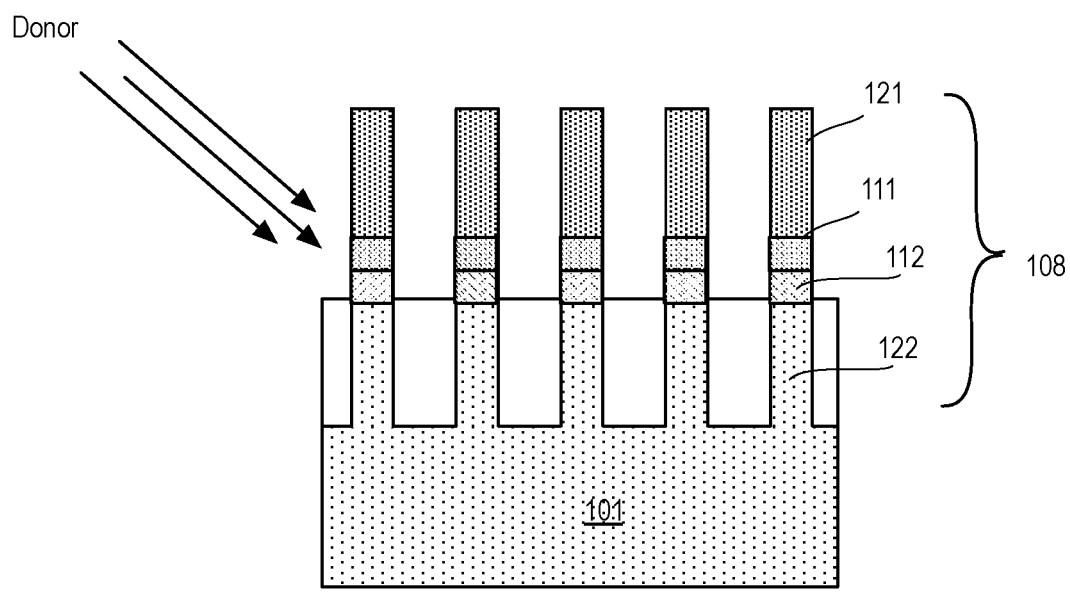
Figure 17C:
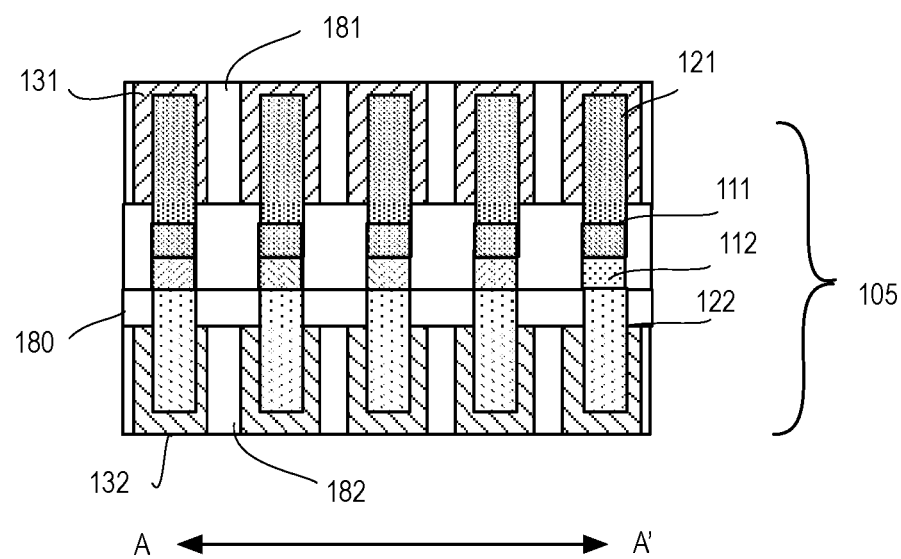

As noted above, ion implantation may also be employed to provide isolation between two stacked finFETs. Ion implantation may be performed from the front-side of the wafer, the back-side of the wafer, or from both sides. Ion implantation may be performed during what would typically be retro-well or threshold voltage adjust implantation, following fin recess, or prior to isolation dielectric deposition or any combination thereof. FIG. 16 is a flow diagram illustrating methods 1601 for electrically isolating stacked finFETs, in accordance with some embodiments employing ion implantation. FIG. 17A-17C, are cross-sectional views of stacked finFETs evolving as selected operations in the methods 1601 are performed, in accordance with some exemplary embodiments.

Referring first to FIG. 16, methods 1601 begin with receiving a stacked semiconductor fin with at least a first and second semiconductor layer at operation 1005, for example substantially as described above. At operation 1620 first impurity ions are implanted on a first side of the junction between the first and second semiconductor layers. At operation 1630, second impurity ions are implanted on a second side of the junction between the first and second semiconductor layers. The transistor terminals are then completed and interconnected in to an IC at operation 260.

In the example shown in FIG. 17A, first impurities are implanted into free standing fins, and more specifically into subfin portion 112. The type of impurity implanted into subfin portion 112 depends on the polarity of the device to be formed in channel portion 122. For example, where an N-type FET is to be formed channel portion 122 the impurity implanted into subfin portion 112 may be any acceptor species suitable for rendering subfin portion 112 P-type. In one such embodiment where subfin portion 112 is a group IV semiconductor, arsenic or boron is implanted. As further shown in FIG. 17B, second impurities are implanted into free standing fins, and more specifically into subfin portion 111. The type of impurity implanted into subfin portion 111 depends on the polarity of the device to be formed in channel portion 121. For example, where a P-type FET is to be formed channel portion 121 the impurity implanted into subfin portion 111 may be any suitable for rendering subfin portion 112 N-type. In one such embodiment where subfin portion 111 is a group IV semiconductor, phosphorous is implanted. Following implantation, an activation anneal may be performed, for example according to any techniques known to be suitable for doping a semiconductor fin. FIG. 17C illustrates one example of a stacked CMOS finFET structure having features described above in the context of stacked CMOS finFET structure 101 (FIGS. 1A-1B) and further highlighting impurity counter doping for electrical isolation within the transistor stack.

In an alternative to methods 1601, both subfin portions may be implanted through a dielectric material that is flush with the top of the fins. The implant range of one species would then be targeted to be deeper than that of the second species. Any one of these isolation techniques may be employed to form electrical isolation structures in a stacked CMOS finFET structure in accordance with embodiments herein.

Figure 18:
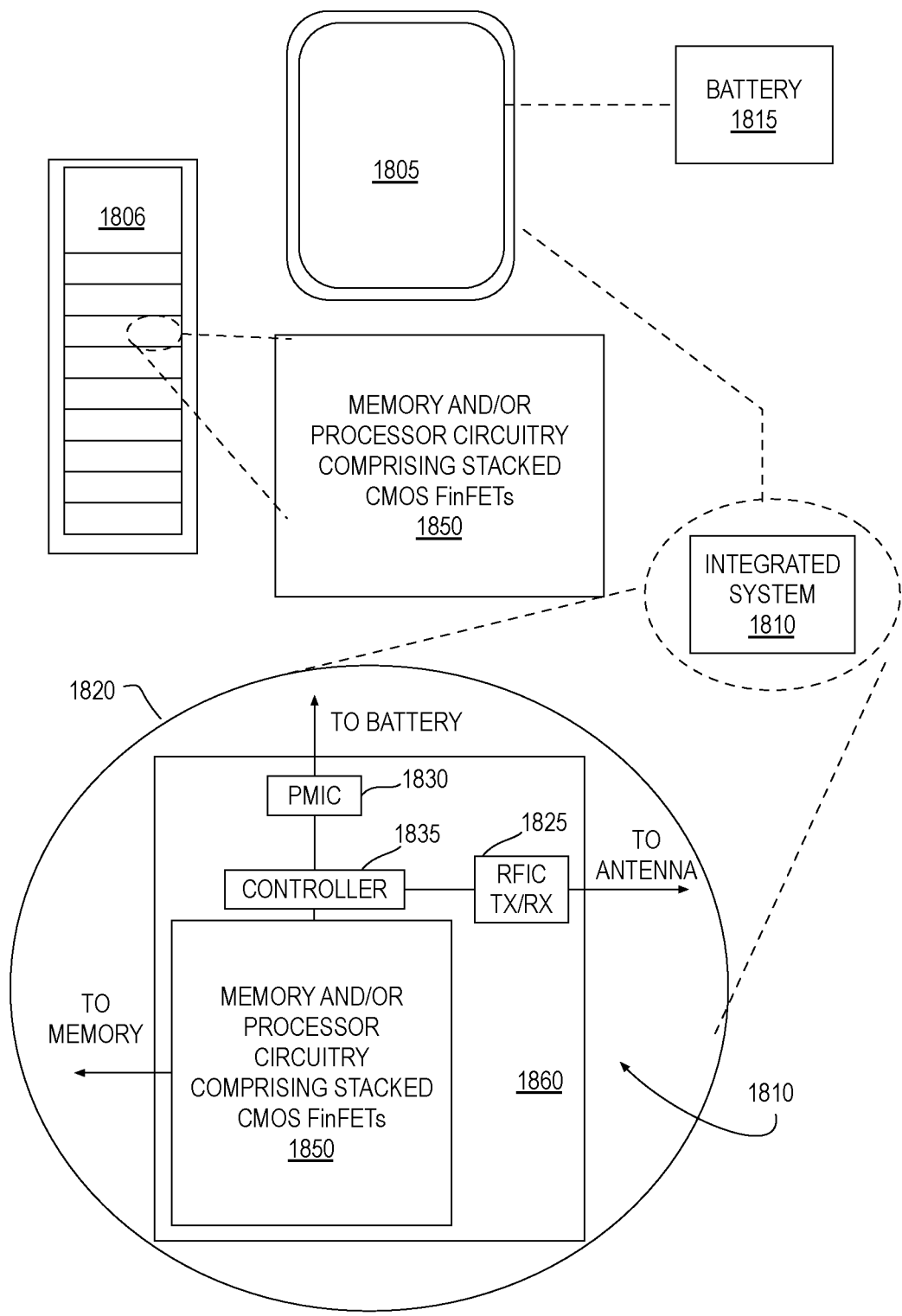
FIG. 18 illustrates a mobile computing platform and a data server machine employing an IC having a stacked CMOS finFET, in accordance with embodiments.

FIG. 18 illustrates a system 1800 in which a mobile computing platform 1805 and/or a data server machine 1806 employs an circuitry including at least one stacked CMOS finFET, in accordance with some embodiments. The server machine 1806 may be any commercial server, for example including any number of high-performance computing platforms disposed within a rack and networked together for electronic data processing, which in the exemplary embodiment includes circuitry 1850. The mobile computing platform 1805 may be any portable device configured for each of electronic data display, electronic data processing, wireless electronic data transmission, or the like. For example, the mobile computing platform 1805 may be any of a tablet, a smart phone, laptop computer, etc., and may include a display screen (e.g., a capacitive, inductive, resistive, or optical touchscreen), a chip-level or package-level integrated system 1810, and a battery 1815.

Whether disposed within the integrated system 1810 illustrated in the expanded view 1820, or as a stand-alone packaged chip within the server machine 1806, the a IC includes at least one III-N heterostructure diode, for example as describe elsewhere herein. The circuitry 1850 may be further affixed to a board, a substrate, or an interposer 1860 along with a power management integrated circuit (PMIC). Functionally, PMIC 1830 may perform battery power regulation, DC-to-DC conversion, etc., and so has an input coupled to battery 1815 and with an output providing a current supply to other functional modules.

Circuitry 1850, in some embodiments, includes RF (wireless) integrated circuitry (RFIC) further including a wideband RF (wireless) transmitter and/or receiver (TX/RX including a digital baseband and an analog front end module comprising a power amplifier on a transmit path and a low noise amplifier on a receive path). The RFIC includes at least one stacked CMOS finFET, for example in a over-voltage protection circuit as describe elsewhere herein. The RFIC has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond.

Figure 19:
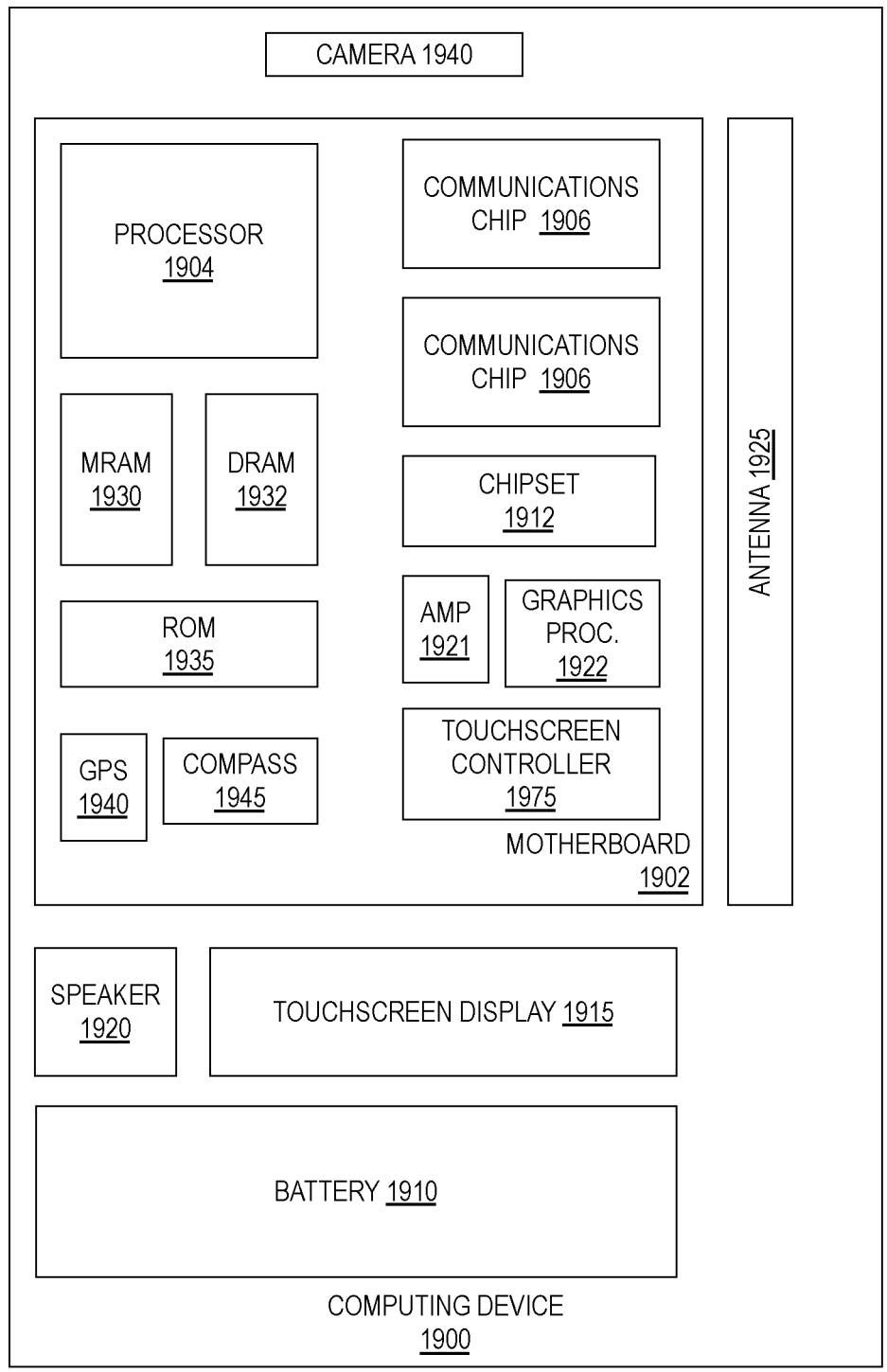
FIG. 19 is a functional block diagram of an electronic computing device, in accordance with some embodiments.

FIG. 19 is a functional block diagram of a computing device 1900, arranged in accordance with at least some implementations of the present disclosure. Computing device 1900 may be found inside platform 1805 or server machine 1806, for example. Device 1900 further includes a motherboard 1902 hosting a number of components, such as, but not limited to, a processor 1904 (e.g., an applications processor), which may further incorporate at least one stacked CMOS finFET, in accordance with embodiments of the present invention. Processor 1904 may be physically and/or electrically coupled to motherboard 1902. In some examples, processor 1904 includes an integrated circuit die packaged within the processor 1904. In general, the term "processor" or "microprocessor" may refer to any device or portion of a device that processes electronic data from registers and/or memory to transform that electronic data into other electronic data that may be further stored in registers and/or memory.

In various examples, one or more communication chips 1906 may also be physically and/or electrically coupled to the motherboard 1902. In further implementations, communication chips 1906 may be part of processor 1904. Depending on its applications, computing device 1900 may include other components that may or may not be physically and electrically coupled to motherboard 1902. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid-state drive (SSD), compact disk (CD), digital versatile disk (DVD), and so forth), or the like.

Communication chips 1906 may enable wireless communications for the transfer of data to and from the computing device 1900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1906 may implement any of a number of wireless standards or protocols, including but not limited to those described elsewhere herein. As discussed, computing device 1900 may include a plurality of communication chips 1906. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example the above embodiments may include specific combinations of features as further provided below.

In one or more first examples, a transistor structure comprises a fin including a first layer of semiconductor material under or over a second layer of semiconductor material. The transistor structure comprises a first gate stack over one or more sidewall of the fin and adjacent to the first layer of semiconductor material, wherein the first gate stack includes a first gate electrode and a first gate dielectric layer.

The transistor structure comprises a first source terminal and a first drain terminal coupled to the first layer of semiconductor material and on opposite sides of the first gate stack, wherein the first source and drain terminals comprise N-type semiconductor. The transistor structure comprises a second gate stack over one or more sidewall of the fin and adjacent to the second layer of semiconductor material, wherein the second gate stack includes a second gate electrode and a second gate dielectric layer. The transistor structure comprises a second source terminal and a second drain terminal coupled to the second layer of semiconductor and on opposite sides of the second gate stack, wherein the second source and drain terminals comprise P-type semiconductor.

In one or more second examples, for any of the first examples a centerline of the first gate electrode is in vertical alignment with a centerline of the second gate electrode.

In one or more third examples, for any of the first through second examples the fin has a total height equal to a first channel height summed with a second channel height and a subfin height therebetween. The first channel height is equal to a height of the fin adjacent to the first gate stack. The second channel height is equal to a height of the fin adjacent to the first gate stack. The subfin height is equal to a vertical spacing between the first and second gate stacks.

In one or more fourth examples, for any of the first through the third examples the transistor structure comprises a first layer of dielectric material adjacent to a subfin portion of the fin and between the first and second gate electrodes. The transistor structure comprises a second layer of dielectric material that is adjacent to the first layer of dielectric material, adjacent to a sidewall of the first gate electrode, and adjacent to a sidewall of the second gate electrode.

In one or more fifth examples, for any of the fourth examples the fin is a first fin, and the structure further comprises a second fin including the first layer of semiconductor material and the second layer of semiconductor material, a third gate stack over one or more sidewall of the second fin and adjacent to the first layer of semiconductor material, and a fourth gate stack over one or more sidewall of the second fin and adjacent to the second layer of semiconductor material. The first layer of dielectric material is adjacent to a subfin portion of the second fin located between the third and fourth gate stacks. The second layer of dielectric material separates the first gate stack from the third gate stack, and separates the second gate stack from the fourth gate stack. The second layer of dielectric material separates the first layer of dielectric material adjacent to the second fin from the first layer of dielectric material adjacent to the first fin.

In one or more sixth examples, for any of the fourth through fifth examples, the first layer of dielectric material is adjacent to a subfin portion of the first layer of semiconductor material. The structure further comprises a third layer of dielectric material adjacent to a subfin portion of the second layer of semiconductor material, and the second layer of dielectric material is adjacent to both the first and the third layers of dielectric material. In one or more seventh examples, for any of the sixth examples the first layer of dielectric material has fixed charge of a first polarity and the third layer of dielectric material has fixed charge of a second polarity, complementary to the first polarity.

In one or more eighth examples, for any of the sixth or seventh examples the first layer of dielectric material has negative fixed charge and the third layer of dielectric material has positive fixed charge.

In one or more ninth examples, for any of the sixth or seventh examples the first layer of dielectric material has a concentration of fixed charges of at least $1 \times 10^{12}$ per square centimeter, and the second layer of dielectric material has a concentration of fixed charges of at least $1 \times 10^{12}$ per square centimeter.

In one or more tenth examples, for any of the sixth examples the first layer of dielectric material comprises one or more acceptor impurities that are also present in the subfin portion of the first layer of semiconductor material, and wherein the second layer of dielectric material comprises one or more donor impurities that are also present in the subfin portion of the second layer of semiconductor material.

In one or more eleventh examples, for any of the eleventh examples the second layer of dielectric material comprises phosphorus-doped silicate glass (PSG).

In one or more twelfth examples, for any of the sixth examples, the transistor structure further comprises a barrier layer located between the first and second layers of dielectric material.

In one or more thirteenth examples, for any of the transistor structures of any one of first through the twelfth examples, 1-12, the first layer of semiconductor material comprises a Group III-V semiconductor. The second layer of semiconductor material comprises a Group IV semiconductor.

In one or more fourteenth examples, a system comprises an electronic memory, and a processor coupled to the memory. The processor comprises a CMOS circuit including a plurality of NMOS and PMOS field effect transistors (FETs). A first of the NMOS and PMOS FETs further comprise the transistor structure of any one of the first through the thirteenth examples.

In one or more fifteenth examples, for any of the fourteenth examples the system further includes a wireless communication antenna coupled to the processor, and a battery coupled to at least one of the processor and memory.

In one or more sixteenth examples, a system includes a data storing means, and a processing means. The processing means includes a CMOS circuit including a plurality of NMOS and PMOS field effect transistors (FETs). A first of the NMOS and PMOS FETs further comprises a fin including a first layer of semiconductor material under or over a second layer of semiconductor material, first gate stack over one or more sidewall of the fin and adjacent to the first layer of semiconductor material, wherein the first gate stack includes a first gate electrode and a first layer of gate dielectric material. The first of the NMOS and PMOS FETs further comprises a first source terminal and a first drain terminal coupled to the first layer of semiconductor material and on opposite sides of the first gate stack, wherein the first source and drain terminals comprise N-type semiconductor. The second of the NMOS and PMOS FETs further comprises a second gate stack over one or more sidewall of the fin and adjacent to the second layer of semiconductor material, wherein the second gate stack includes a second gate electrode and a second layer of gate dielectric material. The second of the NMOS and PMOS FETs further comprises a second source terminal and a second drain terminal coupled to the second layer of semiconductor material and on opposite sides of the second gate stack, wherein the second source and drain terminals comprise P-type semiconductor.

In one or more seventeenth examples, for any of the sixteenth examples the first layer of semiconductor material comprises a Group III-V semiconductor. The second layer of semiconductor material comprises a Group IV semiconductor. The fin has a total height equal to a first channel height summed with a second channel height and a subfin height therebetween. The first channel height is equal to a height of the fin adjacent to the first gate stack. The second channel height is equal to a height of the fin adjacent to the first gate stack. The subfin height is equal to a vertical spacing between the first and second gate stacks.

In one or more eighteenth examples, for any of the sixteenth through seventeenth examples the system further comprises a first layer of dielectric material adjacent to a subfin portion of the fin and between the first and second gate electrodes, and a second layer of dielectric material that is adjacent to the first layer of dielectric material, adjacent to a sidewall of the first gate electrode, and adjacent to a sidewall of the second gate electrode. In one or more nineteenth examples a method of fabricating a transistor structure comprises forming a fin including a first layer of semiconductor material under or over a second layer of semiconductor material. The method comprises forming a gate mandrel over the fin. The method comprises forming an isolation dielectric surrounding the gate mandrel and fin. The method comprises replacing a top portion of the gate mandrel with a first gate stack, the first gate stack including a first layer of gate dielectric material and a first gate electrode. The method comprises revealing a bottom portion of the gate mandrel. The method comprises replacing the bottom portion of the gate mandrel with a second gate stack, the second gate stack including a second layer of gate dielectric material and a second gate electrode. The method comprises forming a first source terminal and a first drain terminal coupled to the first layer of semiconductor material and on opposite sides of the first gate stack, wherein the first source and drain terminals comprise N-type semiconductor. The method comprises forming a second source terminal and second drain terminal coupled to the first layer of semiconductor material and on opposite sides of the first gate stack, wherein the second source and drain terminals comprise P-type semiconductor.

In one or more twentieth examples for any of the nineteenth examples forming the gate mandrel further comprises depositing a first layer of dielectric material over the fin, and replacing the top portion of the gate mandrel with the first gate stack further comprises forming a recess that exposes a sidewall of the first layer of semiconductor material by etching the first layer of dielectric material selectively to the first layer of semiconductor material, depositing the first layer of gate dielectric material within the recess and in contact with the sidewall of the first layer of semiconductor material, and forming the gate electrode within the recess and in contact with the first layer of gate dielectric material.

In one or more twenty-first examples replacing the top portion of the gate mandrel with the second gate stack further comprises forming a second recess that exposes a sidewall of the second layer of semiconductor material by etching the first layer of dielectric material selectively to the second layer of semiconductor material, depositing the second layer of gate dielectric material within the second recess and in contact with the sidewall of the second layer of semiconductor material, and forming the second gate electrode within the second recess and in contact with the second layer of gate dielectric material.

In one or more twenty-second examples forming the fin further comprises forming a precursor fin including the first layer of semiconductor material, forming a mask material around the fin, forming a recess within the mask material by recess etching the first layer of semiconductor material selectively to the mask material, and epitaxially growing the second layer of semiconductor material within the recess.

In one or more twenty-third examples, a method of fabricating a transistor structure comprises forming a first layer of dielectric material over a sidewall of a subfin portion of a first layer of semiconductor material. The method comprises forming a second layer of a dielectric material over a sidewall of a subfin portion of a second layer of semiconductor material. The method comprises forming a first gate stack over a sidewall of a channel portion of the first layer of semiconductor material, wherein the first gate stack includes a first layer of gate dielectric material and a first gate electrode. The method comprises forming a second gate stack over a sidewall of a channel portion of the second layer of semiconductor material, wherein the second gate stack includes a second layer of gate dielectric material and a second gate electrode, and the channel portions of the first and second layers of semiconductor material are separated by the subfin portions of the first and second layers of semiconductor material. The method comprises forming a first source terminal and a first drain terminal coupled to the first layer of semiconductor material and on opposite sides of the first gate stack, wherein the first source and drain terminals comprise N-type semiconductor. The method comprises forming a second source terminal and second drain terminal coupled to the first layer of semiconductor material and on opposite sides of the first gate stack, wherein the second source and drain terminals comprise P-type semiconductor.

In one or more twenty-fourth examples, for any of the twenty-third examples, the first layer of dielectric material has negative fixed charge and the third layer of dielectric material has positive fixed charge.

In one or more twenty-fifth examples, for any of the twenty-third through twenty-fourth examples the first layer of dielectric material comprises one or more acceptor impurities that are also present in the subfin portion of the first layer of semiconductor material, and wherein the second layer of dielectric material comprises one or more donor impurities that are also present in the subfin portion of the second layer of semiconductor material.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A transistor structure, comprising:
   a fin including a first layer of semiconductor material under or over a second layer of semiconductor material;
   a first gate stack adjacent to one or more sidewalls of the fin and adjacent to the first layer of semiconductor material, wherein the first gate stack includes a first gate electrode and a first gate dielectric layer;
   a first source terminal and a first drain terminal coupled to the first layer of semiconductor material and on opposite sides of the first gate stack, wherein the first source and drain terminals comprise N-type semiconductor;
   a second gate stack adjacent to one or more sidewalls of the fin and adjacent to the second layer of semiconductor material, wherein the second gate stack includes a second gate electrode and a second gate dielectric layer;

a second source terminal and a second drain terminal coupled to the second layer of semiconductor material and on opposite sides of the second gate stack, wherein the second source and drain terminals comprise P-type semiconductor;

a subfin comprising one or more crystalline materials between the first and second layers of semiconductor material; and an isolation dielectric adjacent to one or more sidewalls of the subfin, the isolation dielectric between the first gate stack and the second gate stack.

2. The transistor structure of claim 1, wherein a centerline of the first gate electrode is in vertical alignment with a centerline of the second gate electrode.

3. The transistor structure of claim 1, wherein:
a first channel height is equal to a height of the fin adjacent to the first gate stack;
a second channel height is equal to a height of the fin adjacent to the second gate stack;
the subfin has a subfin height equal to a vertical spacing between the first and second gate stacks; and
the fin has a total height equal to the first channel height summed with the second channel height and the subfin height therebetween.

4. The transistor structure of claim 1, wherein the isolation dielectric further comprises:
a first layer of dielectric material adjacent to a subfin portion of the fin and between the first and second gate electrodes; and
a second layer of dielectric material that is adjacent to the first layer of dielectric material.

5. The transistor structure of claim 4, wherein the fin is a first fin, and the structure further comprises:
a second fin including the first layer of semiconductor material and the second layer of semiconductor material;
a third gate stack adjacent to one or more sidewalls of the second fin and adjacent to the first layer of semiconductor material;
a fourth gate stack adjacent to one or more sidewalls of the second fin and adjacent to the second layer of semiconductor material; and wherein:
the first layer of dielectric material is adjacent to a subfin portion of the second fin located between the third and fourth gate stacks;
the second layer of dielectric material separates the first gate stack from the third gate stack, and separates the second gate stack from the fourth gate stack; and
the second layer of dielectric material separates the first layer of dielectric material adjacent to the second fin from the first layer of dielectric material adjacent to the first fin.

6. The transistor structure of claim 4, wherein:
the first layer of dielectric material is adjacent to a subfin portion of the first layer of semiconductor material;
the structure further comprises a third layer of dielectric material adjacent to a subfin portion of the second layer of semiconductor material; and
the second layer of dielectric material is adjacent to both the first and the third layers of dielectric material.

7. The transistor structure of claim 6, wherein the first layer of dielectric material has fixed charge of a first polarity and the third layer of dielectric material has fixed charge of a second polarity, complementary to the first polarity.

8. The transistor structure of claim 7, wherein the first layer of dielectric material has negative fixed charge and the third layer of dielectric material has positive fixed charge.

9. The transistor structure of claim 7, wherein the first layer of dielectric material has a concentration of fixed charges of at least $10^{12}$ per square centimeter, and the third layer of dielectric material has a concentration of fixed charges of at least $10^{12}$ per square centimeter.

10. The transistor structure of claim 7, wherein the second layer of dielectric material comprises phosphorus-doped silicate glass (PSG).

11. The transistor structure of claim 6, wherein the first layer of dielectric material comprises one or more acceptor impurities that are also present in the subfin portion of the first layer of semiconductor material, and wherein the second layer of dielectric material comprises one or more donor impurities that are also present in the subfin portion of the second layer of semiconductor material.

12. The transistor structure of claim 6, further comprising a barrier layer located between the first and second layers of dielectric material.

13. The transistor structure of claim 4, wherein the first layer of dielectric material has fixed charge of a first polarity.

14. The transistor structure of claim 13, wherein the first layer of dielectric material has a concentration of fixed charges of at least $10^{12}$ per square centimeter.

15. The transistor structure of claim 1, wherein:
the first layer of semiconductor material comprises a Group III-V semiconductor; and
the second layer of semiconductor material comprises a Group IV semiconductor.

16. A system comprising:
an electronic memory; and
a processor coupled to the memory, the processor comprising a CMOS circuit including a plurality of NMOS and PMOS field effect transistors (FETs), wherein a first of the NMOS and PMOS FETs further comprise the transistor structure of claim 1.

17. The system of claim 16, further comprising:
a wireless communication antenna coupled to the processor; and
a battery coupled to at least one of the processor and memory.

18. The transistor structure of claim 1, wherein the one or more crystalline materials are in direct contact with the first and second semiconductor material layers.

19. The transistor structure of claim 1, wherein the one or more crystalline materials and the first and second semiconductor material layers are substantially monocrystalline.

20. The transistor structure of claim 1, wherein the subfin comprises a first crystalline material layer in contact with a second crystalline material layer, the first and second crystalline material layers comprising a pseudomorphic or metamorphic heterostructure.

* * * * *